(12) United States Patent
Yamazaki et al.

(10) Patent No.: US 10,534,212 B2
(45) Date of Patent: Jan. 14, 2020

(54) INPUT/OUTPUT DISPLAY DEVICE COMPRISING AN INPUT PORTION HAVING A SENSING ELEMENT TO SENSE AN APPROACHING OBJECT AND DATA PROCESSOR HAVING THE SAME

(71) Applicant: Semiconductor Energy Laboratory Co., Ltd., Atsugi-shi, Kanagawa-ken (JP)

(72) Inventors: Shunpei Yamazaki, Tokyo (JP); Yoshiharu Hirakata, Tochigi (JP)

(73) Assignee: Semiconductor Energy Laboratory Co., Ltd., Atsugi-shi, Kanagawa-ken (JP)

( * ) Notice: Subject to any disclaimer, the term of this patent is extended or adjusted under 35 U.S.C. 154(b) by 132 days.

(21) Appl. No.: 15/405,678

(22) Filed: Jan. 13, 2017

(65) Prior Publication Data
US 2017/0205925 A1    Jul. 20, 2017

(30) Foreign Application Priority Data

Jan. 18, 2016   (JP) ................ 2016-006818

(51) Int. Cl.
*G02F 1/1333*    (2006.01)
*G02F 1/1368*    (2006.01)
(Continued)

(52) U.S. Cl.
CPC ........ *G02F 1/13338* (2013.01); *G02F 1/1368* (2013.01); *G02F 1/13624* (2013.01);
(Continued)

(58) Field of Classification Search
CPC ................ H01L 27/1222; H01L 27/14616
See application file for complete search history.

(56) References Cited

U.S. PATENT DOCUMENTS 6,025,894 A   2/2000 Shirasaki et al.
6,556,260 B1  4/2003 Itou et al.
(Continued)

FOREIGN PATENT DOCUMENTS

JP   2001-066593 A   3/2001
JP   2002-196702 A   7/2002
(Continued)

OTHER PUBLICATIONS

Shieh.H, "Transflective display by Hybrid OLED and LCD", LEOS 2005 (IEEE Lasers and Electro-Optics Society Annual Meeting), Oct. 22, 2005, pp. 650-651, IEEE.
(Continued)

*Primary Examiner* — Paul C Lee
(74) *Attorney, Agent, or Firm* — Fish & Richardson P.C.

(57) ABSTRACT

A novel input/output device that is highly convenient or reliable, or a novel data processor and a novel semiconductor device are provided. The inventors have devised a structure in which a display portion and an input portion are included; the display portion includes a first display element, a first conductive film electrically connected to the first display element, a second conductive film including a region overlapping with the first conductive film, an insulating film including a region between the second conductive film and the first conductive film, a pixel circuit electrically connected to the second conductive film, and a second display element electrically connected to the pixel circuit; the insulating film includes an opening; and the second conductive film is electrically connected to the first conductive film through the opening. The input portion has a function of sensing an object that approaches a region overlapping with the display portion.

20 Claims, 37 Drawing Sheets

(51) Int. Cl.
*G06F 3/044* (2006.01)
*H01L 27/146* (2006.01)
*G06F 3/041* (2006.01)
*H01L 29/786* (2006.01)
*H01L 27/12* (2006.01)
*G02F 1/1362* (2006.01)

(52) U.S. Cl.
CPC ........ *G06F 3/044* (2013.01); *H01L 27/14616* (2013.01); *G02F 2001/136245* (2013.01); *G06F 3/0412* (2013.01); *G06F 2203/04111* (2013.01); *G06F 2203/04112* (2013.01); *H01L 27/1225* (2013.01); *H01L 29/78648* (2013.01)

(56) References Cited

U.S. PATENT DOCUMENTS

| | | | |
|---|---|---|---|
| 6,714,268 | B2 | 3/2004 | Wang et al. |
| 6,912,021 | B2 | 6/2005 | Kimura |
| 7,038,641 | B2 | 5/2006 | Hirota et al. |
| 7,084,936 | B2 | 8/2006 | Kato |
| 7,102,704 | B2 | 9/2006 | Mitsui et al. |
| 7,176,991 | B2 | 2/2007 | Mitsui et al. |
| 7,239,361 | B2 | 7/2007 | Kato |
| 7,248,235 | B2 | 7/2007 | Fujii et al. |
| 7,304,696 | B2 | 12/2007 | Yamagishi |
| 7,385,654 | B2 | 6/2008 | Mitsui et al. |
| 7,688,290 | B2 | 3/2010 | Yamazaki et al. |
| 8,040,456 | B2 | 10/2011 | Yamazaki et al. |
| 8,159,449 | B2 | 4/2012 | Kimura et al. |
| 8,547,503 | B2 | 10/2013 | Kubota et al. |
| 8,743,028 | B2 | 6/2014 | Yamazaki et al. |
| 8,836,906 | B2 | 9/2014 | Kurokawa et al. |
| 9,006,755 | B2 | 4/2015 | Seo et al. |
| 9,129,568 | B2 | 9/2015 | Kubota et al. |
| 9,189,997 | B2 | 11/2015 | Kimura et al. |
| 9,298,035 | B2 | 3/2016 | Yamazaki et al. |
| 2003/0102801 | A1 | 6/2003 | Senbonmatsu |
| 2003/0193457 | A1* | 10/2003 | Wang ................. G09G 3/20 345/84 |
| 2003/0201960 | A1 | 10/2003 | Fujieda |
| 2006/0072047 | A1 | 4/2006 | Sekiguchi |
| 2007/0032161 | A1 | 2/2007 | Liao et al. |
| 2007/0153172 | A1 | 7/2007 | Hsieh et al. |
| 2008/0180618 | A1 | 7/2008 | Fujieda |
| 2009/0078939 | A1 | 3/2009 | Yamazaki et al. |
| 2010/0171905 | A1 | 7/2010 | Huang et al. |
| 2011/0205468 | A1 | 8/2011 | Hirakata et al. |
| 2011/0249211 | A1 | 10/2011 | Song et al. |
| 2011/0255046 | A1 | 10/2011 | Kurokawa et al. |
| 2012/0057104 | A1 | 3/2012 | Kitagawa et al. |
| 2012/0208637 | A1 | 8/2012 | Hirakata |
| 2012/0327321 | A1* | 12/2012 | Huang ................. G02F 1/1362 349/42 |
| 2013/0021289 | A1* | 1/2013 | Chen ................. G06F 1/1601 345/174 |
| 2014/0065430 | A1 | 3/2014 | Yamazaki et al. |
| 2014/0146033 | A1 | 5/2014 | Koyama et al. |
| 2014/0362429 | A1 | 12/2014 | Yokozeki et al. |
| 2015/0029418 | A1 | 1/2015 | Ueda et al. |
| 2015/0179139 | A1 | 6/2015 | Watanabe et al. |
| 2015/0364073 | A1 | 12/2015 | Ogawa |
| 2016/0042696 | A1 | 2/2016 | Hirakata et al. |
| 2016/0042702 | A1 | 2/2016 | Hirakata et al. |
| 2016/0299387 | A1 | 10/2016 | Yamazaki et al. |
| 2016/0358986 | A1 | 12/2016 | Yamazaki et al. |
| 2017/0040402 | A1 | 2/2017 | Yasumoto et al. |
| 2017/0040404 | A1 | 2/2017 | Kusunoki |
| 2017/0053603 | A1 | 2/2017 | Hirakata |
| 2017/0075155 | A1 | 3/2017 | Oikawa et al. |

FOREIGN PATENT DOCUMENTS

| | | |
|---|---|---|
| JP | 2002-328630 A | 11/2002 |
| JP | 2003-076302 A | 3/2003 |
| JP | 2003-098983 A | 4/2003 |
| JP | 2003-157026 A | 5/2003 |
| JP | 2003-157029 A | 5/2003 |
| JP | 2003-228304 A | 8/2003 |
| JP | 2003-316295 A | 11/2003 |
| JP | 2003-322850 A | 11/2003 |
| JP | 2004-296162 A | 10/2004 |
| JP | 2007-232882 A | 9/2007 |
| JP | 4161574 | 10/2008 |
| JP | 2009-094492 A | 4/2009 |
| JP | 2011-191750 A | 9/2011 |
| JP | 2012-133312 A | 7/2012 |
| JP | 2013-142804 A | 7/2013 |
| JP | 2013-221965 A | 10/2013 |
| JP | 2014-063723 A | 4/2014 |
| JP | 2014-071734 A | 4/2014 |
| JP | 2015-230510 A | 12/2015 |
| KR | 2014-0029181 A | 3/2014 |
| WO | WO-2004/053819 | 6/2004 |

OTHER PUBLICATIONS

Minoura.K et al., "P-149: Super Reflective Color LCDs Being Able to Display Moving Images without Polarizers", SID Digest '06 : SID International Symposium Digest of Technical Papers, Jun. 6, 2006, vol. 37, No. 1, pp. 769-772.

Lee.J et al., "High ambient-contrast-ratio display using tandem reflective liquid crystal display and organic light-emitting device", Optics Express, Nov. 14, 2005, vol. 13, No. 23, pp. 9431-9438.

International Search Report (Application No. PCT/IB2017/050139) dated Apr. 18, 2017.

Written Opinion (Application No. PCT/IB2017/050139) dated Apr. 18, 2017.

* cited by examiner

[INPUT/OUTPUT DISPLAY DEVICE COMPRISING AN INPUT PORTION HAVING A SENSING ELEMENT TO SENSE AN APPROACHING OBJECT AND DATA PROCESSOR HAVING THE SAME

TECHNICAL FIELD

One embodiment of the present invention relates to an input/output device, a data processor, or a semiconductor device.

Note that one embodiment of the present invention is not limited to the above technical field. The technical field of one embodiment of the invention disclosed in this specification and the like relates to an object, a method, or a manufacturing method. Furthermore, one embodiment of the present invention relates to a process, a machine, manufacture, or a composition of matter. Specifically, examples of the technical field of one embodiment of the present invention disclosed in this specification include a semiconductor device, a display device, a light-emitting device, a power storage device, a memory device, a method for driving any of them, and a method for manufacturing any of them.

BACKGROUND ART

A liquid crystal display device in which a light-condensing means and a pixel electrode are provided on the same surface side of a substrate and a region transmitting visible light in the pixel electrode is provided to overlap with an optical axis of the light-condensing means, and a liquid crystal display device which includes an anisotropic light-condensing means having a condensing direction X and a non-condensing direction Y that is along a longitudinal direction of a region transmitting visible light in the pixel electrode are known (Patent Document 1).

REFERENCE

Patent Document

[Patent Document 1] Japanese Published Patent Application No. 2011-191750

DISCLOSURE OF INVENTION

An object of one embodiment of the present invention is to provide a novel input/output device that is highly convenient or reliable. Another object is to provide a novel data processor that is highly convenient or reliable. Another object is to provide a novel data processor or a novel semiconductor device.

Note that the descriptions of these objects do not disturb the existence of other objects. In one embodiment of the present invention, there is no need to achieve all the objects. Other objects will be apparent from and can be derived from the description of the specification, the drawings, the claims, and the like.

(1) One embodiment of the present invention is an input/output device including a display portion and an input portion.

The display portion includes a signal line and a pixel.

The pixel is electrically connected to the signal line. The pixel includes a first display element, a first conductive film, a second conductive film, a first insulating film, a pixel circuit, and a second display element.

The first conductive film is electrically connected to the first display element. The second conductive film has a region overlapping with the first conductive film. The first insulating film has a region sandwiched between the second conductive film and the first conductive film. The pixel circuit is electrically connected to the signal line. The pixel circuit is electrically connected to the second conductive film. The second display element is electrically connected to the pixel circuit. The first insulating film includes an opening. The second conductive film is electrically connected to the first conductive film through the opening. The pixel circuit includes a first transistor and a second transistor. The second transistor has a region overlapping with at least part of the first transistor.

The input portion includes a region overlapping with the display portion and has a function of sensing an object that approaches the region overlapping with the display portion.

Thus, the first display element and the second display element which perform display using different methods can be driven, for example, with the pixel circuit which can be formed in the same process. Moreover, an object that approaches a region overlapping with the display portion can be sensed. As a result, a novel input/output device that is highly convenient or reliable can be provided.

(2) One embodiment of the present invention is the above-described input/output device in which the first transistor includes a first semiconductor film and the second transistor includes a second semiconductor film.

The second semiconductor film has a region overlapping with the first semiconductor film. The first semiconductor film includes a first region in which a channel is formed. The second semiconductor film includes a second region in which a channel is formed. The second region does not have a region overlapping with the first region.

(3) One embodiment of the present invention is the above-described input/output device including a second insulating film.

The second insulating film has a first surface and a second surface that faces the first surface.

The first surface includes a region in contact with the first semiconductor film. The second surface includes a region in contact with the second semiconductor film.

(4) One embodiment of the present invention is the above-described input/output device in which the second display element is positioned so that display using the second display element can be seen from part of a range from which display using the first display element can be seen.

Accordingly, display using the second display element can be seen from part of the region where display using the first display element can be seen. Alternatively, users can see the display without changing the attitude or the like of the input/output device. As a result, a novel input/output device that is highly convenient or reliable can be provided.

(5) One embodiment of the present invention is the above-described input/output device in which the second display element has a function of performing display in a portion surrounded by a portion where the first display element performs display.

(6) One embodiment of the present invention is the above-described input/output device in which the first display element includes a reflective film and has a function of controlling the intensity of reflected light.

The reflective film has a function of reflecting incident light. The reflective film includes an opening. The second display element has a function of emitting light toward the opening.

(7) One embodiment of the present invention is the above-described input/output device in which the input portion includes a sensing element.

The sensing element includes a control line and a signal line.

The signal line is arranged so that an electric field that is partly blocked by an object that approaches a region overlapping with the display portion is formed between the signal line and the control line.

(8) One embodiment of the present invention is the above-described input/output device in which the control line includes a light-transmitting conductive film, the signal line includes a light-transmitting conductive film, and the pixel includes a region overlapping with the control line or the signal line.

Since the above-described input/output device of one embodiment of the present invention includes the control line including the light-transmitting conductive film in the region overlapping with the pixel and the signal line including the light-transmitting conductive film in the region overlapping with the pixel, an object that approaches a region overlapping with the display portion can be sensed without disturbing display of the display portion. As a result, a novel input/output device that is highly convenient or reliable can be provided.

(9) One embodiment of the present invention is the above-described input/output device in which the control line includes a conductive film provided with an opening, the signal line includes a conductive film provided with an opening, and the pixel includes a region overlapping with the opening of the control line or the signal line.

(10) One embodiment of the present invention is the above-described input/output device in which a gap greater than or equal to 0.2 µm and less than or equal to 16 µm, preferably greater than or equal to 1 µm and less than or equal to 8 µm, further preferably greater than or equal to 2.5 µm and less than or equal to 4 µm is provided between the control line and a second electrode or between the signal line and the second electrode.

Since the above-described input/output device of one embodiment of the present invention includes the control line including the conductive film provided with the opening in the region overlapping with the pixel and the signal line including the conductive film provided with the opening in the region overlapping with the pixel, an object that approaches a region overlapping with the display portion can be sensed without disturbing display of the display portion. As a result, a novel input/output device that is highly convenient or reliable can be provided.

(11) One embodiment of the present invention is the above-described input/output device including a first functional film and a second functional film.

The first functional film includes a region where the sensing element is positioned between the first functional film and the first display element. The first functional film includes a circularly polarizing film.

The second functional film includes a region between the first functional film and the first display element. The second functional film includes a light diffusion film.

Since the above-described input/output device of one embodiment of the present invention includes the first functional film, which is positioned closer to a user's side than the sensing element, and the second functional film between the first functional film and the first display element, light reflected by the sensing element can be controlled by the first functional film. Alternatively, light reflected by the first display element can be diffused by the second functional film. As a result, a novel input/output device that is highly convenient or reliable can be provided.

(12) One embodiment of the present invention is a data processor that includes at least one of a keyboard, a hardware button, a pointing device, a touch sensor, an illuminance sensor, an imaging device, an audio input device, a gaze input device, and an attitude determination device, and the above-described input/output device.

Thus, the data processor can have low power consumption and excellent visibility even in a bright place. As a result, a novel data processor with high convenience or high reliability can be provided.

Although the block diagram attached to this specification shows components classified by their functions in independent blocks, it is difficult to classify actual components according to their functions completely and it is possible for one component to have a plurality of functions.

In this specification, the terms "source" and "drain" of a transistor interchange with each other depending on the polarity of the transistor or the levels of potentials applied to the terminals. In general, in an n-channel transistor, a terminal to which a lower potential is applied is called a source, and a terminal to which a higher potential is applied is called a drain. In a p-channel transistor, a terminal to which a lower potential is applied is called a drain, and a terminal to which a higher potential is applied is called a source. In this specification, although connection relation of the transistor is described assuming that the source and the drain are fixed for convenience in some cases, actually, the names of the source and the drain interchange with each other depending on the relation of the potentials.

Note that in this specification, a "source" of a transistor means a source region that is part of a semiconductor film functioning as an active layer or a source electrode connected to the semiconductor film. Similarly, a "drain" of a transistor means a drain region that is part of the semiconductor film or a drain electrode connected to the semiconductor film. A "gate" means a gate electrode.

Note that in this specification, a state in which transistors are connected to each other in series means, for example, a state in which only one of a source and a drain of a first transistor is connected to only one of a source and a drain of a second transistor. In addition, a state in which transistors are connected in parallel means a state in which one of a source and a drain of a first transistor is connected to one of a source and a drain of a second transistor and the other of the source and the drain of the first transistor is connected to the other of the source and the drain of the second transistor.

In this specification, the term "connection" means electrical connection and corresponds to a state where current, voltage, or a potential can be supplied or transmitted. Accordingly, connection means not only direct connection but also indirect connection through a circuit element such as a wiring, a resistor, a diode, or a transistor so that current, voltage, or a potential can be supplied or transmitted.

In this specification, even when different components are connected to each other in a circuit diagram, there is actually a case where one conductive film has functions of a plurality of components such as a case where part of a wiring serves as an electrode. The term "connection" also means such a case where one conductive film has functions of a plurality of components.

Further, in this specification, one of a first electrode and a second electrode of a transistor refers to a source electrode and the other refers to a drain electrode.

According to one embodiment of the present invention, a novel input/output device which is highly convenient or reliable can be provided. According to another embodiment of the present invention, a novel data processor that is highly convenient or reliable can be provided. Alternatively, a novel data processor or a novel semiconductor device can be provided.

Note that the description of these effects does not preclude the existence of other effects. One embodiment of the present invention does not necessarily have all the effects listed above. Other effects will be apparent from and can be derived from the description of the specification, the drawings, the claims, and the like.

BRIEF DESCRIPTION OF DRAWINGS

In the accompanying drawings:

FIGS. 8A, 8B-1, and 8B-2 illustrate a structure of an input/output device of an embodiment;

FIGS. 12A, 12B-1, and 12B-2 are a block diagram and schematic diagrams illustrating a cross-sectional structure of an input/output device of an embodiment;

FIGS. 13A, 13B-1, and 13B-2 illustrate a structure of a sensing element of an input/output device of an embodiment;

BEST MODE FOR CARRYING OUT THE INVENTION

Figure 1:
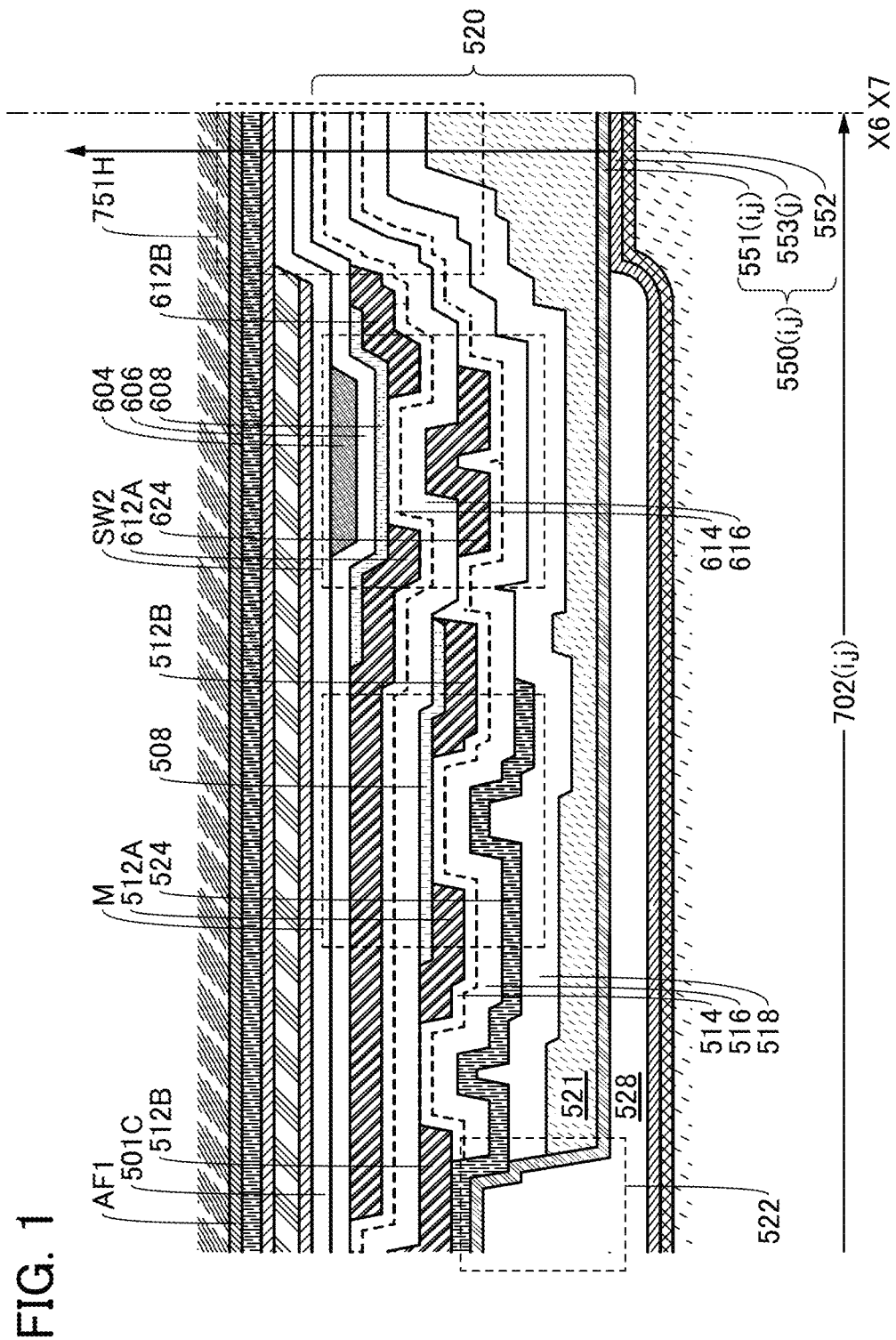
FIG. 1 is a cross-sectional view illustrating a cross-sectional structure of an input/output device of an embodiment.

The input/output device of one embodiment of the present invention includes a display portion and an input portion. The display portion of one embodiment of the present invention includes a first display element, a first conductive film, a second conductive film, an insulating film, a pixel circuit, and a second display element. The first conductive film is electrically connected to the first display element. The second conductive film includes a region overlapping with the first conductive film. The insulating film includes a region between the second conductive film and the first conductive film. The pixel circuit is electrically connected to the second conductive film. The second display element is electrically connected to the pixel circuit. The insulating film has an opening. The second conductive film is electrically connected to the first conductive film through the opening. The input portion is configured to sense an object that approaches a region overlapping with the display portion.

Thus, the first display element and the second display element that performs display using a method different from that of the first display element can be driven using pixel circuits that can be formed in the same process. As a result, a novel input/output device that is highly convenient or reliable can be provided.

Embodiments will be described in detail with reference to the drawings. Note that the present invention is not limited to the following description. It will be readily appreciated by those skilled in the art that modes and details of the present invention can be modified in various ways without departing from the spirit and scope of the present invention. Thus, the present invention should not be construed as being limited to the description in the following embodiments. Note that in structures of the present invention described below, the same portions or portions having similar functions are denoted by the same reference numerals in different drawings, and a description thereof is not repeated.

Embodiment 1

In this embodiment, the configuration of an input/output device 700TPA of one embodiment of the present invention is described with reference to FIGS. 8A, 8B-1, and 8B-2, FIGS. 9A and 9B, FIGS. 10A and 10B, FIG. 11, FIGS. 12A, 12B-1, and 12B-2, and FIGS. 13A, 13B-1, and 13B-2.

Figure 8A:
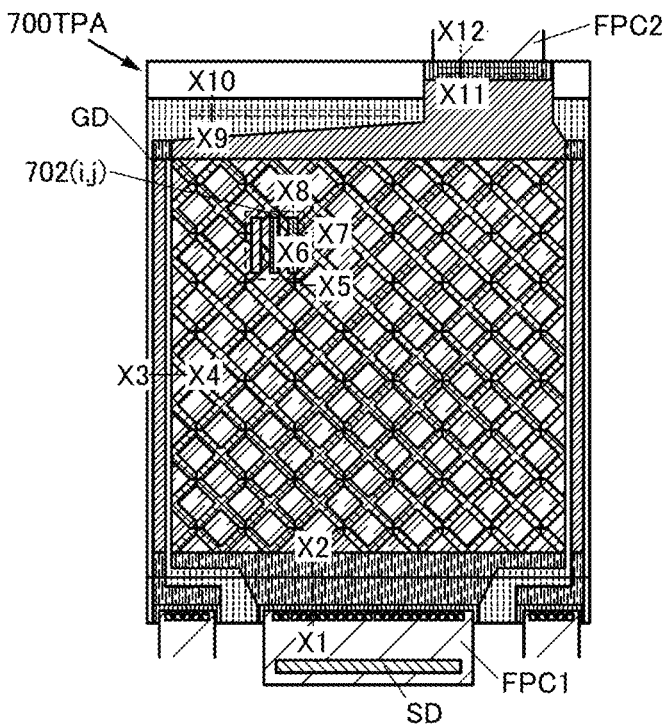
Figures 1, 8B:
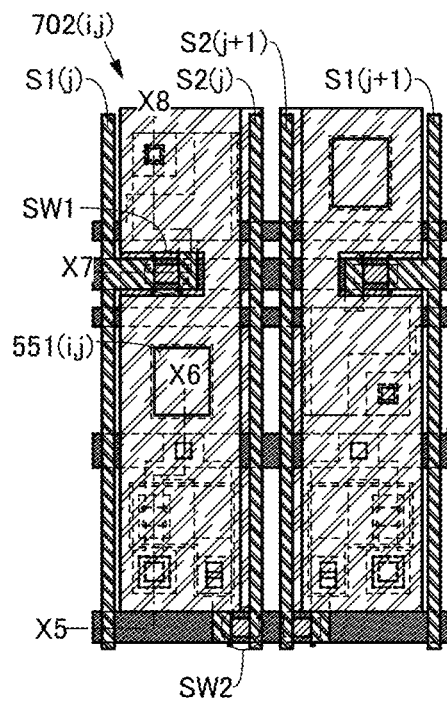
Figures 2, 8B:
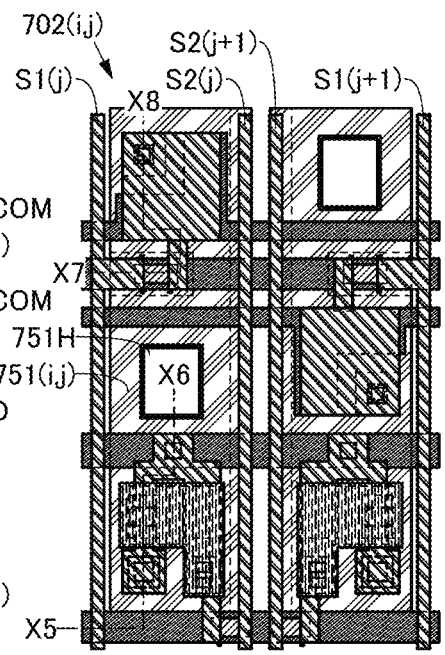

FIGS. 8A, 8B-1, and 8B-2 illustrate a structure of an input/output device of one embodiment of the present invention. FIG. 8A is a top view of the input/output device of one embodiment of the present invention. FIG. 8B-1 is a bottom view illustrating a structure of part of FIG. 8A. FIG. 8B-2 is a bottom view omitting some components illustrated in FIG. 8B-1.

Figure 9A:
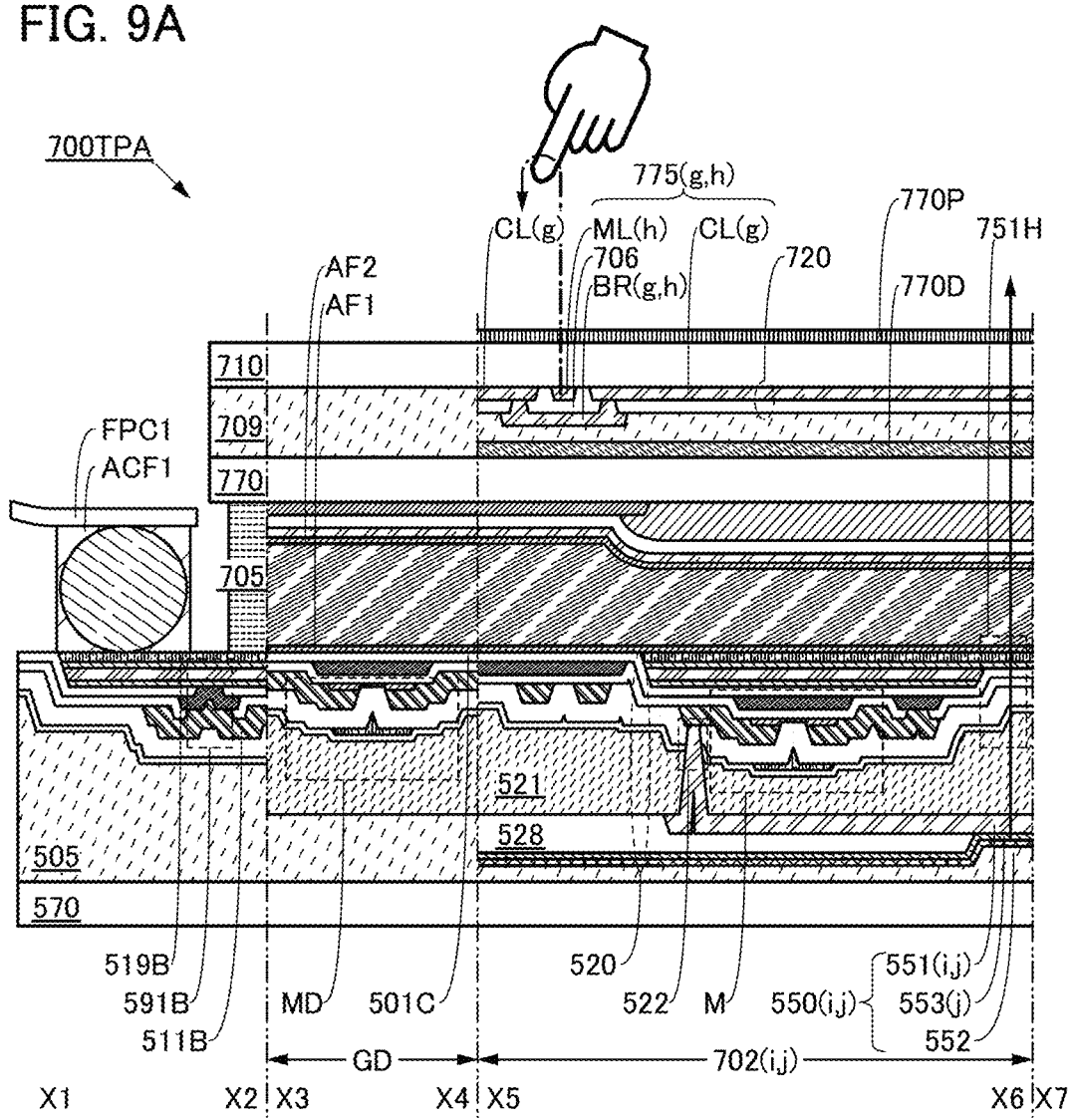
FIGS. 9A and 9B are cross-sectional views illustrating a cross-sectional structure of an input/output device of an embodiment.
Figure 9B:
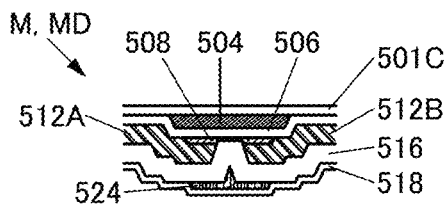

FIGS. 9A and 9B and FIGS. 10A and 10B are cross-sectional views illustrating a structure of the input/output device of one embodiment of the present invention. FIG. 9A is a cross-sectional view taken along lines X1-X2, X3-X4, and X5-X6 in FIG. 8A. FIG. 9B illustrates a part of FIG. 9A.

Figure 10A:
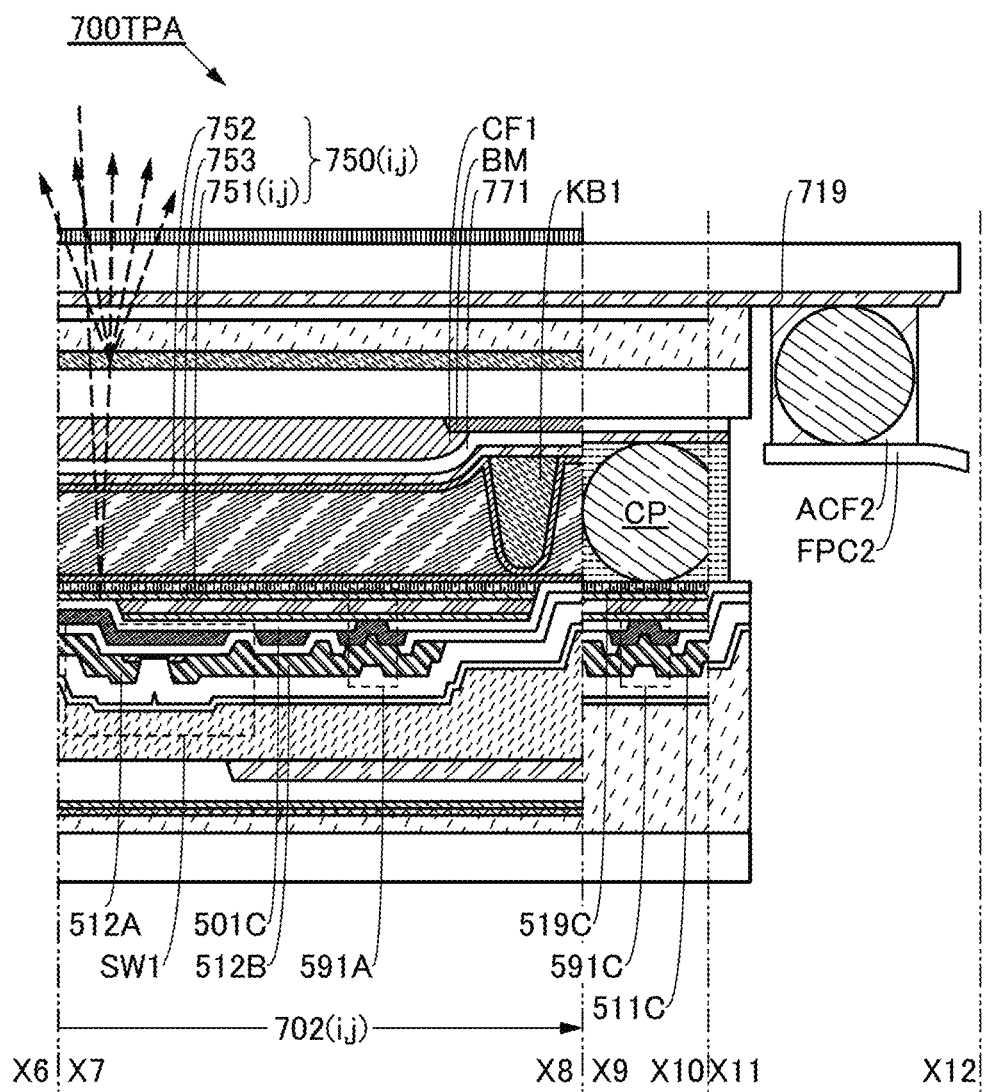
FIGS. 10A and 10B are cross-sectional views illustrating a cross-sectional structure of an input/output device of an embodiment.
Figure 10B:
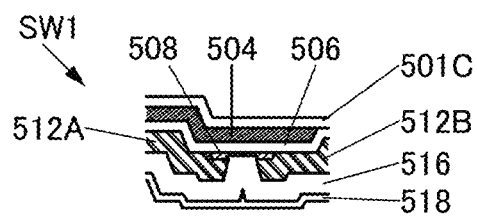

FIG. 10A is a cross-sectional view taken along lines X7-X8, X9-X10, and X11-X12 in FIG. 8A. FIG. 10B illustrates a part of FIG. 10A.

Figure 11:
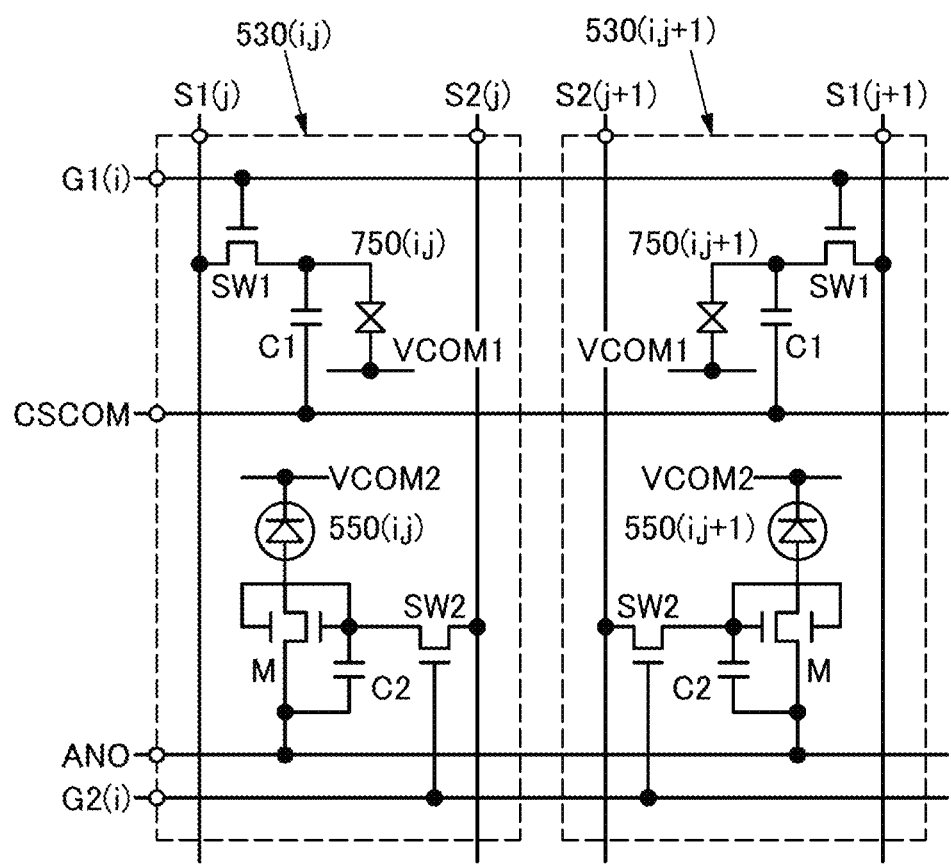
FIG. 11 is a circuit diagram illustrating a structure of an input/output device of an embodiment.

FIG. 11 is a circuit diagram illustrating a configuration of a pixel circuit included in the input/output device of one embodiment of the present invention.

Figure 12A:
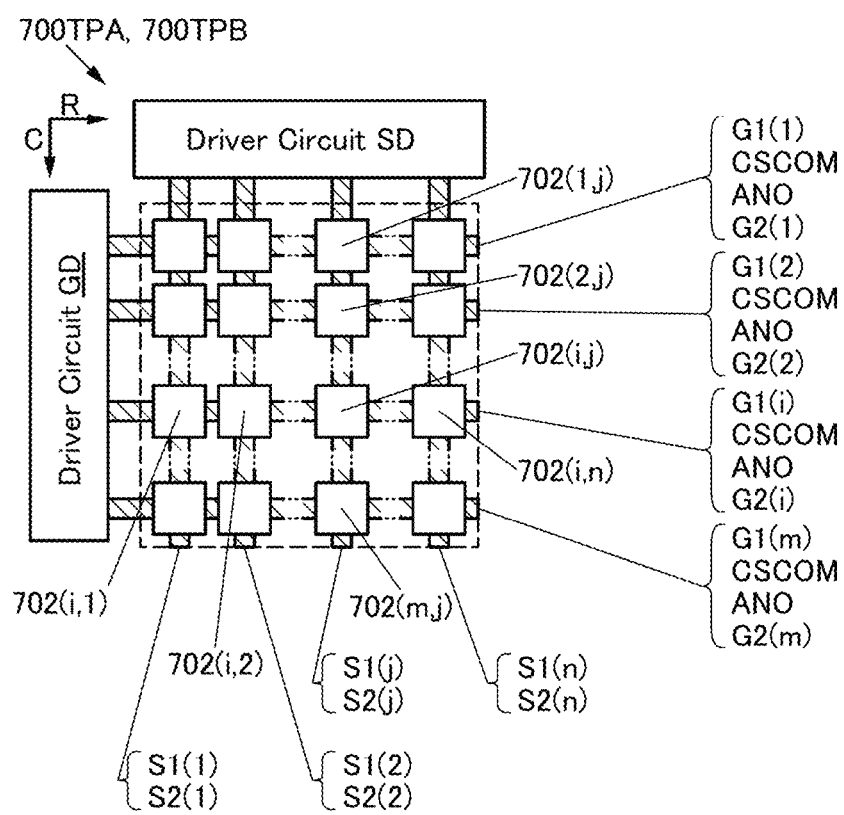
Figures 1, 12B:
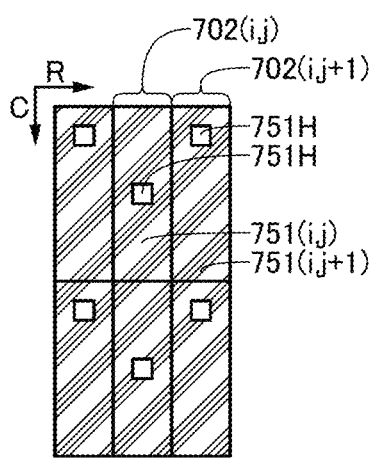
Figures 2, 12B:
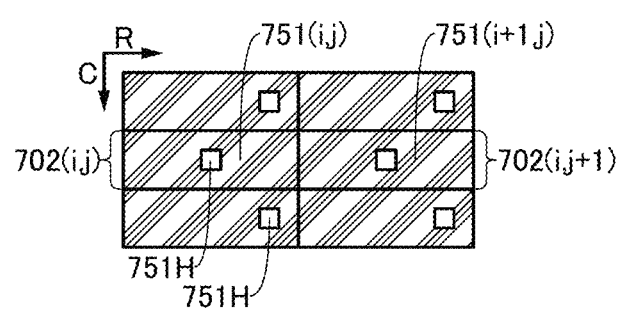

FIG. 12A is a block diagram illustrating arrangement of pixels, wirings, or the like of the display portion that can be used for the input/output device of one embodiment of the present invention. FIGS. 12B-1 and 12B-2 are schematic diagrams each illustrating the arrangement of openings that can be used for the input/output device of one embodiment of the present invention.

Figure 13A:
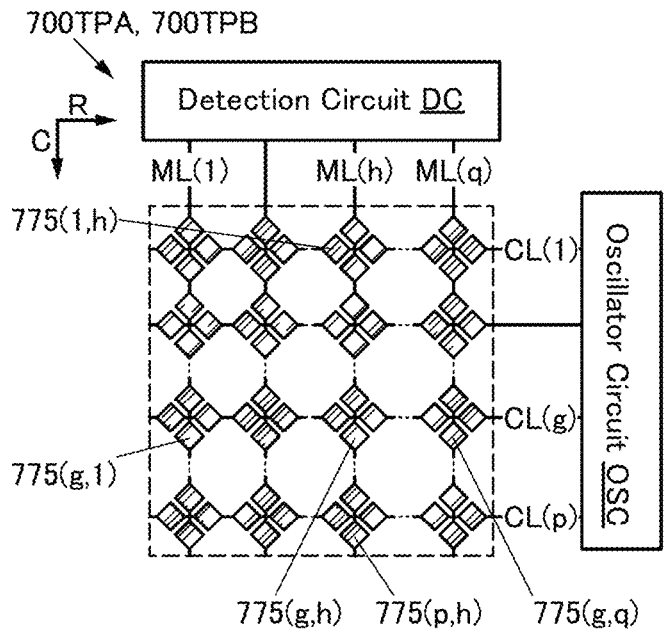
Figures 1, 13B:
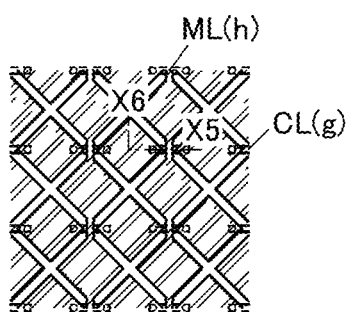
Figures 2, 13B:
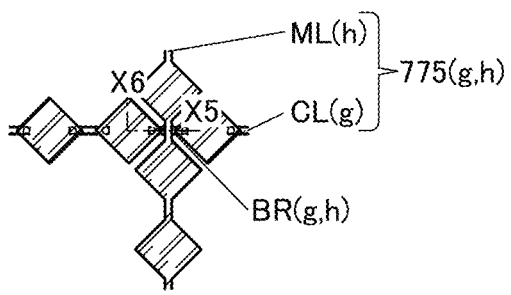

FIGS. 13A, 13B-1, and 13B-2 illustrate a structure of an input/output device of one embodiment of the present invention. FIG. 13A is a block diagram of an input portion of the input/output device of one embodiment of the present invention. FIG. 13B-1 is a schematic diagram illustrating a part of FIG. 13A. FIG. 13B-2 is a schematic diagram illustrating a part of FIG. 13B-1.

Structure Example 1 of Input/Output Device

The input/output device 700TPA described in this embodiment includes a display portion and an input portion having a region overlapping with the display portion. For example, the input portion is included on one side of the display portion on which display is performed (see FIG. 9A and FIG. 10A).

The display portion includes a signal line $S1(j)$ and a pixel $702(i,j)$ (see FIGS. 8B-1 and 8B-2).

The pixel $702(i,j)$ is electrically connected to the signal line $S1(j)$.

The pixel $702(i,j)$ includes a first display element $750(i,j)$, a first conductive film, a second conductive film, an insulating film 501C, a pixel circuit $530(i,j)$, and a second display element $550(i,j)$ (see FIG. 9A, FIG. 10A, and FIG. 11). The pixel circuit $530(i,j)$ includes a switch SW1, a capacitor C1, a switch SW2, a transistor M, and a capacitor C2.

The first conductive film is electrically connected to the first display element $750(i,j)$ (see FIG. 10A). For example, the first conductive film can be used for a first electrode $751(i,j)$ of the first display element $750(i,j)$.

The second conductive film includes a region overlapping with the first conductive film. For example, the second conductive film can be used as a conductive film 512B serving as a source electrode or a drain electrode of a transistor that can be used as the switch SW1.

The insulating film 501C includes a region between the second conductive film and the first conductive film.

The pixel circuit $530(i,j)$ is electrically connected to the second conductive film. For example, the transistor in which the second conductive film is used as the conductive film 512B serving as a source electrode or a drain electrode can be used as the switch SW1 of the pixel circuit $530(i,j)$ (see FIG. 10A and FIG. 11).

The second display element $550(i,j)$ is electrically connected to the pixel circuit $530(i,j)$.

The insulating film 501C includes an opening 591A (see FIG. 10A).

The second conductive film is electrically connected to the first conductive film through the opening 591A. For example, the conductive film 512B is electrically connected to the first electrode $751(i,j)$ that also serves as the first conductive film. Note that the first conductive film electrically connected to the second conductive film through the opening 591A that is formed in the insulating film 501C can be referred to as a through electrode.

The pixel circuit $530(i,j)$ is electrically connected to the signal line $S1(j)$ (see FIG. 11). Note that a conductive film 512A is electrically connected to the signal line $S1(j)$ (see FIG. 10A and FIG. 11).

The input portion has a function of sensing an object that approaches a region overlapping with the display portion (see FIG. 9A). For example, a sensing element $775(g,h)$ or the like for sensing an approaching finger or the like is included.

Thus, the first display element and the second display element that performs display using a method different from that of the first display element can be driven using pixel circuits that can be formed in the same process. An object that approaches a region overlapping with the display portion can be sensed. As a result, a novel input/output device that is highly convenient or reliable can be provided.

The second display element $550(i,j)$ of the input/output device described in this embodiment is provided so that display using the second display element $550(i,j)$ can be seen from a part of a range from which display using the first display element $750(i,j)$ can be seen. For example, dashed arrows shown in FIG. 10A denote the directions in which external light is incident on and reflected by the first display element $750(i,j)$ that performs display by controlling the intensity of external light reflection, and a solid arrow shown in FIG. 9A denotes the direction in which the second display element $550(i,j)$ emits light to the part of the range from which display using the first display element $750(i,j)$ can be seen.

Thus, display using the second display element can be seen from the part of the range from which display using the first display element can be seen. Alternatively, users can see the display without changing the attitude or the like of a data processor. As a result, a novel input/output device that is highly convenient or reliable can be provided.

Furthermore, the first electrode 751(i,j) of the input/output device described in this embodiment includes a side end portion embedded in the insulating film 501C (see FIG. 9A and FIG. 10A). Accordingly, a step at the edge of the first electrode 751(i,j) can be minimized to reduce the possibility of alignment defects due to the step.

The pixel circuit 530(i,j) of the input/output device described in this embodiment includes the switch SW1. The switch SW1 includes a transistor that includes an oxide semiconductor.

In addition, the second display element 550(i,j) of the input/output device described in this embodiment is configured to perform display in a portion surrounded by a portion where the first display element 750(i,j) performs display. Note that the first display element 750(i,j) performs display in a region overlapping with the first electrode 751(i,j), and the second display element 550(i,j) performs display in a region overlapping with an opening 751H. In other words, the second display element 550(i,j) of the display panel described in this embodiment has a function of performing display in a region overlapping with the opening 751H surrounded by the first electrode 751(i,j) that overlaps with a region in which the first display element 750(i,j) performs display (see FIG. 8B-2, FIG. 12B-1, or FIG. 12B-2).

The first display element 750(i,j) of the input/output device described in this embodiment includes a reflective film that reflects incident light and is configured to control the intensity of the reflected light. The reflective film has the opening 751H. Note that the first conductive film, the first electrode 751(i,j), or the like can be used as the reflective film of the first display element 750(i,j).

The second display element 550(i,j) has a function of emitting light toward the opening 751H.

The input portion of the input/output device described in this embodiment includes the sensing element 775(g,h). The sensing element 775(g,h) includes a control line CL(g) and a signal line ML(h). The signal line ML(h) is arranged so that an electric field that is partly blocked by an object that approaches a region overlapping with the display portion is formed between the signal line ML(h) and the control line CL(g) (see FIG. 9A, FIG. 13A, FIG. 13B-1, and FIG. 13B-2).

The control line CL(g) of the input/output device described in this embodiment includes a light-transmitting conductive film, and the signal line ML(h) of the input/output device described in this embodiment includes a light-transmitting conductive film. The light-transmitting conductive films include regions overlapping with the pixel 702(i,j). For example, the control line CL(g) includes a region overlapping with the pixel 702(i,j) (see FIG. 9A).

Since the input/output device of one embodiment of the present invention includes the control line including the light-transmitting conductive film in the region overlapping with the pixel and the signal line including the light-transmitting conductive film in the region overlapping with the pixel, an object that approaches a region overlapping with the display portion can be sensed without disturbing display of the display portion. As a result, a novel input/output device that is highly convenient or reliable can be provided.

The input/output device described in this embodiment includes the pixel 702(i,j), one group consisting of pixels 702(i,1) to 702(i,n), the other group consisting of pixels 702(i,j) to 702(m,j), and a scan line G1(i) (see FIG. 12A). Note that i is an integer greater than or equal to 1 and less than or equal to m, j is an integer greater than or equal to 1 and less than or equal to n, and each of m and n is an integer greater than or equal to 1.

The input/output device described in this embodiment includes a scan line G2(i), a wiring CSCOM, and a wiring ANO.

The one group consisting of the pixels 702(i,1) to 702(i,n) includes the pixel 702(i,j). The pixels 702(i,1) to 702(i,n) are arranged in a row direction (indicated by an arrow R in the drawing).

The other group consisting of the pixels 702(1,j) to 702(m,j) includes the pixel 702(i,j). The pixels 702(1,j) to 702(m,j) are arranged in a column direction (indicated by an arrow C in the drawing) intersecting with the row direction.

The scan line G1(i) is electrically connected to the pixels 702(i,1) to 702(i,n) of the one group arranged in the row direction.

The signal line S1(j) is electrically connected to the pixels 702(1,j) to 702(m,j) of the other group arranged in the column direction.

For example, the pixel 702(i,j+1) adjacent to the pixel 702(i,j) in the row direction includes an opening in a position different from that of the opening 751H in the pixel 702(i,j) (see FIG. 12B-1).

For example, the pixel 702(i+1,j) adjacent to the pixel 702(i,j) in the column direction includes an opening in a position different from that of the opening 751H in the pixel 702(i,j) (see FIG. 12B-2). Note that the first electrode 751(i,j) can be used as the reflective film.

In addition, the first display element 750(i,j) of the input/output device described in this embodiment includes a layer 753 containing a liquid-crystal material, the first electrode 751(i,j), and a second electrode 752. Note that the second electrode 752 is provided so that an electric field for controlling the alignment of the liquid crystal material is generated between the second electrode 752 and the first electrode 751(i,j) (see FIG. 9A and FIG. 10A).

In addition, the input/output device described in this embodiment includes an alignment film AF1 and an alignment film AF2. The alignment film AF2 is provided so that the layer 753 containing a liquid crystal material lies between the alignment films AF1 and AF2.

In addition, the second display 550(i,j) of the input/output device described in this embodiment includes a third electrode 551(i,j), a fourth electrode 552, and a layer 553(j) containing a light-emitting material.

The fourth electrode 552 includes a region overlapping with the third electrode 551(i,j). The layer 553(j) containing a light-emitting material includes a region between the third electrode 551 and the fourth electrode 552. The third electrode 551(i,j) is electrically connected to the transistor M included in the pixel circuit 530(i,j) at a contact portion 522.

In addition, the input/output device described in this embodiment includes a coloring film CF1, a light blocking film BM, an insulating film 771, a functional film 770P, and a functional film 770D.

The coloring film CF1 includes a region overlapping with the first display element 750(i,j). The light blocking film BM has an opening in a region overlapping with the first display element 750(i,j).

The insulating film 771 lies between the coloring film CF1 and the layer 753 containing a liquid crystal material or between the light blocking film BM and the layer 753 containing a liquid crystal material. Thus, unevenness due to the thickness of the coloring film CF1 can be avoided. Impurities can be prevented from being diffused from the light blocking film BM, the coloring film CF1, or the like to the layer 753 containing a liquid crystal material.

The functional film 770P includes a region overlapping with the first display element 750($i,j$). The functional film 770P is provided so that the sensing element 775($g,h$) is interposed between the functional film 770P and the first display element 750($i,j$). Thus, for example, light reflected by the sensing element 775($g,h$) can be controlled.

The functional film 770D includes a region overlapping with the first display element 750($i,j$). The functional film 770D is provided so that a substrate 770 lies between the functional film 770D and the first display element 750($i,j$). Thus, for example, light reflected by the first display element 750($i,j$) can be diffused.

The input/output device described in this embodiment includes a substrate 570, the substrate 770, a substrate 710, a functional layer 520, and a functional layer 720.

The substrate 770 includes a region overlapping with the substrate 570.

The substrate 710 includes a region overlapping with the substrate 770.

The functional layer 520 includes a region between the substrate 570 and the substrate 770. The functional layer 520 includes the pixel circuit 530($i,j$), the second display element 550($i,j$), an insulating film 521, and an insulating film 528. Furthermore, the functional layer 520 includes an insulating film 518 and an insulating film 516 (see FIGS. 9A and 9B).

The insulating film 521 lies between the pixel circuit 530($i,j$) and the second display element 550($i,j$).

The insulating film 528 lies between the insulating film 521 and the substrate 570 and has an opening in a region overlapping with the second display element 550($i,j$). The insulating film 528 along the edge of the third electrode 551 can avoid a short circuit between the third electrode 551 and the fourth electrode 552.

The insulating film 518 includes a region between the insulating film 521 and the pixel circuit 530($i,j$). The insulating film 516 includes a region between the insulating film 518 and the pixel circuit 530($i,j$).

The functional layer 720 includes a region between the substrate 770 and the substrate 710. The functional layer 720 includes the sensing element 775($g,h$) and an insulating film 706.

The input/output device described in this embodiment includes a bonding layer 505, a bonding layer 709, a sealant 705, and a structure body KB1.

The bonding layer 505 is positioned between the functional layer 520 and the substrate 570 to bond them together.

The sealant 705 is positioned between the functional layer 520 and the substrate 770 to bond them together.

The structure body KB1 is provided for making a predetermined gap between the functional layer 520 and the substrate 770.

The bonding layer 709 is provided between the functional layer 720 and the substrate 770, and has a function of bonding the functional layer 720 and the substrate 770 together.

In addition, the input/output device described in this embodiment includes a terminal 519C and a conductive film 511C.

The insulating film 501C includes a region between the terminal 519C and the conductive film 511C. In addition, the insulating film 501C has an opening 591C.

The terminal 519C is electrically connected to the conductive film 511C through the opening 591C. In addition, the conductive film 511C is electrically connected to the pixel circuit 530($i,j$).

The conductor CP lies between the terminal 519C and the second electrode 752 for electrically connecting them. For example, a conductive particle can be used as the conductor CP.

In addition, the input/output device described in this embodiment includes a terminal 519B and a conductive film 511B.

The insulating film 501C includes a region between the terminal 519B and the conductive film 511B. In addition, the insulating film 501C includes an opening 591B.

The terminal 519B is electrically connected to the conductive film 511B through the opening 591B. In addition, the conductive film 511B is electrically connected to the pixel circuit 530($i,j$). Note that the terminal 519B can be electrically connected to a flexible printed circuit FPC1 using a conductive material ACF1, for example.

The input/output device described in this embodiment includes a terminal 719. The terminal 719 is electrically connected to the sensing element 775($g,h$).

In addition, the input/output device described in this embodiment includes a driver circuit GD and a driver circuit SD (see FIG. 8A and FIG. 12A).

The driver circuit GD is electrically connected to the scan line G1($i$). The driver circuit GD includes a transistor MD, for example. Specifically, a transistor including a semiconductor film that can be formed in the same step as the transistor included in the pixel circuit 530($i,j$) can be used as the transistor MD (see FIGS. 9A and 9B).

The driver circuit SD is electrically connected to the signal line S1($j$). The driver circuit SD is electrically connected to a terminal using a conductive material, for example. The terminal can be formed in the same step as the terminal 519B or the terminal 519C.

The input/output device described in this embodiment includes one group consisting of sensing elements 775($g$,1) to 775($g,q$) and the other group consisting of sensing elements 775(1,$h$) to 775($p,h$) (see FIG. 13A). Note that g is an integer greater than or equal to 1 and less than or equal to p, h is an integer greater than or equal to 1 and less than or equal to q, and each of p and q is an integer greater than or equal to 1.

The one group consisting of the sensing elements 775($g$,1) to 775($g,q$) includes the sensing element 775($g,h$). The sensing elements 775($g$,1) to 775($g,q$) are arranged in a row direction (indicated by an arrow R in the drawing).

The other group consisting of the sensing elements 775(1,$h$) to 775($p,h$) includes the sensing element 775($g,h$). The sensing elements 775(1,$h$) to 775($p,h$) are arranged in a column direction (indicated by an arrow C in the drawing) intersecting with the row direction.

The sensing elements 775($g$,1) to 775($g,q$) of the one group arranged in the row direction include the control line CL($g$).

The sensing elements 775(1,$h$) to 775($p,h$) of the other group arranged in the column direction include the signal line ML($h$).

The control line CL($g$) of the input/output device described in this embodiment includes a conductive film BR($g,h$) (see FIG. 9A). The conductive film BR($g,h$) includes a region overlapping with the signal line ML($h$).

The insulating film 706 lies between the signal line ML(h) and the conductive film BR(g,h). Thus, a short circuit between the signal line ML(h) and the conductive film BR(g,h) can be avoided.

The input/output device described in this embodiment includes an oscillator circuit OSC and a detection circuit DC (see FIG. 13A).

The oscillator circuit OSC is electrically connected to the control line CL(g) and has a function of supplying a search signal. For the search signal, a rectangular wave, a sawtooth wave, a triangular wave, or the like can be used.

The detection circuit DC is electrically connected to the signal line ML(h) and has a function of supplying a sensor signal in accordance with a change in the potential of the signal line ML(h).

Individual components of the input/output device are described below. Note that these components cannot be clearly distinguished and one component may serve as another one or include part of another one.

For example, the first conductive film can be used as the first electrode 751(i,j). The first conductive film can be used as a reflective film.

In addition, the second conductive film can be used as the conductive film 512B serving as a source electrode or a drain electrode of a transistor.

Structure Example

The input/output device of one embodiment of the present invention includes the substrate 570, the substrate 770, the substrate 710, the structure body KB1, the sealant 705, the bonding layer 505, or the bonding layer 709.

In addition, the input/output device of one embodiment of the present invention includes the functional layer 520, the functional layer 720, the insulating film 521, and the insulating film 528.

In addition, the input/output device of one embodiment of the present invention includes the signal line S1(j), a signal line S2(j), the scan line G1(i), the scan line G2(i), the wiring CSCOM, and the wiring ANO.

In addition, the input/output device of one embodiment of the present invention includes the first conductive film or the second conductive film.

In addition, the input/output device of one embodiment of the present invention includes the terminal 519B, the terminal 519C, the terminal 719, the conductive film 511B, or the conductive film 511C.

In addition, the input/output device of one embodiment of the present invention includes the pixel circuit 530(i,j) or the switch SW1.

In addition, the input/output device of one embodiment of the present invention includes the first display element 750(i,j), the first electrode 751(i,j), the reflective film, the opening 751H, the layer 753 containing a liquid crystal material, or the second electrode 752.

In addition, the input/output device of one embodiment of the present invention includes the alignment film AF1, the alignment film AF2, the coloring film CF1, the light blocking film BM, the insulating film 771, the functional film 770P, or the functional film 770D.

In addition, the input/output device of one embodiment of the present invention includes the second display element 550(i,j), the third electrode 551(i,j), the fourth electrode 552, or the layer 553(j) containing a light-emitting material.

Furthermore, the input/output device of one embodiment of the present invention includes the insulating film 501C.

In addition, the input/output device of one embodiment of the present invention includes the driver circuit GD or the driver circuit SD.

The input/output device of one embodiment of the present invention includes the sensing element 775(g,h), the control line CL(g), the signal line ML(h), the conductive film BR(g,h), or the insulating film 706.

The input/output device of one embodiment of the present invention includes the oscillator circuit OSC and the detection circuit DC.

<<Substrate 570>>

The substrate 570 or the like can be formed using a material having heat resistance high enough to withstand heat treatment in the manufacturing process. Specifically, non-alkali glass with a thickness of 0.7 mm can be used. Alternatively, non-alkali glass polished to a thickness of approximately 0.1 mm can be used.

For example, a large-sized glass substrate having any of the following sizes can be used as the substrate 570 or the like: the 6th generation (1500 mm×1850 mm), the 7th generation (1870 mm×2200 mm), the 8th generation (2200 mm×2400 mm), the 9th generation (2400 mm×2800 mm), and the 10th generation (2950 mm×3400 mm). Thus, a large-sized display device can be manufactured.

For the substrate 570 or the like, an organic material, an inorganic material, a composite material of an organic material and an inorganic material, or the like can be used. For example, an inorganic material such as glass, ceramics, or a metal can be used for the substrate 570 or the like.

Specifically, non-alkali glass, soda-lime glass, potash glass, crystal glass, aluminosilicate glass, tempered glass, chemically tempered glass, quartz, sapphire, or the like can be used for the substrate 570 or the like. Specifically, an inorganic oxide film, an inorganic nitride film, an inorganic oxynitride film, or the like can be used for the substrate 570 or the like. For example, silicon oxide, silicon nitride, silicon oxynitride, an alumina film, or the like can be used for the substrate 570 or the like. SUS, aluminum, or the like can be used for the substrate 570 or the like.

For example, a single crystal semiconductor substrate or a polycrystalline semiconductor substrate of silicon or silicon carbide, a compound semiconductor substrate of silicon germanium, or an SOI substrate can be used as the substrate 570 or the like. Thus, a semiconductor element can be formed over the substrate 570 or the like.

For example, an organic material such as a resin, a resin film, and plastic can be used for the substrate 570 or the like. Specifically, a resin film or a resin plate of polyester, polyolefin, polyamide, polyimide, polycarbonate, an acrylic resin, or the like can be used for the substrate 570 or the like.

For example, a composite material formed by bonding a metal plate, a thin glass plate, an inorganic film, or the like to a resin film or other films can be used for the substrate 570 or the like. For example, a composite material formed by dispersing a fibrous or particulate metal, glass, an inorganic material, or the like into a resin film can be used for the substrate 570 or the like. For example, a composite material formed by dispersing a fibrous or particulate resin, organic material, or the like into an inorganic material can be used for the substrate 570 or the like.

A single-layer material or a stacked-layer material in which a plurality of layers are stacked can be used for the substrate 570 or the like. For example, a stacked-layer material in which a substrate, an insulating film that prevents diffusion of impurities contained in the substrate, and the like are stacked can be used for the substrate 570 or the like. Specifically, a stacked-layer material in which glass and one or a plurality of films that prevent diffusion of impurities contained in the glass and that are selected from a silicon oxide layer, a silicon nitride layer, a silicon oxynitride layer, and the like are stacked can be used for the substrate 570. Alternatively, a stacked-layer material in which a resin and a film for preventing diffusion of impurities that penetrate the resin, such as a silicon oxide film, a silicon nitride film, or a silicon oxynitride film, are stacked can be used for the substrate 570 or the like.

Specifically, a resin film, a resin plate, or a stack of polyester, polyolefin, polyamide, polyimide, polycarbonate, an acrylic resin, or the like can be used as the substrate 570 or the like.

Specifically, a material including polyester, polyolefin, polyamide (e.g., nylon and aramid), polyimide, polycarbonate, polyurethane, an acrylic resin, an epoxy resin, a resin having a siloxane bond, such as silicone, or the like can be used for the substrate 570 or the like.

Specifically, polyethylene terephthalate (PET), polyethylene naphthalate (PEN), polyethersulfone (PES), acrylic, or the like can be used for the substrate 570 or the like.

Alternatively, paper, wood, or the like can be used for the substrate 570 or the like.

For example, a flexible substrate can be used as the substrate 570 or the like.

Note that a transistor, a capacitor, and the like can be directly formed on the substrate. Alternatively, a transistor, a capacitor, or the like can be formed over a substrate for use in manufacturing processes that can withstand heat applied in the manufacturing process and can be transferred to the substrate 570 or the like. Thus, a transistor, a capacitor, or the like can be formed over a flexible substrate, for example.

<<Substrate 770 and Substrate 710>>

For example, a light-transmitting material can be used for the substrate 770 or the substrate 710. Specifically, any of the materials that can be used for the substrate 570 can be used for the substrate 770 or the substrate 710. For example, non-alkali glass, aluminosilicate glass, tempered glass, chemically tempered glass, sapphire, or the like can be used. Note that aluminosilicate glass, tempered glass, chemically tempered glass, sapphire, or the like can be favorably used for the substrate 770 or the substrate 710 that is arranged on a side closer to a user of the input/output device. This can prevent damage or a crack of the input/output device caused by the use thereof.

Moreover, a material polished to a thickness of approximately 0.7 mm or 0.1 mm can be used for the substrate 770 or the substrate 710. Thus, the functional film 770D is provided near the first display element 750($i,j$), which makes it possible to reduce an image blur and to display a clear image.

<<Structure Body KB1>>

For example, an organic material, an inorganic material, or a composite material of an organic material and an inorganic material can be used for the structure body KB1 or the like. Thus, components between which the structure body KB1 or the like is provided can have a predetermined gap.

Specifically, for structures KB1 or the like, polyester, polyolefin, polyamide, polyimide, polycarbonate, polysiloxane, an acrylic resin, or the like, or a composite material of a plurality of kinds of resins selected from these can be used. Alternatively, a photosensitive material may be used.

<<Sealant 705>>

For the sealant 705 or the like, an inorganic material, an organic material, a composite material of an inorganic material and an organic material, or the like can be used.

For example, an organic material such as a thermally fusible resin or a curable resin can be used for the sealant 705 or the like.

For the sealant 705 or the like, an organic material such as a reactive curable adhesive, a photo-curable adhesive, a thermosetting adhesive, and/or an anaerobic adhesive can be used.

Specifically, an adhesive containing an epoxy resin, an acrylic resin, a silicone resin, a phenol resin, a polyimide resin, an imide resin, a polyvinyl chloride (PVC) resin, a polyvinyl butyral (PVB) resin, or an ethylene vinyl acetate (EVA) resin, or the like can be used for the sealant 705 or the like.

<<Bonding Layer 505>>

For example, a material that can be used for the sealant 705 can be used for the bonding layer 505.

<<Bonding Layer 709>>

For example, a material that can be used for the sealant 705 can be used for the bonding layer 709.

<<Insulating Film 521>>

For example, an insulating inorganic material, an insulating organic material, or an insulating composite material containing an inorganic material and an organic material can be used for the insulating film 521 or the like.

Specifically, an inorganic oxide film, an inorganic nitride film, an inorganic oxynitride film, or a material obtained by stacking any of these films can be used for the insulating film 521 or the like. For example, a film including any of a silicon oxide film, a silicon nitride film, a silicon oxynitride film, and an aluminum oxide film, and the like, or a film including a material obtained by stacking any of these films can be used for the insulating film 521 or the like.

Specifically, polyester, polyolefin, polyamide, polyimide, polycarbonate, polysiloxane, an acrylic resin, or the like, or a stacked or composite material including resins selected from these, or the like can be used for the insulating film 521 or the like. Alternatively, a photosensitive material may be used.

Thus, steps due to components overlapping with the insulating film 521, for example, can be covered so that a flat surface can be formed.

<<Insulating Film 528>>

For example, a material that can be used for the insulating film 521 can be used for the insulating film 528. Specifically, a 1-µm-thick film containing polyimide can be used for the insulating film 528.

<<Insulating Film 501C>>

For example, the material that can be used for the insulating film 521 can be used for the insulating film 501C. Specifically, a material containing silicon and oxygen can be used for the insulating film 501C. Thus, impurity diffusion into the pixel circuit, the second display element, or the like can be suppressed.

For example, a 200-nm-thick film containing silicon, oxygen, and nitrogen can be used as the insulating film 501C.

Note that the insulating film 501C includes the openings 591A, 591B, and 591C.

<<Insulating Film 706>>

For example, a material that can be used for the insulating film 521 can be used for the insulating film 528. Specifically, for example, a film containing silicon and oxygen can be used for the insulating film 706.

<<Wiring, Terminal, and Conductive Film>>

A conductive material can be used for a wiring or the like. Specifically, the conductive material can be used for the signal line S1($j$), the signal line S2($j$), the scan line G1($i$), the scan line G2(*i*), the wiring CSCOM, the wiring ANO, the terminal 519B, the terminal 519C, the terminal 719, the conductive film 511B, the conductive film 511C, or the like.

For example, an inorganic conductive material, an organic conductive material, a metal material, a conductive ceramic material, or the like can be used for the wiring or the like.

Specifically, a metal element selected from aluminum, gold, platinum, silver, copper, chromium, tantalum, titanium, molybdenum, tungsten, nickel, iron, cobalt, palladium, and manganese can be used for the wiring or the like. Alternatively, an alloy including any of the above-described metal elements, or the like can be used for the wiring or the like. In particular, an alloy of copper and manganese is suitably used in microfabrication with the use of a wet etching method.

Specifically, a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film or a tungsten nitride film, a three-layer structure in which a titanium film, an aluminum film, and a titanium film are stacked in this order, or the like can be used for the wiring or the like.

Specifically, a conductive oxide such as indium oxide, indium tin oxide, indium zinc oxide, zinc oxide, or zinc oxide to which gallium is added can be used for the wiring or the like.

Specifically, a film containing graphene or graphite can be used for the wiring or the like.

For example, a film including graphene oxide is formed and is reduced, so that a film including graphene can be formed. As a reducing method, a method using heat, a method using a reducing agent, or the like can be employed.

Specifically, a conductive high molecule can be used for the wiring or the like.

<<First Conductive Film and Second Conductive Film>>

For example, the material that can be used for the wiring or the like can be used for the first conductive film or the second conductive film.

The first electrode 751(*i,j*), the wiring, or the like can be used for the first conductive film.

The conductive film 512B, the wiring, or the like of the transistor that can be used as the switch SW1 can be used as the second conductive film.

<<Pixel Circuit 530(*i,j*)>>

The pixel circuit 530(*i,j*) is electrically connected to the signal line S1(*j*), the signal line S2(*j*), the scan line G1(*i*), the scan line G2(*i*), the wiring CSCOM, and the wiring ANO (see FIG. 11).

The pixel circuit 530(*i,j*+1) is electrically connected to a signal line S1(*j*+1), a signal line S2(*j*+1), the scan line G1(*i*), the scan line G2(*i*), the wiring CSCOM, and the wiring ANO.

In the case where a voltage of a signal supplied to the signal line S2(*j*) is different from a voltage of a signal supplied to the signal line S1(*j*+1), the signal line S1(*j*+1) is positioned apart from the signal line S2(*j*). Specifically, the signal line S2(*j*+1) is positioned adjacent to the signal line S2(*j*).

The pixel circuit 530(*i,j*) includes the switch SW1, a capacitor C1, a switch SW2, a transistor M, and a capacitor C2.

For example, a transistor including a gate electrode electrically connected to the scan line G1(*i*) and a first electrode electrically connected to the signal line S1(*j*) can be used as the switch SW1.

The capacitor C1 includes a first electrode electrically connected to a second electrode of the transistor used as the switch SW1 and a second electrode electrically connected to the wiring CSCOM.

For example, a transistor including a gate electrode electrically connected to the scan line G2(*i*) and a first electrode electrically connected to the signal line S2(*j*) can be used for the switch SW2.

The transistor M includes a gate electrode electrically connected to a second electrode of the transistor used for the switch SW2 and a first electrode electrically connected to the wiring ANO.

Note that a transistor including a conductive film provided so that a semiconductor film is interposed between a gate electrode and the conductive film can be used as the transistor M. For example, a conductive film electrically connected to a wiring that can supply a potential the same as that of the gate electrode of the transistor M can be used.

The capacitor C2 includes a first electrode electrically connected to the second electrode of the transistor used for the switch SW2 and a second electrode electrically connected to the first electrode of the transistor M.

Note that the first electrode of the first display element 750 can be electrically connected to the second electrode of the transistor used as the switch SW1, and the second electrode of the first display element 750 can be electrically connected to the wiring VCOM1, so that the first display element 750 can be driven.

In addition, the first electrode of the second display element 550 can be electrically connected to the second electrode of the transistor M, and the second electrode of the second display element 550 can be electrically connected to the wiring VCOM2, so that the second display element 550 can be driven.

<<Switch SW1, Switch SW2, Transistor M, and Transistor MD>>

For example, a bottom-gate transistor, a top-gate transistor, or the like can be used as the switch SW1, the switch SW2, the transistor M, the transistor MD, or the like.

For example, a transistor whose semiconductor film contains a semiconductor containing an element of Group 14 can be used. Specifically, a semiconductor containing silicon can be used for the semiconductor film. For example, single crystal silicon, polysilicon, microcrystalline silicon, or amorphous silicon can be used for the semiconductor film of the transistor.

For example, a transistor whose semiconductor film contains an oxide semiconductor can be used. Specifically, an oxide semiconductor containing indium or an oxide semiconductor containing indium, gallium, and zinc can be used for a semiconductor film.

For example, a transistor having a lower leakage current in an off state than a transistor that uses amorphous silicon for a semiconductor film can be used as the switch SW1, the switch SW2, the transistor M, the transistor MD, or the like. Specifically, a transistor in which an oxide semiconductor is used for the semiconductor film 508 can be used as the switch SW1, the switch SW2, the transistor M, the transistor MD, or the like.

Thus, a pixel circuit can hold an image signal for a longer time than a pixel circuit including a transistor that uses amorphous silicon for a semiconductor film. Specifically, the selection signal can be supplied at a frequency of lower than 30 Hz, preferably lower than 1 Hz, further preferably less than once per minute while flickering is suppressed. Consequently, eyestrain on a user of the data processor can be reduced, and power consumption for driving can be reduced.

The transistor that can serve as the switch SW1 includes the semiconductor film 508 and a conductive film 504 that includes a region overlapping with the semiconductor film 508 (see FIG. 10B). The transistor that can serve as the switch SW1 includes the conductive film 512A and the conductive film 512B.

Note that the conductive film 504 and an insulating film 506 serve as a gate electrode and a gate insulating film, respectively. The conductive film 512A has one of a function as a source electrode and a function as a drain electrode, and the conductive film 512B has the other.

A transistor in which the semiconductor film 508 is provided between the conductive film 504 and a conductive film 524 can be used as the transistor M (see FIG. 9B).

A conductive film in which a 10-nm-thick film containing tantalum and nitrogen and a 300-nm-thick film containing copper are stacked in this order can be used as the conductive film 504.

A material in which a 400-nm-thick film containing silicon and nitrogen and a 200-nm-thick film containing silicon, oxygen, and nitrogen are stacked in this order can be used for the insulating film 506.

A 25-nm-thick film containing indium, gallium, and zinc can be used as the semiconductor film 508.

A conductive film in which a 50-nm-thick film containing tungsten, a 400-nm-thick film containing aluminum, and a 100-nm-thick film containing titanium are stacked in this order can be used as the conductive film 512A or 512B.

<<First Display Element 750(i,j)>>

For example, a display element having a function of controlling transmission or reflection of light can be used as the first display element 750(i,j) or the like. For example, a combined structure of a polarizing plate and a liquid crystal element or a MEMS shutter display element can be used. Specifically, the use of a reflective display element can reduce power consumption of an input/output device. For example, a reflective liquid crystal display element can be used as the first display element 750.

For example, a liquid crystal element driven in any of the following driving modes can be used: an in-plane switching (IPS) mode, a twisted nematic (TN) mode, a fringe field switching (FFS) mode, an axially symmetric aligned microcell (ASM) mode, an optically compensated birefringence (OCB) mode, a ferroelectric liquid crystal (FLC) mode, an antiferroelectric liquid crystal (AFLC) mode, and the like.

In addition, a liquid crystal element that can be driven by, for example, a vertical alignment (VA) mode such as a multi-domain vertical alignment (MVA) mode, a patterned vertical alignment (PVA) mode, an electrically controlled birefringence (ECB) mode, a continuous pinwheel alignment (CPA) mode, or an advanced super view (ASV) mode can be used.

For example, thermotropic liquid crystal, low-molecular liquid crystal, high-molecular liquid crystal, polymer dispersed liquid crystal, ferroelectric liquid crystal, or antiferroelectric liquid crystal can be used. Alternatively, a liquid crystal material that exhibits a cholesteric phase, a smectic phase, a cubic phase, a chiral nematic phase, an isotropic phase, or the like can be used. Alternatively, a liquid crystal material that exhibits a blue phase can be used.

<<First Electrode 751(i,j)>>

For example, the material of the wiring or the like can be used for the first electrode 751(i,j). Specifically, a reflective film can be used for the first electrode 751(i,j).

<<Reflective Film>>

For example, a material reflecting visible light can be used as the reflective film. Specifically, a material containing silver can be used for the reflective film. For example, a material containing silver and palladium or a material containing silver and copper can be used for the reflective film.

The reflective film reflects light that passes through the layer 753 containing a liquid crystal material. This allows the first display element 750 to serve as a reflective liquid crystal element. Alternatively, for example, a material with an uneven surface can be used for the reflective film. In that case, incident light can be reflected in various directions so that a white image can be displayed.

Note that other structures may be used as the reflective film without limitation to the first electrode 751(i,j). For example, a structure in which the reflective film lies between the layer 753 containing a liquid crystal material and the first electrode 751(i,j), or a structure in which the first electrode 751(i,j) having light-transmitting properties lies between the reflective film and the layer 753 containing a liquid crystal material can be used.

<<Opening 751H>>

If the ratio of the total area of the opening 751H to the total area except for the opening is too large, display performed using the first display element 750(i,j) is dark. If the ratio of the total area of the opening 751H to the total area except for the opening is too small, display performed using the second display element 550(i,j) is dark.

If the area of the opening 751H in the reflective film is too small, the light extraction efficiency of light emitted from the second display element 550(i,j) is reduced.

The opening 751H may have a polygonal shape, a quadrangular shape, an elliptical shape, a circular shape, a cross-like shape, a stripe shape, a slit-like shape, or a checkered pattern, for example. The opening 751H may be positioned close to an adjacent pixel. The opening 751H is preferably provided close to a pixel emitting light of the same color, in which case an undesired phenomenon in which light emitted from the second display element 550(i,j) enters a coloring film of the adjacent pixel, which is called cross talk, can be suppressed.

<<Second Electrode 752>>

For example, a material having a visible-light transmitting property and conductivity can be used for the second electrode 752.

For example, a conductive oxide, a metal film thin enough to transmit light, or a metal nanowire can be used as the second electrode 752.

Specifically, a conductive oxide containing indium, a metal thin film whose thickness is more than or equal to 1 nm and less than or equal to 10 nm, or a metal nanowire containing silver can be used for the second electrode 752.

Specifically, indium oxide, indium tin oxide, indium zinc oxide, zinc oxide, zinc oxide to which gallium is added, zinc oxide to which aluminum is added, or the like can be used for the second electrode 752.

<<Control Line CL(g), Signal Line ML(h), and Conductive Film BR(g,h)>>

For example, a material having a visible-light-transmitting property and conductivity can be used for the control line CL(g), the signal line ML(h), or the conductive film BR(g,h).

Specifically, a material used for the second electrode 752 can be used for the control line CL(g), the signal line ML(h), or the conductive film BR(g,h).

<<Alignment Films AF1 and AF2>>

For example, the alignment films AF1 and AF2 can be formed with a material containing polyimide or the like, such as a material formed to have a predetermined alignment by a rubbing process or an optical alignment process.

For example, a film containing soluble polyimide can be used as the alignment film AF1 or AF2.

<<Coloring Film CF1>>

The coloring film CF1 can be formed using a material transmitting light of a predetermined color, and can thus be used as a color filter or the like.

For example, the coloring film CF1 can be formed with a material transmitting light of blue, green, red, yellow, or white.

<<Light-Blocking Film BM>>

The light-blocking film BM can be formed with a material that prevents light transmission and can thus be used as a black matrix, for example.

<<Insulating Film 771>>

The insulating film 771 can be formed with polyimide, epoxy resin, acrylic resin, or the like.

<<Functional Films 770P and 770D>>

For example, an anti-reflection film, a polarizing film, a retardation film, a light diffusion film, a condensing film, or the like can be used as the functional film 770P or the functional film 770D. Alternatively, a film containing a dichromatic pigment can be used for the functional film 770P.

Alternatively, an antistatic film preventing the attachment of a foreign substance, a water repellent film suppressing the attachment of stain, a hard coat film suppressing generation of a scratch in use, or the like can be used for the functional film 770P.

Specifically, a circularly polarizing film can be used for the functional film 770P. Furthermore, a light diffusion film can be used for the functional film 770D.

<<Second Display Element 550(i,j)>>

A light-emitting element, for example, can be used as the second display element 550(i,j). Specifically, an organic electroluminescence element, an inorganic electroluminescence element, a light-emitting diode, or the like can be used for the second display element 550(i,j).

For example, a light-emitting organic compound can be used for the layer 553(j) containing a light-emitting material. Quantum dots can be used for the layer 553(j) containing a light-emitting material.

For example, a stack body for emitting blue light, green light, or red light can be used as the layer 553(j) containing a light-emitting material.

For example, a stack body extending linearly in the row direction along the signal line S1(j) can be used for the layer 553(j) containing a light-emitting material. Furthermore, a belt-like stack that extends in the column direction along the signal line S1(j+1) and emits light of a color different from that of light emitted from the layer 553(j) containing a light-emitting material can be used for a layer 553(j+1) containing a light-emitting material.

For example, a stack body for emitting white light can be used as the layer 553(j) containing a light-emitting material and the layer 553(j+1) containing a light-emitting material. Specifically, a stack of a layer containing a light-emitting material containing a fluorescent material that emits blue light, a layer containing a material that is other than a fluorescent material and that emits green light and red light, or a layer containing a material that is other than a fluorescent material and that emits yellow light can be used as the layer 553(j) containing a light-emitting material and the layer 553(j+1) containing a light-emitting material.

For example, a material that can be used for the wiring or the like can be used for the third electrode 551(i,j) or the fourth electrode 552.

For example, a material that transmits visible light and can be used for the wiring or the like can be used for the third electrode 551(i,j).

Specifically, conductive oxide, indium-containing conductive oxide, indium oxide, indium tin oxide, indium zinc oxide, zinc oxide, zinc oxide to which gallium is added, or the like can be used for the third electrode 551(i,j). Alternatively, a metal film that is thin enough to transmit light can be used as the third electrode 551(i,j).

For example, a material that reflects visible light and can be used for the wiring or the like can be used for the fourth electrode 552.

<<Sensing Element 775(g,h)>>

For example, an element that senses electrostatic capacitance, illuminance, magnetic force, a radio wave, pressure, or the like and supplies data based on the sensed physical value can be used for the sensing element 775(g,h).

Specifically, a capacitor, a photoelectric conversion element, a magnetic sensing element, a piezoelectric element, a resonator, or the like can be used as the sensing element 775(g,h).

For example, when an object that has a higher dielectric constant than the air, such as a finger, approaches the conductive film in the air, electrostatic capacitance between the finger and the conductive film changes. This electrostatic capacitance change is sensed, and the sensed data can be supplied. Specifically, a self-capacitive sensing element can be used.

For example, the control line CL(g) and the signal line ML(h) can be used for the sensing element 775(g,h). Specifically, the control line CL(g) to which the search signal is supplied and the signal line ML(h) that is arranged so that an electric field that is partly blocked by an approaching object is formed between the signal line ML(h) and the control line CL(g) can be used. Thus, the electric field that is blocked by the approaching object and changed can be sensed using the potential of the signal line ML(h), and a sensor signal is supplied. As a result, the approaching object that blocks the electric field can be sensed. Specifically, a mutual capacitive sensing element can be used.

<<Driver Circuit GD>>

Any of a variety of sequential circuits, such as a shift register, can be used as the driver circuit GD. For example, the transistor MD, a capacitor, and the like can be used in the driver circuit GD. Specifically, a transistor including a semiconductor film that can be formed at the same step as the transistor M can be used.

A transistor whose structure is different from the transistor that can be used as the switch SW1 can be used as the transistor MD. Specifically, a transistor including the conductive film 524 can be used as the transistor MD (see FIG. 9B).

The semiconductor film 508 is provided between the conductive films 524 and 504. The insulating film 516 is provided between the conductive film 524 and the semiconductor film 508. The insulating film 506 is provided between the semiconductor film 508 and the conductive film 504. For example, the conductive film 524 is electrically connected to a wiring supplying the same potential as that supplied to the conductive film 504.

Note that the transistor MD can have the same structure as the transistor M.

<<Driver Circuit SD>>

For example, an integrated circuit can be used in the driver circuit SD. Specifically, an integrated circuit formed on a silicon substrate can be used as the driver circuit SD.

For example, a chip on glass (COG) method can be used to mount the driver circuit SD on a pad electrically connected to the pixel circuit 530(i,j). Specifically, an anisotropic conductive film can be used to mount the integrated circuit on the pad.

Note that the pad can be formed in the same step as the terminal 519B or 519C.

<<Oscillator Circuit OSC and Detection Circuit DC>>

For example, an integrated circuit can be used in the oscillator circuit OSC or the detection circuit DC. Specifically, an integrated circuit formed on a silicon substrate can be used as the oscillator circuit OSC or the detection circuit DC.

For example, a chip on glass (COG) method can be used to mount the oscillator circuit OSC or the detection circuit DC on a pad electrically connected to the sensing element 775(g,h). Specifically, an anisotropic conductive film can be used to mount the integrated circuit on the pad.

Structure Example 2 of Input/Output Device

Another structure of the input/output device of one embodiment of the present invention is described with reference to FIGS. 14A to 14C, FIGS. 15A and 15B, and FIG. 16.

Figure 14A:
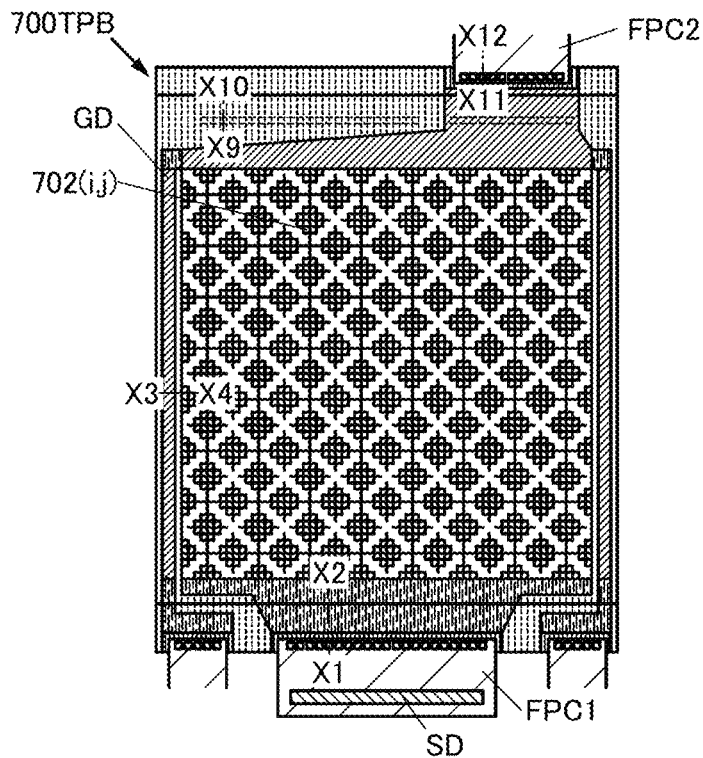
FIGS. 14A to 14C illustrate a cross-sectional structure of an input/output device of an embodiment.
Figure 14B:
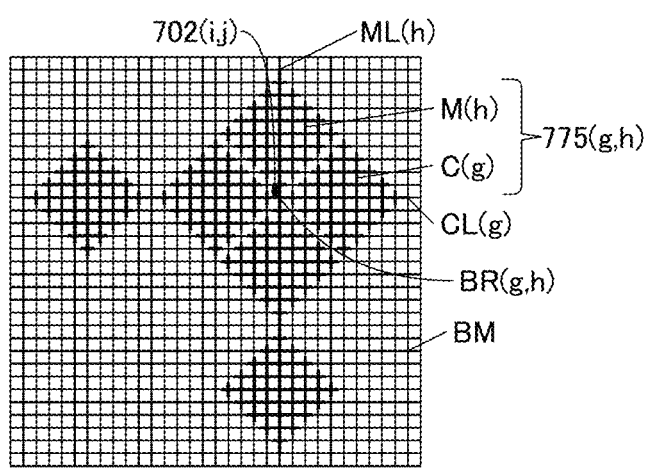
Figure 14C:
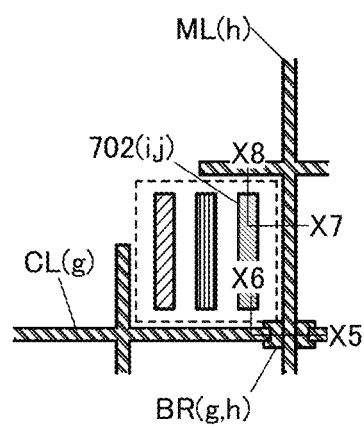

FIGS. 14A to 14C illustrate a structure of an input/output device 700TPB of one embodiment of the present invention. FIG. 14A is a top view of the input/output device of one embodiment of the present invention. FIG. 14B is a schematic diagram illustrating a part of an input portion of the input/output device of one embodiment of the present invention. FIG. 14C is a schematic diagram illustrating a part of FIG. 14B.

Figure 15A:
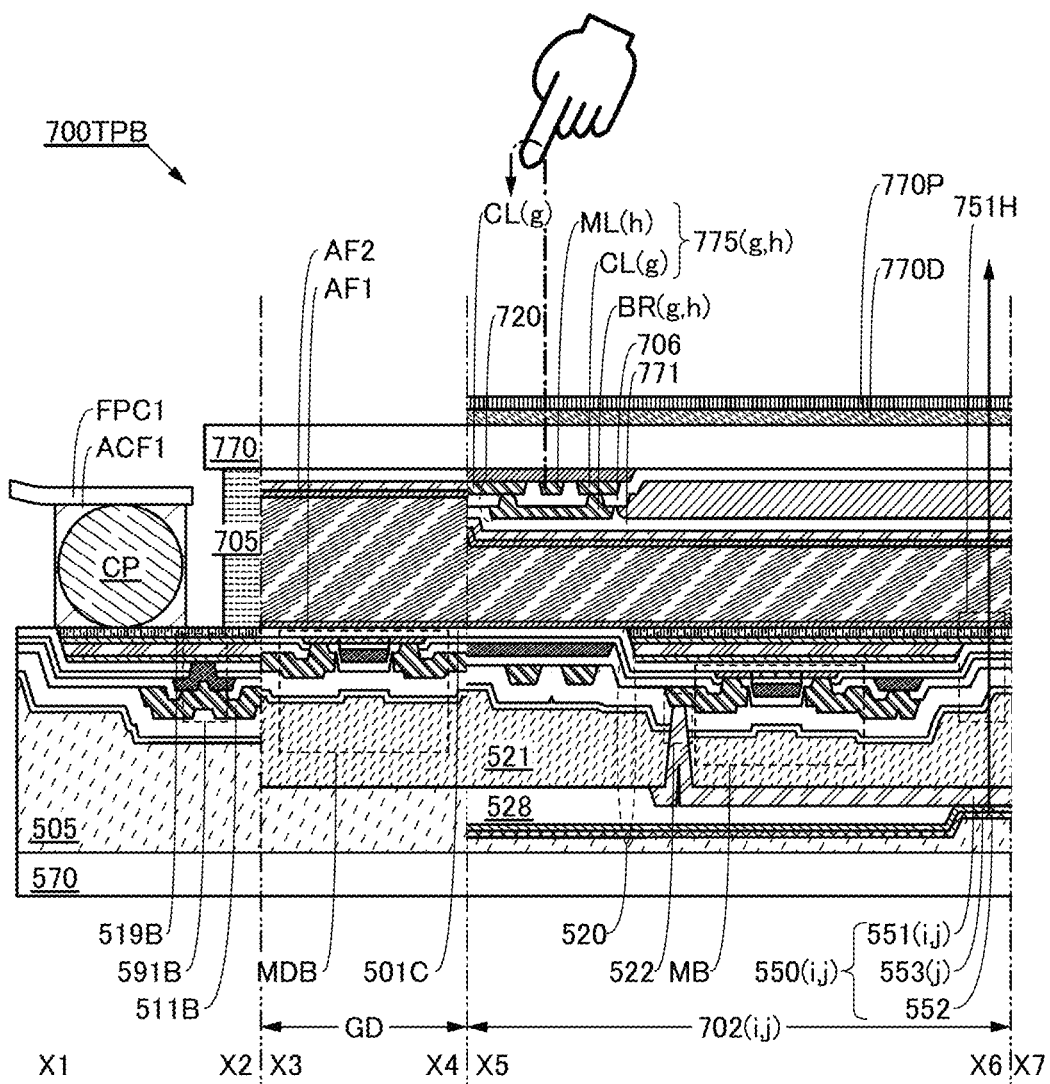
FIGS. 15A and 15B are cross-sectional views illustrating a cross-sectional structure of an input/output device of an embodiment.
Figure 15B:
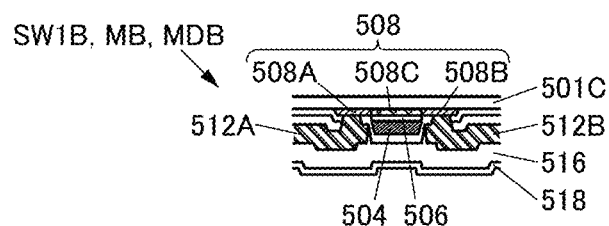
Figure 16:
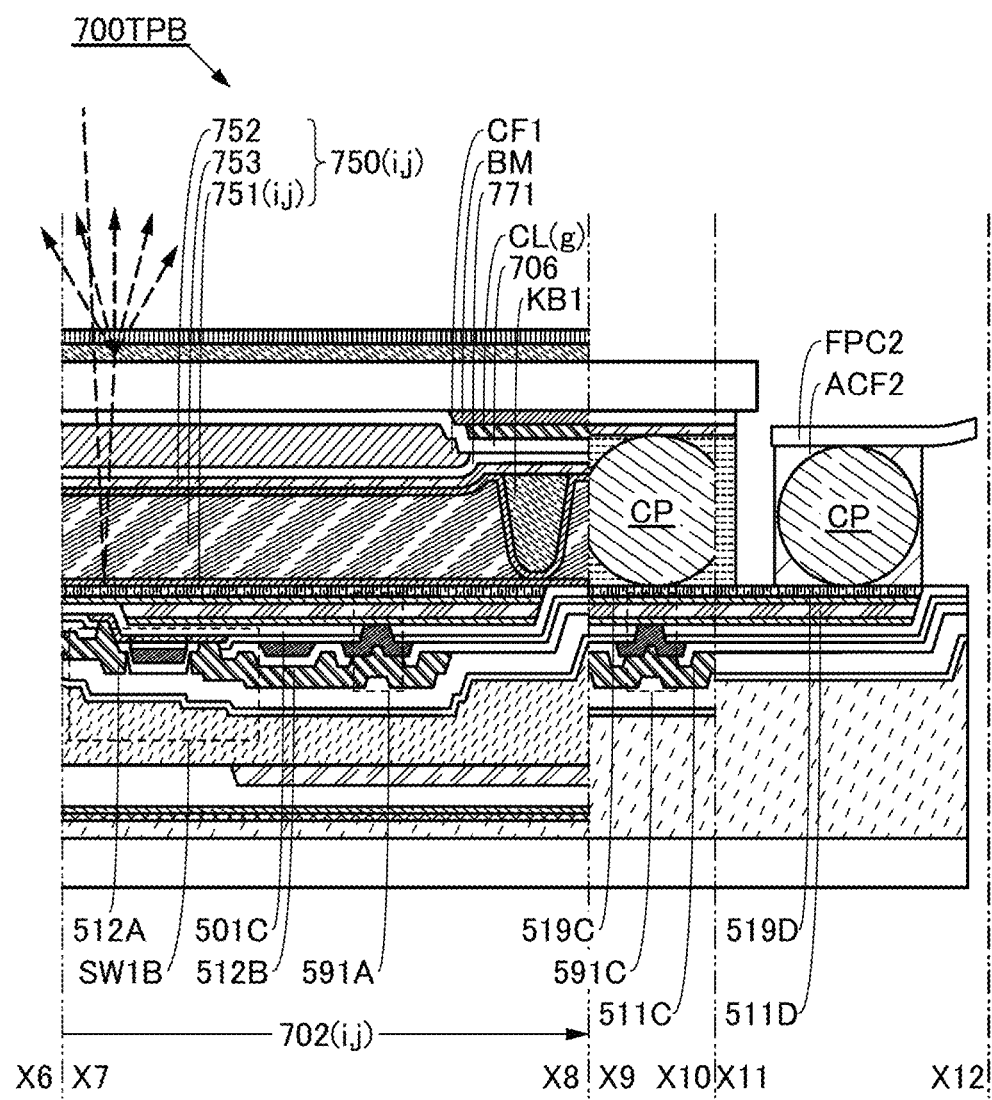
FIG. 16 is a cross-sectional view illustrating a cross-sectional structure of an input/output device of an embodiment.

FIGS. 15A and 15B and FIG. 16 are cross-sectional views illustrating a structure of the input/output device of one embodiment of the present invention. FIG. 15A is a cross-sectional view taken along lines X1-X2 and X3-X4 in FIG. 14A and line X5-X6 in FIG. 14C. FIG. 15B illustrates a part of FIG. 15A.

FIG. 16 is a cross-sectional view taken along line X7-X8 in FIG. 14C and lines X9-X10 and X11-X12 in FIG. 14A.

Note that the input/output device 700TPB is different from the input/output device 700TPA, which is described with reference to FIGS. 8A, 8B-1, and 8B-2, FIGS. 9A and 9B, FIGS. 10A and 10B, FIG. 11, FIGS. 12A, 12B-1, and 12B-2, and FIGS. 13A, 13B-1, and 13B-2, in that a top-gate transistor is included; the functional layer 720 including an input portion is included in a region surrounded by the substrate 770, the insulating film 501C, and the sealant 705; the control line CL(g) including a conductive film provided with an opening in a region overlapping with a pixel is included; the signal line ML(h) including a conductive film provided with an opening in a region overlapping with a pixel is included; a wiring 511D electrically connected to the control line CL(g) or the signal line ML(h) is included; and a terminal 519D electrically connected to the wiring 511D is included. The different portions are described in detail below, and the above description is referred to for the other portions capable of using similar structures.

In the input/output device 700TPB described in this embodiment, the control line CL(g) includes the conductive film provided with the opening, and the signal line ML(h) includes the conductive film provided with the opening. The openings have the regions overlapping with the pixel. The opening of the conductive film included in the control line CL(g) includes a region overlapping with the pixel 702(i,j) (see FIGS. 14B and 14C and FIG. 15A). Note that the input/output device 700TPB further includes the light-blocking film BM between the sensing element 775(g,h) and the substrate 770 (see FIG. 15A). The light-blocking film BM has an opening in a region overlapping with the first display element 750(i,j). Moreover, the light-blocking film BM has a region overlapping with the sensing element 775(g,h).

In the input/output device 700TPB described in this embodiment, a distance between the control line CL(g) and the second electrode 752 or a distance between the signal line ML(h) and the second electrode 752 is greater than or equal to 0.2 μm and smaller than or equal to 16 μm, preferably greater than or equal to 1 μm and smaller than or equal to 8 μm, further preferably greater than or equal to 2.5 μm and smaller than or equal to 4 μm.

Since the above input/output device of one embodiment of the present invention includes the control line including the conductive film provided with the opening in the region overlapping with the pixel and the signal line including the conductive film provided with the opening in the region overlapping with the pixel, an object that approaches a region overlapping with the display portion can be sensed without disturbing display of the display portion. Moreover, the thickness of the input/output device can be reduced. As a result, a novel input/output device that is highly convenient or reliable can be provided.

In the input/output device described in this embodiment, the functional layer 720 is included in a region surrounded by the substrate 770, the insulating film 501C, and the sealant 705. Thus, the input/output device can be formed without using the substrate 710 and the bonding layer 709.

Furthermore, the input/output device described in this embodiment includes the wiring 511D electrically connected to the control line CL(g) or the signal line ML(h).

Moreover, the input/output device described in this embodiment includes the terminal 519D electrically connected to the wiring 511D. Note that for example, the terminal 519D can be electrically connected to a flexible printed circuit FPC2 using a conductive material ACF2, for example.

<<Wiring 511D>>

For example, a material that can be used for a wiring or the like can be used for the wiring 511D.

Note that the control line CL(g) and the wiring 511D can be electrically connected to each other using a conductive material or the like arranged between the control line CL(g) and the wiring 511D. Alternatively, the signal line ML(h) and the wiring 511D can be electrically connected to each other using a conductive material or the like that is arranged between the signal line ML(h) and the wiring 511D.

<<Terminal 519D>>

For example, a material that can be used for a wiring or the like can be used for the terminal 519D. Specifically, the terminal 519D can have the same structure as that of the terminal 519B or the terminal 519C. Note that for example, the terminal 519D can be electrically connected to the flexible printed circuit FPC2 using the conductive material ACF2.

Note that the search signal can be supplied to the control line CL(g) using the terminal 519D electrically connected to the wiring 511D. Alternatively, the sensor signal can be supplied from the signal line ML(h).

<<Switch SW1B and Transistors MB and MDB>>

A transistor that can be used as the switch SW1B and the transistors MB and MDB include the conductive film 504 having a region overlapping with the insulating film 501C and the semiconductor film 508 having a region between the insulating film 501C and the conductive film 504. Note that the conductive film 504 functions as a gate electrode (see FIG. 15B).

The semiconductor film 508 includes a first region 508A, a second region 508B, and a third region 508C. The first region 508A and the second region 508B do not overlap with the conductive film 504. The third region 508C lies between the first region 508A and the second region 508B and overlaps with the conductive film 504.

The transistor MDB includes the insulating film 506 between the third region 508C and the conductive film 504. Note that the insulating film 506 functions as a gate insulating film.

The first region 508A and the second region 508B have a lower resistivity than the third region 508C, and function as a source region and a drain region.

Note that, for example, a method for controlling the resistivity of the oxide semiconductor film, which is described in the end of this embodiment, can be used as a method for forming the first region 508A and the second region 508B in the semiconductor film 508. Specifically, plasma treatment using a gas containing a rare gas can be employed.

For example, the conductive film 504 can be used as a mask, in which case the shape of part of the third region 508C can be the same as the shape of an end portion of the conductive film 504 in a self-aligned manner.

The transistor MDB includes the conductive films 512A and 512B that are in contact with the first region 508A and the second region 508B, respectively. The conductive film 512A and the conductive film 512B function as a source electrode and a drain electrode.

The transistor that can be formed in the same process as the transistor MDB can be used as the transistor MB.

Structure Example 3 of Input/Output Device

Another structure of the input/output device of one embodiment of the present invention is described with reference to FIGS. 28A and 28B and FIG. 29.

Figure 28A:
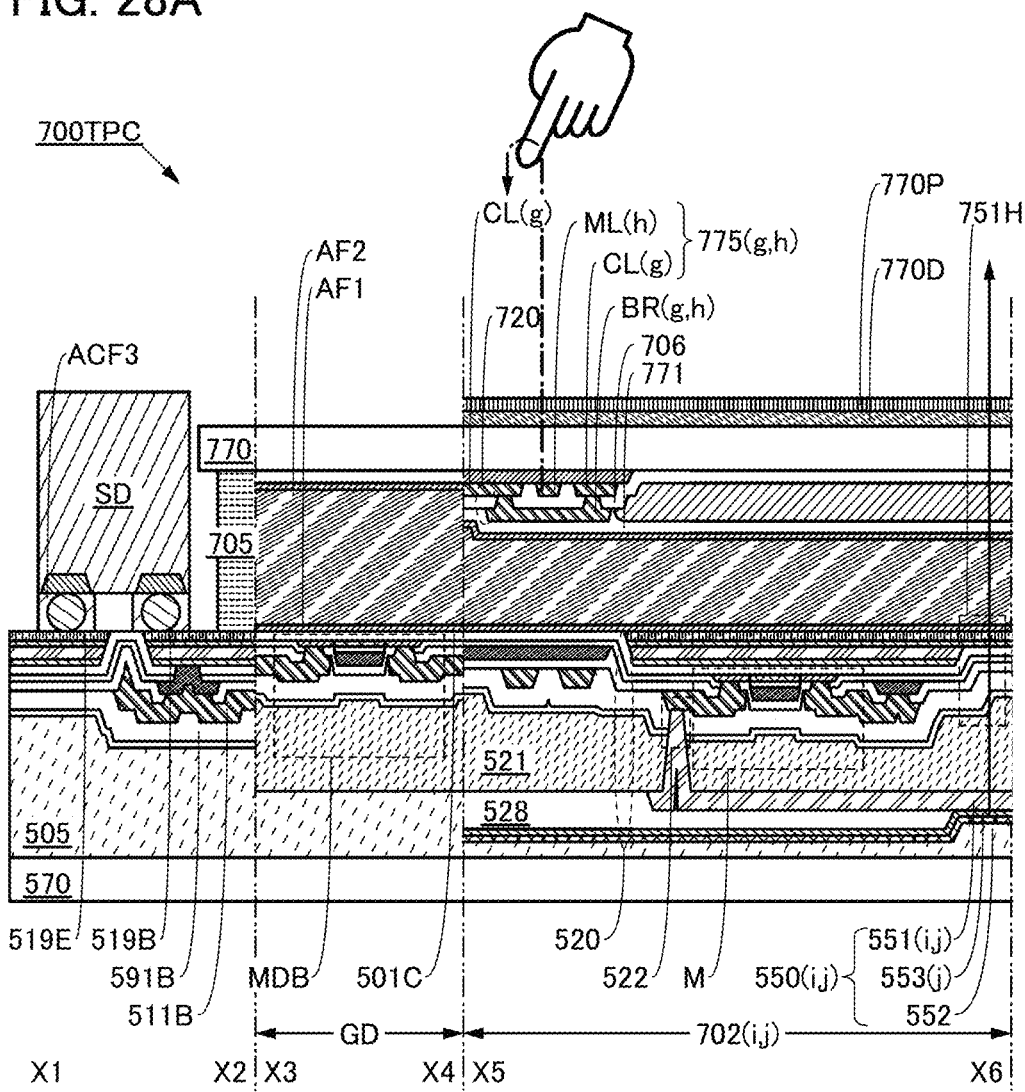
FIGS. 28A and 28B are cross-sectional views illustrating a cross-sectional structure of an input/output device of an embodiment.
Figure 28B:
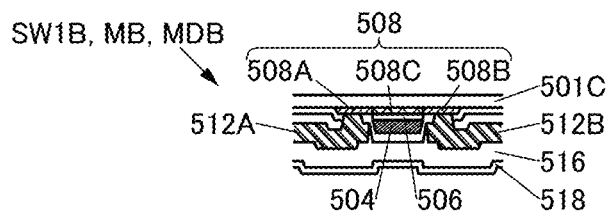
Figure 29:
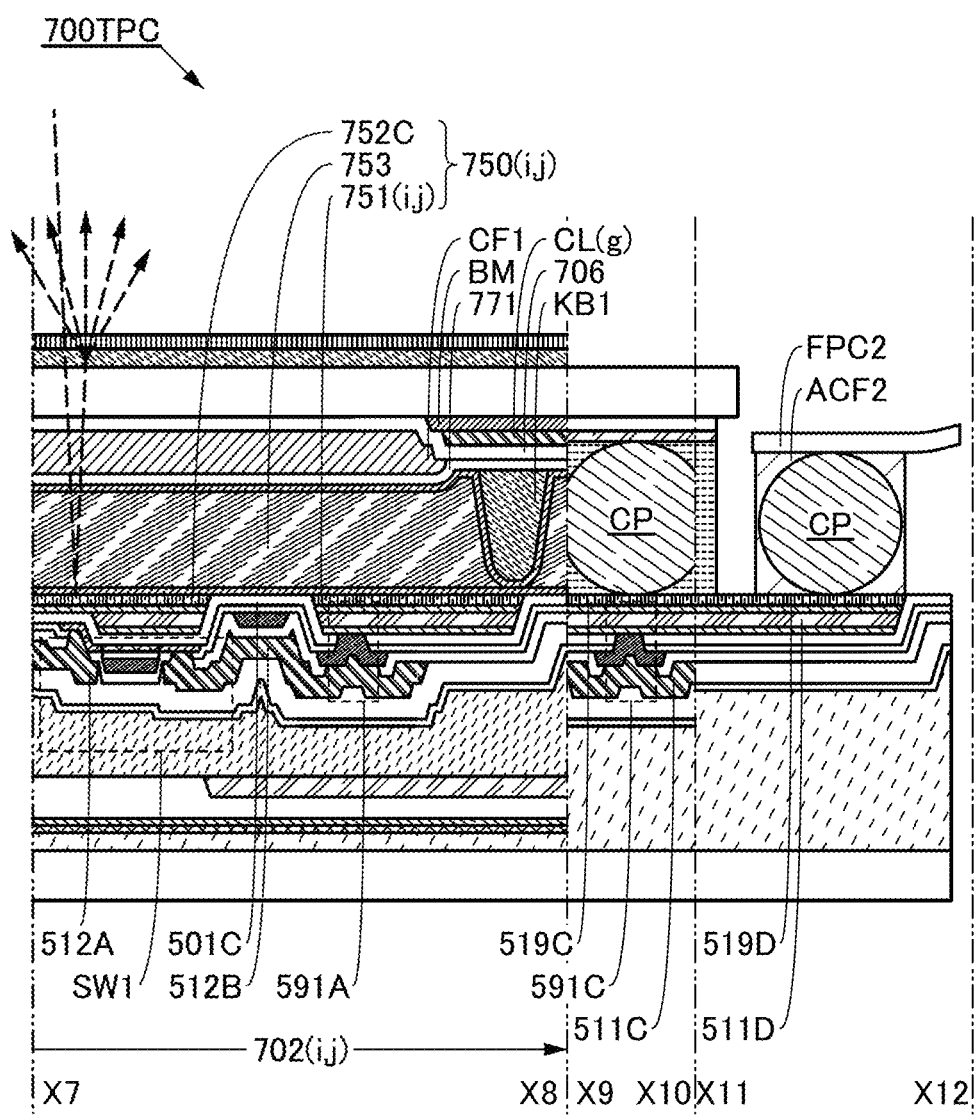
FIG. 29 is a cross-sectional view illustrating a cross-sectional structure of an input/output device of an embodiment.

FIGS. 28A and 28B and FIG. 29 are cross-sectional views illustrating a structure of the input/output device of one embodiment of the present invention. FIG. 28A is a cross-sectional view of the input/output device having a structure different from that illustrated in FIG. 15A, and is a cross-sectional view taken along lines X1-X2 and X3-X4 in FIG. 14A and line X5-X6 in FIG. 14C. FIG. 28B illustrates a part of FIG. 28A.

FIG. 29 is a cross-sectional view of the input/output device having a structure different from that illustrated in FIG. 16, and is a cross-sectional view taken along lines X7-X8, X9-X10, and X11-X12 in FIG. 14C.

Note that an input/output device 700TPC is different from the input/output device 700TPB, which is described with reference to FIGS. 14A to 14C, FIGS. 15A and 15B, and FIG. 16, in that a driver circuit SD electrically connected to a terminal using chip on glass (COG) technique instead of chip on film (COF) technique is included and in that the orientation of the liquid crystal material can be controlled by, instead of an electric field in the thickness direction of the liquid crystal layer (also referred to as the vertical direction), an electric field in the direction intersecting with the vertical direction (also referred to as the horizontal direction or the diagonal direction). The different portions are described in detail below, and the above description is referred to for the other portions capable of using similar structures.

<<Terminal 519E>>

For example, a material that can be used for a wiring or the like can be used for a terminal 519E. Specifically, the terminal 519E can have the same structure as that of the terminal 519B. Note that for example, the terminal 519E can be electrically connected to the driver circuit SD using a conductive material ACF3. Furthermore, the terminal 519B can be electrically connected to the driver circuit SD.

<<Second Electrode 752C>>

For example, a conductive film that can be formed in the same step as the first electrode 751($i,j$) can be used for a second electrode 752C. Thus, for example, a liquid crystal element that can be driven in an in-plane-switching (IPS) mode can be used as the first display element 750($i,j$).

<Method for Controlling Resistivity of Oxide Semiconductor>

The method for controlling the resistivity of an oxide semiconductor film is described.

An oxide semiconductor film with a certain resistivity can be used as the semiconductor film 508, the conductive film 524, or the like.

For example, a method for controlling the concentration of impurities such as hydrogen and water contained in the oxide semiconductor film and/or the oxygen vacancies in the film can be used as the method for controlling the resistivity of an oxide semiconductor.

Specifically, plasma treatment can be used as a method for increasing or decreasing the concentration of impurities such as hydrogen and water and/or the oxygen vacancies in the film.

Specifically, plasma treatment using a gas containing one or more kinds selected from a rare gas (He, Ne, Ar, Kr, or Xe), hydrogen, boron, phosphorus, and nitrogen can be employed. For example, plasma treatment in an Ar atmosphere, plasma treatment in a mixed gas atmosphere of Ar and hydrogen, plasma treatment in an ammonia atmosphere, plasma treatment in a mixed gas atmosphere of Ar and ammonia, or plasma treatment in a nitrogen atmosphere can be employed. Thus, the oxide semiconductor film can have a high carrier density and a low resistivity.

Alternatively, hydrogen, boron, phosphorus, or nitrogen is added to the oxide semiconductor film by an ion implantation method, an ion doping method, a plasma immersion ion implantation method, or the like, so that the oxide semiconductor film can have a low resistivity.

Alternatively, an insulating film containing hydrogen is formed in contact with the oxide semiconductor film, and the hydrogen is diffused from the insulating film to the oxide semiconductor film, so that the oxide semiconductor film can have a high carrier density and a low resistivity.

For example, an insulating film with a hydrogen concentration of greater than or equal to $1 \times 10^{22}$ atoms/cm$^3$ is formed in contact with the oxide semiconductor film, in which case hydrogen can be effectively supplied to the oxide semiconductor film. Specifically, a silicon nitride film can be used as the insulating film formed in contact with the oxide semiconductor film.

Hydrogen contained in the oxide semiconductor film reacts with oxygen bonded to a metal atom to be water, and an oxygen vacancy is formed in a lattice from which oxygen is released (or a portion from which oxygen is released). Due to entry of hydrogen into the oxygen vacancy, an electron serving as a carrier is generated in some cases. Furthermore, bonding of part of hydrogen to oxygen bonded to a metal atom causes generation of an electron serving as a carrier in some cases. Thus, the oxide semiconductor film can have a high carrier density and a low resistivity.

Specifically, an oxide semiconductor with a hydrogen concentration measured by secondary ion mass spectrometry (SIMS) of greater than or equal to $8 \times 10^{19}$ atoms/cm$^3$, preferably greater than or equal to $1 \times 10^{20}$ atoms/cm$^3$, further preferably greater than or equal to $5 \times 10^{20}$ atoms/cm$^3$ can be suitably used for the conductive film 524.

On the other hand, an oxide semiconductor with a high resistivity can be used for a semiconductor film where a channel of a transistor is formed, specifically, the semiconductor film 508.

For example, an insulating film containing oxygen, in other words, an insulating film capable of releasing oxygen, is formed in contact with an oxide semiconductor, and the oxygen is supplied from the insulating film to the oxide semiconductor film, so that oxygen vacancies in the film or at the interface can be filled. Thus, the oxide semiconductor film can have a high resistivity.

For example, a silicon oxide film or a silicon oxynitride film can be used as the insulating film capable of releasing oxygen.

The oxide semiconductor film in which oxygen vacancies are filled and the hydrogen concentration is reduced can be referred to as a highly purified intrinsic or substantially highly purified intrinsic oxide semiconductor film. The term "substantially intrinsic" refers to the state in which an oxide semiconductor film has a carrier density lower than $8 \times 10^{11}$/cm$^3$, preferably lower than $1 \times 10^{11}$/cm$^3$, further preferably lower than $1 \times 10^{10}$/cm$^3$. A highly purified intrinsic or substantially highly purified intrinsic oxide semiconductor film has few carrier generation sources and thus can have a low carrier density. The highly purified intrinsic or substantially highly purified intrinsic oxide semiconductor film has a low density of defect states and accordingly can have a low density of trap states.

Furthermore, a transistor including the highly purified intrinsic or substantially highly purified intrinsic oxide semiconductor film has an extremely low off-state current; even when an element has a channel width of $1 \times 10^6$ μm and a channel length L of 10 μm, the off-state current can be lower than or equal to the measurement limit of a semiconductor parameter analyzer, that is, lower than or equal to $1 \times 10^{-13}$ A, at a voltage (drain voltage) between a source electrode and a drain electrode of from 1 V to 10 V.

The transistor in which a channel region is formed in the oxide semiconductor film that is a highly purified intrinsic or substantially highly purified intrinsic oxide semiconductor film can have a small change in electrical characteristics and high reliability.

Specifically, an oxide semiconductor whose hydrogen concentration measured by secondary ion mass spectrometry (SIMS) is lower than or equal to $2 \times 10^{20}$ atoms/cm$^3$, preferably lower than or equal to $5 \times 10^{19}$ atoms/cm$^3$, further preferably lower than or equal to $1 \times 10^{19}$ atoms/cm$^3$, further preferably lower than $5 \times 10^{18}$ atoms/cm$^3$, further preferably lower than or equal to $1 \times 10^{18}$ atoms/cm$^3$, further preferably lower than or equal to $5 \times 10^{17}$ atoms/cm$^3$, further preferably lower than or equal to $1 \times 10^{16}$ atoms/cm$^3$ can be favorably used for a semiconductor where a channel of a transistor is formed.

Note that an oxide semiconductor film that has a higher hydrogen concentration and/or a larger number of oxygen vacancies and that has a lower resistivity than the semiconductor film 508 is used as the conductive film 524.

A film whose hydrogen concentration is twice or more, preferably ten times or more that of the semiconductor film 508 can be used as the conductive film 524.

A film whose resistivity is greater than or equal to $1 \times 10^{-8}$ times and less than $1 \times 10^{-1}$ times that of the semiconductor film 508 can be used as the conductive film 524.

Specifically, a film whose resistivity is higher than or equal to $1 \times 10^{-3}$ Ωcm and lower than $1 \times 10^4$ Ωcm, preferably higher than or equal to $1 \times 10^{-3}$ Ωcm and lower than $1 \times 10^{-1}$ Ωcm can be used as the conductive film 524.

Note that this embodiment can be combined with any of the other embodiments in this specification as appropriate.

Embodiment 2

In this embodiment, a pixel circuit which can be used in the input/output device of one embodiment of the present invention and a structure of a semiconductor device which can be used in the pixel circuit are described with reference to FIG. 1, FIGS. 2A to 2C, FIGS. 3A and 3B, FIGS. 4A to 4C, FIG. 5, FIG. 6, and FIG. 7.

FIG. 1 is a cross-sectional view illustrating a structure of a pixel circuit which can be used in the input/output device of one embodiment of the present invention.

FIGS. 2A to 2C and FIGS. 3A and 3B are cross-sectional views illustrating a structure of the input/output device of one embodiment of the present invention. The input/output device includes the pixel circuit described with reference to FIG. 1.

Figure 2A:
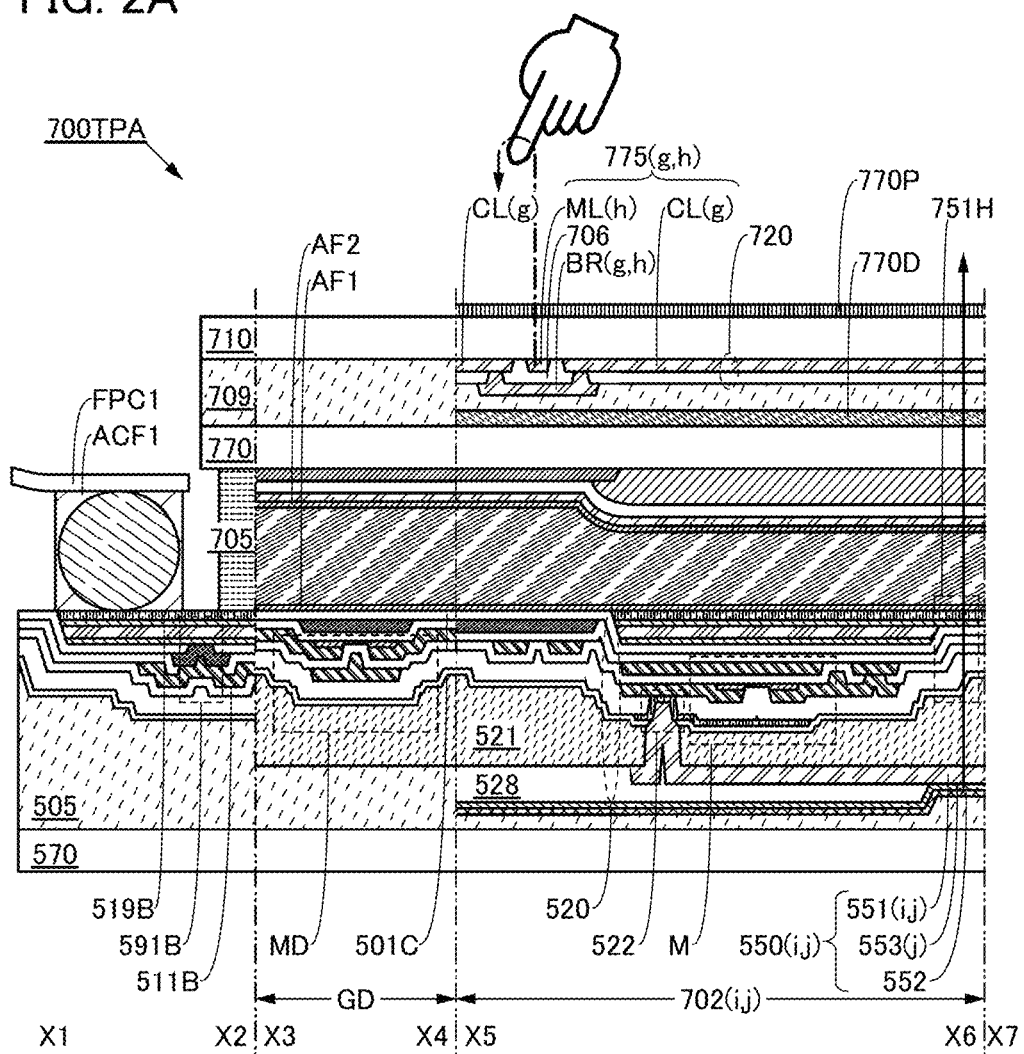
FIGS. 2A to 2C are cross-sectional views illustrating a cross-sectional structure of an input/output device of an embodiment.
Figure 2B:
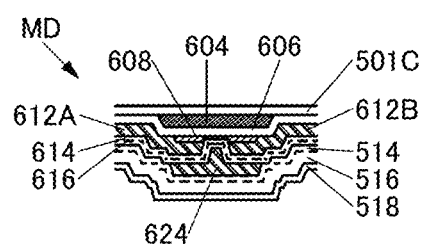
Figure 2C:
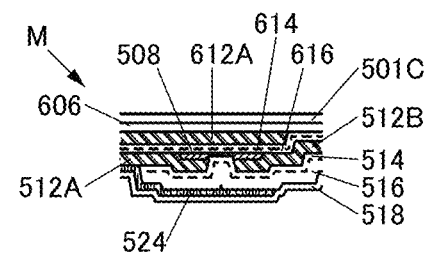

FIG. 2A is a cross-sectional view taken along lines X1-X2 and X3-X4 in FIG. 8A and line X5-X6 in FIG. 8B-1. FIGS. 2B and 2C each illustrate a part of FIG. 2A.

Figure 3A:
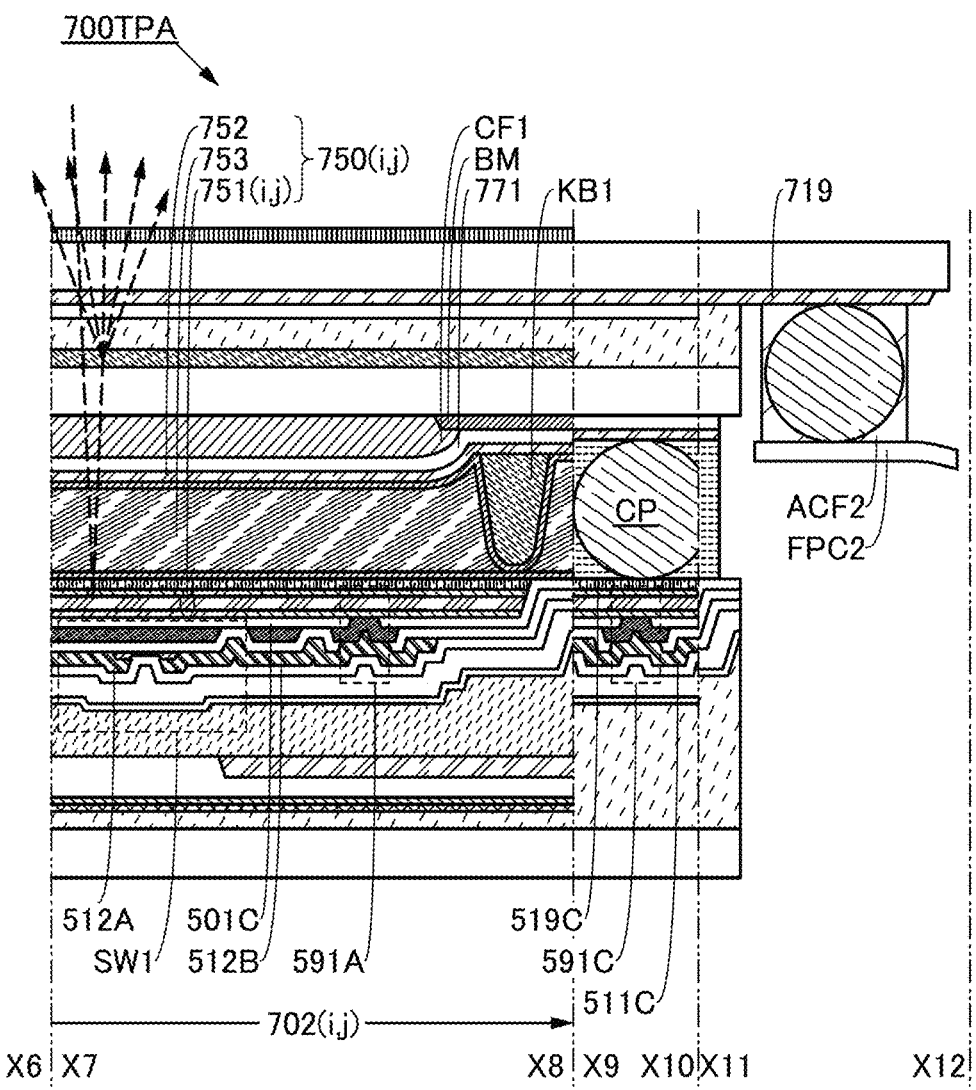
FIGS. 3A and 3B are cross-sectional views illustrating a cross-sectional structure of an input/output device of an embodiment.
Figure 3B:
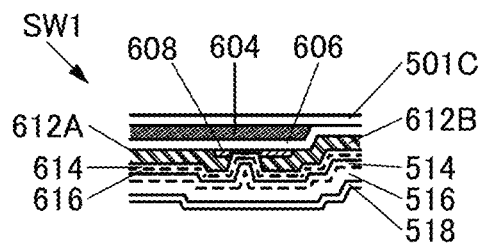

FIG. 3A is a cross-sectional view taken along line X7-X8 in FIG. 8B-1 and lines X9-X10 and X11-X12 in FIG. 8A. FIG. 3B illustrates a part of FIG. 3A.

Figure 4C:
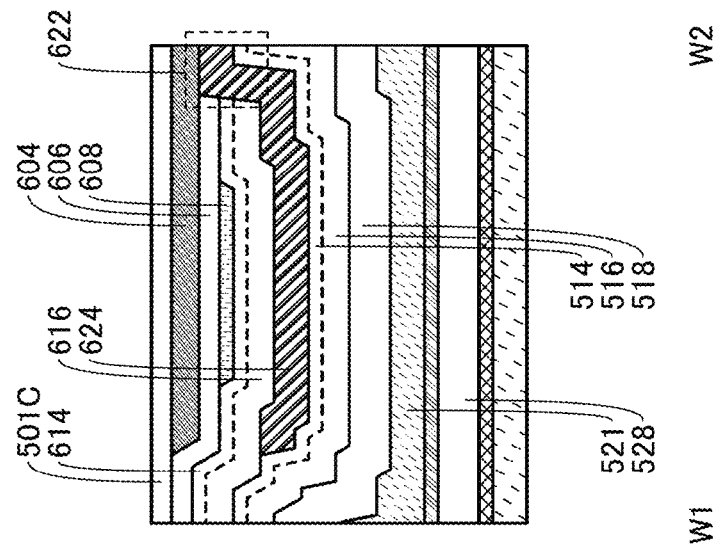
FIGS. 4A to 4C are a circuit diagram, a top view, and a cross-sectional view illustrating a structure of an input/output device of an embodiment.
Figure 4B:
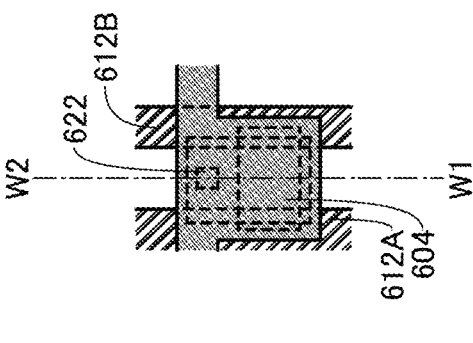
Figure 4A:
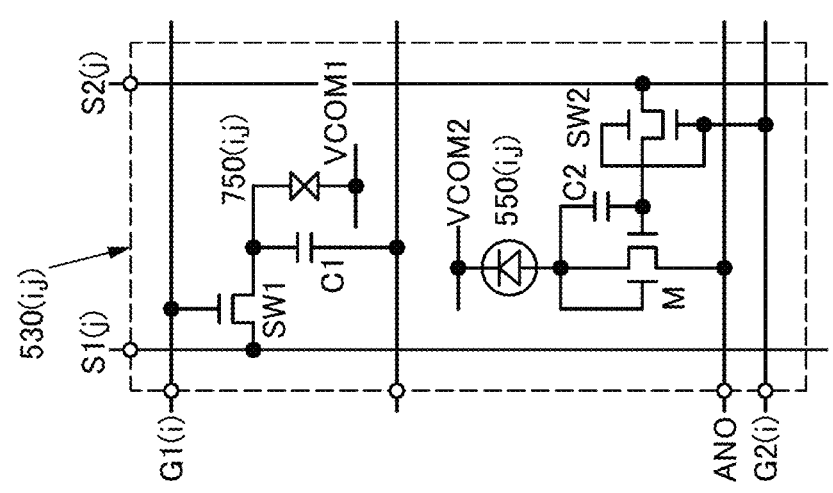

FIG. 4A is a circuit diagram illustrating a configuration of a pixel circuit which can be used in the input/output device of one embodiment of the present invention.

FIG. 4B is a top view of a transistor which can be used in the pixel circuit described with reference to FIG. 4A, specifically, a top view of a transistor which can be used as the switch SW2.

FIG. 4C is a cross-sectional view of the transistor which can be used in the pixel circuit described with reference to FIG. 4A, specifically, a cross-sectional view including a cross section in a channel width (W) direction of the transistor which can be used as the switch SW2 illustrated in FIG. 4B.

Configuration Example of Pixel Circuit

The pixel circuit of one embodiment of the present invention is described with reference to FIG. 4A. The pixel circuit described in this embodiment has a configuration which is different from that of the pixel circuit described in Embodiment 1.

The configuration of the pixel circuit in FIG. 4A is different from the configuration described with reference to FIG. 11 in that the transistor which can be used as the switch SW2 includes a second gate electrode electrically connected to the first gate electrode of the transistor, the transistor M includes a second gate electrode electrically connected to the second electrode of the transistor M, and the second electrode of the capacitor C2 is electrically connected to the second electrode of the transistor M.

Structure Example 1 of Semiconductor Device

A structure of a semiconductor device which can be used in the above-described pixel circuit is described with reference to FIG. 1.

The transistor which can be used as the switch SW2 includes a conductive film 604 on the insulating film 501C, an insulating film 606 on the insulating film 501C and the conductive film 604, a semiconductor film 608 on the insulating film 606, a conductive film 612B on the semiconductor film 608, a conductive film 612A on the semiconductor film 608, an insulating film 614 on the semiconductor film 608, the conductive film 612B, and the conductive film 612A, an insulating film 616 on the insulating film 614, and a conductive film 624 on the insulating film 616.

The transistor M includes the conductive film 612A, the insulating film 614 on the conductive film 612A, the insulating film 616 on the insulating film 614, the semiconductor film 508 on the insulating film 616, the conductive film 512B on the semiconductor film 508, the conductive film 512A on the semiconductor film 508, an insulating film 514 on the semiconductor film 508, the conductive film 512B, and the conductive film 512A, the insulating film 516 on the insulating film 514, and the conductive film 524 on the insulating film 516. In the connection portion 522, the conductive film 524 is connected to the conductive film 512B through an opening provided in the insulating films 514 and 516.

In addition, the insulating film 518 is provided on the conductive film 524, and the insulating film 521 is provided on the insulating film 518. In the insulating films 518 and 521, an opening which reaches the conductive film 524 is provided. In addition, the third electrode 551(i,j) is provided on the insulating film 521. In the connection portion 522, the third electrode 551(i,j) is connected to the conductive film 524 through the opening.

The semiconductor device described in this embodiment includes the transistor which can be used as the switch SW2 and the transistor M. For example, a bottom-gate transistor or a top-gate transistor can be used as the switch SW2 or the transistor M.

For example, a semiconductor containing an element belonging to Group 14 can be used for the semiconductor film 508 or the semiconductor film 608 of the transistor. Specifically, a semiconductor containing silicon can be used for the semiconductor film 508 or the semiconductor film 608 of the transistor. For example, single crystal silicon, polysilicon, microcrystalline silicon, or amorphous silicon can be used for the semiconductor film 508 or the semiconductor film 608 of the transistor.

For example, an oxide semiconductor can be used for the semiconductor film of the transistor. Specifically, an oxide semiconductor containing indium or an oxide semiconductor containing indium, gallium, and zinc can be used for the semiconductor film 508 or the semiconductor film 608 of the transistor.

The transistor which can be used as the switch SW2 has a region overlapping with at least part of the transistor M, for example.

Thus, the area occupied by the transistors can be reduced as compared with the case where the transistor which can be used as the switch SW2 and the transistor M are arranged on the same plane. In addition, the area occupied by the transistors in the semiconductor device can be preferably reduced. As a result, the aperture ratio of the pixel can be increased.

In addition, the pixel density can be increased. For example, even in the case where the pixel density is higher than or equal to 500 ppi (pixel per inch), higher than or equal to 600 ppi, higher than 1000 ppi, or higher than 2000 ppi, the aperture ratio of the pixel can be increased. Note that ppi is a unit indicating the number of pixels per inch.

Furthermore, for example, the ratio of the total area of the opening 751H to the total area except for the opening can be greater than or equal to 0.1 and less than or equal to 0.25. This increases the reliability of the second display element.

Moreover, the channel length (L) and the channel width (W) of the transistor, the widths of the wiring and the electrode connected to the transistor, and the like can be relatively increased. As a result, variations in processing size can be reduced.

The semiconductor film 608 has a region overlapping with the semiconductor film 508 (see FIG. 1).

A channel region formed in the semiconductor film 608 does not have a region overlapping with a channel region formed in the semiconductor film 508.

A region of the semiconductor film 608 where a channel is not formed has a region overlapping with a region of the semiconductor film 508 where a channel is not formed.

For example, when the channel region of the transistor which can be used as the switch SW2 overlaps with the channel region of the transistor M, one of the transistors which is active might affect the other. In order to avoid this effect, a structure in which the distance between the transistor which can be used as the switch SW2 and the transistor M is increased, a structure in which a conductive film is provided between the transistor which can be used as the switch SW2 and the transistor M, or the like can be used. However, the thickness of the semiconductor device is increased in the former structure, sometimes causing a problem with bendability or the like when, for example, the semiconductor device is formed over a flexible substrate or the like. The latter structure also causes a problem in that a step of forming the conductive film is needed and the thickness of the semiconductor device is increased as in the former structure.

The transistor which can be used as the switch SW2 includes any of the conductive films and the insulating films which can be formed in a process for manufacturing the transistor M. This reduces the number of masks or the number of steps for the manufacture.

The insulating film in which the insulating film 614 and the insulating film 616 are stacked has a first surface and a second surface facing the first surface, for example. The first surface has a region in contact with the semiconductor film 608, and the second surface has a region in contact with the semiconductor film 508.

For example, in the transistor which can be used as the switch SW2, the conductive film 604 serves as the first gate electrode, the conductive film 612B serves as the source electrode, the conductive film 612A serves as the drain electrode, and the conductive film 624 serves as the second gate electrode. In addition, the insulating film 606 serves as a first gate insulating film and the insulating films 614 and 616 serve as a second gate insulating film.

In the transistor M, the conductive film 612A serves as the first gate electrode, the conductive film 512B serves as the source electrode, the conductive film 512A serves as the drain electrode, and the conductive film 524 serves as the second gate electrode. In addition, the insulating films 614 and 616 serve as a first gate insulating film and the insulating films 514 and 516 serve as a second gate insulating film.

The semiconductor film 608 and the semiconductor film 508 each contain In, M (M is Al, Ga, Y, or Sn), and Zn.

The semiconductor films 608 and 508 each preferably include a region in which the atomic proportion of In is larger than the atomic proportion of M, for example. Note that the semiconductor device of one embodiment of the present invention is not limited thereto: each of them may include a region in which the atomic proportion of In is lower than the atomic proportion of M or may include a region in which the atomic proportion of In is equal to the atomic proportion of M.

It is preferable that the compositions of the semiconductor film 608 and the semiconductor film 508 be the same or substantially the same. This allows the semiconductor films to be formed with the same apparatus or the same method, for example, so that the manufacturing cost can be reduced. Note that the semiconductor device of one embodiment of the present invention is not limited thereto: the compositions of the semiconductor film 608 and the semiconductor film 508 may be different from each other.

The semiconductor films 608 and 508 each include a region in which the atomic proportion of In is larger than the atomic proportion of M. Thus, the field-effect mobility of the transistor which can be used as the switch SW2 and the transistor M can be increased. Specifically, the field-effect mobility of one of or both of the transistor which can be used as the switch SW2 and the transistor M can exceed 10 cm$^2$/Vs, preferably 30 cm$^2$/Vs.

As described above, the semiconductor device of one embodiment of the present invention has a structure where a plurality of transistors are stacked. This results in a reduced area where transistors are placed.

One of the plurality of transistors includes any of the conductive films and the insulating films which can be formed in a process for manufacturing the other transistor. Thus, the number of masks or the number of steps can be reduced.

<<Effect of Two Gate Electrodes>>

The transistor which can be used as the switch SW2 or the transistor M can include two gate electrodes (see FIG. 1).

The effect of the two gate electrodes on the characteristics of the transistor is described with reference to FIG. 4C and FIG. 1.

As illustrated in FIG. 4C, the conductive film 624 serving as the second gate electrode is electrically connected to the conductive film 604 serving as the first gate electrode through an opening 622. Accordingly, the conductive film 604 and the conductive film 624 are supplied with the same potential.

As illustrated in FIG. 4C, the semiconductor film 608 is positioned so as to face the conductive film 604 and the conductive film 624, and is sandwiched between the two conductive films serving as the gate electrodes.

Each of the lengths of the conductive films 604 and 624 in the channel width direction is longer than the length of the semiconductor film 608 in the channel width direction. In addition, the semiconductor film 608 is entirely surrounded by the conductive films 604 and 624 with the insulating films 606, 614, and 616 provided therebetween.

In other words, the conductive films 604 and 624 are connected to each other through the opening 622 provided in the insulating films 606, 614, and 616, and each include a region positioned outside a side end portion of the semiconductor film 608.

With such a structure, the semiconductor film 608 included in the transistor which can be used as the switch SW2 can be electrically surrounded by electric fields of the conductive films 604 and 624. Such a device structure of the transistor which can be used as the switch SW2, in which electric fields of a first gate electrode and a second gate electrode electrically surround an oxide semiconductor film where a channel region is formed, can be referred to as a surrounded channel (S-channel) structure.

Since the transistor which can be used as the switch SW2 has the S-channel structure, an electric field for inducing a channel can be effectively applied to the semiconductor film 608 by the conductive film 604 serving as a first gate electrode; therefore, the current drive capability of the transistor can be improved and high on-state current characteristics can be obtained. Since the on-state current can be increased, it is possible to reduce the size of the transistor. In addition, since the transistor which can be used as the switch SW2 has a structure where the semiconductor film 608 is surrounded by the conductive film 604 serving as a first gate electrode and the conductive film 624 serving as a second gate electrode, the mechanical strength of the transistor can be increased.

Although the structure in which the first gate electrode is connected to the second gate electrode is described above, one embodiment of the present invention is not limited thereto. For example, the conductive film 624 serving as the second gate electrode may be electrically connected to the conductive film 512B serving as the source electrode or the drain electrode of the transistor M.

Structure Example 2 of Semiconductor Device

Another structure of the semiconductor device which can be used in the pixel circuit of one embodiment of the present invention is described with reference to FIG. 5.

Figure 5:
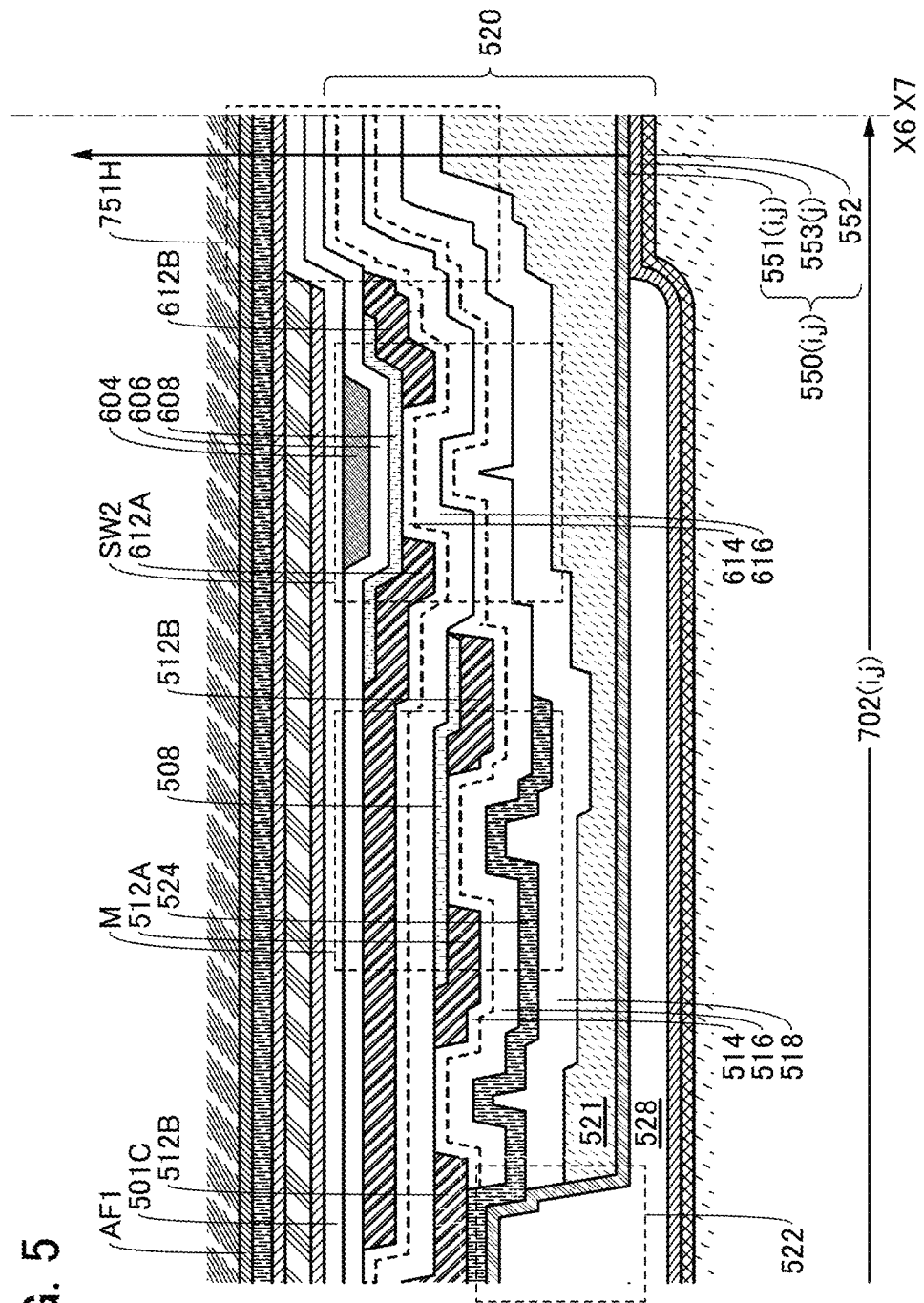
FIG. 5 is a cross-sectional view illustrating a cross-sectional structure of an input/output device of an embodiment.

The semiconductor device illustrated in FIG. 5 is different from the semiconductor device described with reference to FIG. 1 in not including the conductive film 624 serving as the second gate electrode of the transistor which can be used as the switch SW2.

Structure Example 3 of Semiconductor Device

Another structure of the semiconductor device which can be used in the pixel circuit of one embodiment of the present invention is described with reference to FIG. 6.

Figure 6:
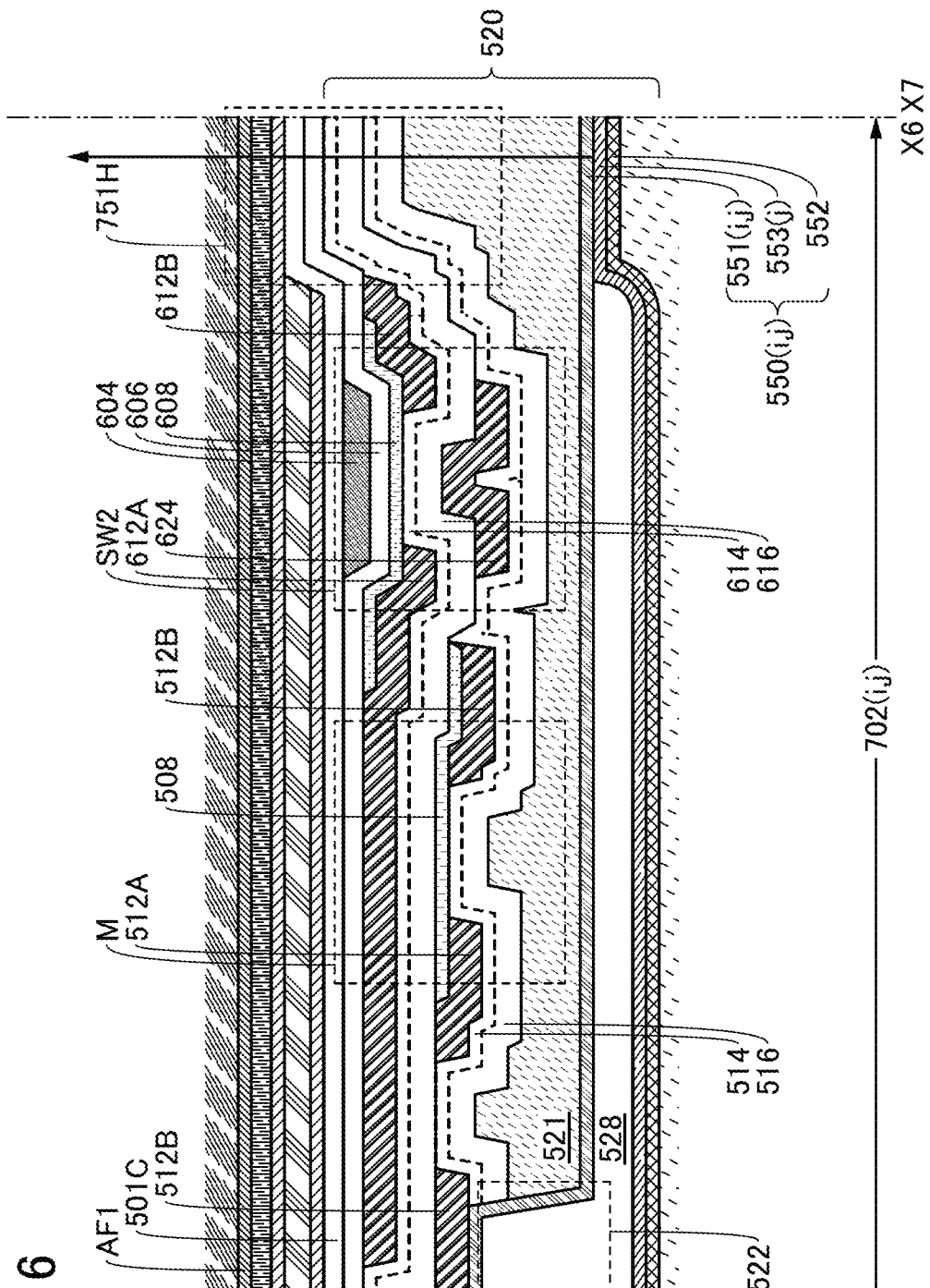
FIG. 6 is a cross-sectional view illustrating a cross-sectional structure of an input/output device of an embodiment.

The semiconductor device illustrated in FIG. 6 is different from the semiconductor device described with reference to FIG. 1 in that the conductive film 524 serving as the second gate electrode of the transistor M is not included and the insulating film 518 on the conductive film 524 is not provided.

Structure Example 4 of Semiconductor Device

Another structure of the semiconductor device which can be used in the pixel circuit of one embodiment of the present invention is described with reference to FIG. 7.

Figure 7:
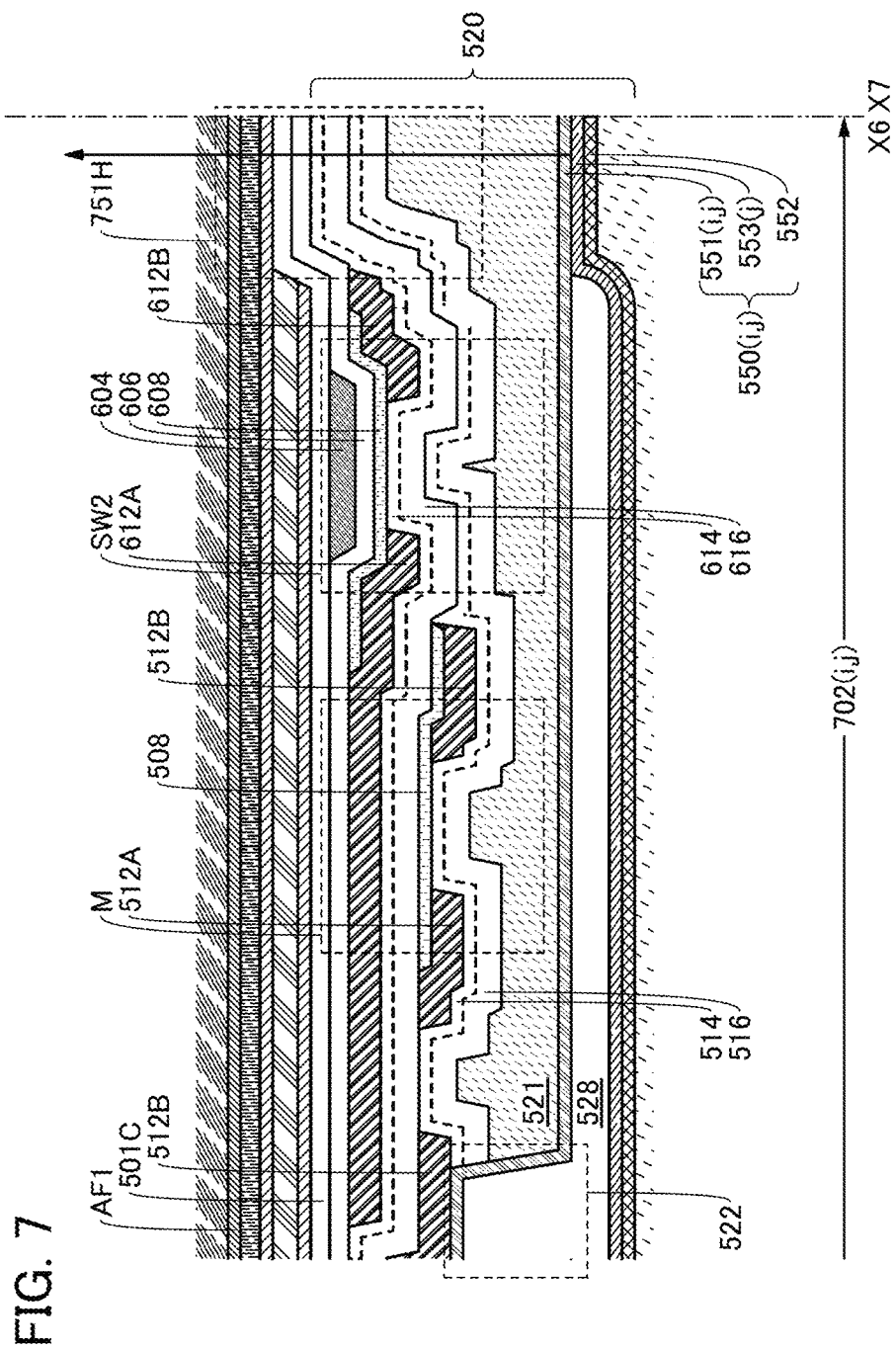
FIG. 7 is a cross-sectional view illustrating a cross-sectional structure of an input/output device of an embodiment.

The semiconductor device illustrated in FIG. 7 is different from the semiconductor device described with reference to FIG. 1 in that the conductive film 624 serving as the second gate electrode of the transistor which can be used as the switch SW2 is not included, the conductive film 524 serving as the second gate electrode of the transistor M is not included, and the insulating film 518 on the conductive film 524 is not included.

Note that this embodiment can be combined with any of the other embodiments in this specification as appropriate.

Embodiment 3

In this embodiment, the structure of a transistor that can be used for the input/output device of one embodiment of the present invention is described with reference to FIGS. 17A to 17D.

Structure Example of Semiconductor Device

Figure 17A:
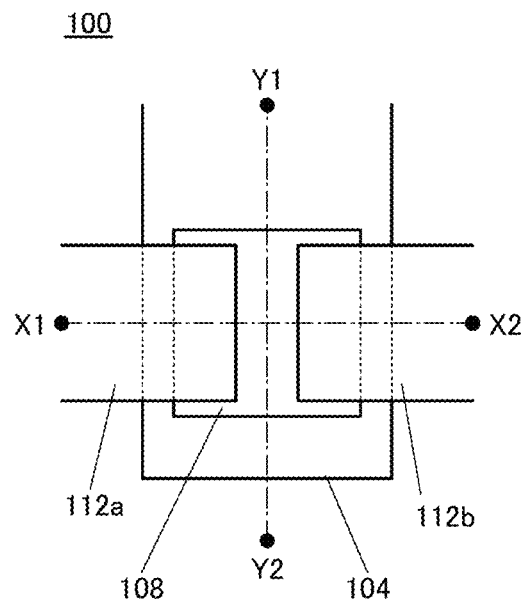
FIGS. 17A to 17D are a plan view and cross-sectional views illustrating a structure of a transistor of an embodiment.

FIG. 17A is a top view of a transistor 100. FIG. 17C is a cross-sectional view taken along line X1-X2 in FIG. 17A. FIG. 17D is a cross-sectional view taken along line Y1-Y2 in FIG. 17A. Note that in FIG. 17A, some components of the transistor 100 (e.g., an insulating film serving as a gate insulating film) are not illustrated to avoid complexity. In some cases, the direction of the line X1-X2 is referred to as a channel length direction and the direction of the line Y1-Y2 is referred to as a channel width direction. As in FIG. 17A, some components might not be illustrated in some top views of transistors described below.

Note that the transistor 100 can be used in the input/output device or the like described in Embodiment 1.

For example, when the transistor 100 is used as the switch SW1, a substrate 102, a conductive film 104, a stacked film of an insulating film 106 and an insulating film 107, an oxide semiconductor film 108, a conductive film 112a, a conductive film 112b, a stacked film of an insulating film 114 and an insulating film 116, and an insulating film 118 can be referred to as the insulating film 501C, the conductive film 504, the insulating film 506, the semiconductor film 508, the conductive film 512A, the conductive film 512B, the insulating film 516, and the insulating film 518, respectively.

The transistor 100 includes the conductive film 104 functioning as a gate electrode over the substrate 102, the insulating film 106 over the substrate 102 and the conductive film 104, the insulating film 107 over the insulating film 106, the oxide semiconductor film 108 over the insulating film 107, and the conductive films 112a and 112b functioning as source and drain electrodes electrically connected to the oxide semiconductor film 108. Over the transistor 100, specifically, over the conductive films 112a and 112b and the oxide semiconductor film 108, the insulating films 114, 116, and 118 are provided. The insulating films 114, 116, and 118 function as protective insulating films for the transistor 100.

The oxide semiconductor film 108 includes an oxide semiconductor film 108a on the conductive film 104 side and an oxide semiconductor film 108b over the oxide semiconductor film 108a. The conductive film 104 serves as a gate electrode. Furthermore, the insulating films 106 and 107 function as gate insulating films of the transistor 100.

An In-M oxide (M is Ti, Ga, Sn, Y, Zr, La, Ce, Nd, or Hf) or an In-M-Zn oxide can be used for the oxide semiconductor film 108. It is particularly preferable to use an In-M-Zn oxide for the oxide semiconductor film 108.

The oxide semiconductor film 108a includes a first region in which the atomic proportion of In is larger than the atomic proportion of M. The oxide semiconductor film 108b includes a second region in which the atomic proportion of In is smaller than that in the oxide semiconductor film 108a. The second region includes a portion thinner than the first region.

The oxide semiconductor film 108a including the first region in which the atomic proportion of In is larger than that of M can increase the field-effect mobility (also simply referred to as mobility or μFE) of the transistor 100. Specifically, the field-effect mobility of the transistor 100 can exceed 10 cm²/Vs.

For example, the use of the transistor with high field-effect mobility for a gate driver that generates a gate signal (specifically, a demultiplexer connected to an output terminal of a shift register included in a gate driver) allows a semiconductor device or a display device to have a narrow frame.

On the other hand, the oxide semiconductor film 108a including the first region in which the atomic proportion of In is larger than that of M makes it easier to change electrical characteristics of the transistor 100 in light irradiation. However, in the semiconductor device of one embodiment of the present invention, the oxide semiconductor film 108b is formed over the oxide semiconductor film 108a. In addition, the thickness of the channel region in the oxide semiconductor film 108b is smaller than the thickness of the oxide semiconductor film 108a.

Furthermore, the oxide semiconductor film 108b includes the second region in which the atomic proportion of In is smaller than that in the oxide semiconductor film 108a and thus has larger Eg than the oxide semiconductor film 108a. For this reason, the oxide semiconductor film 108 that is a layered structure of the oxide semiconductor film 108a and the oxide semiconductor film 108b has high resistance to a negative bias stress test with light irradiation.

The amount of light absorbed by the oxide semiconductor film 108 can be reduced during light irradiation. As a result, the change in electrical characteristics of the transistor 100 due to light irradiation can be reduced. In the semiconductor device of one embodiment of the present invention, the insulating film 114 or the insulating film 116 includes excess oxygen. This structure can further reduce the change in electrical characteristics of the transistor 100 due to light irradiation.

Here, the oxide semiconductor film 108 is described in detail with reference to FIG. 17B.

Figure 17B:
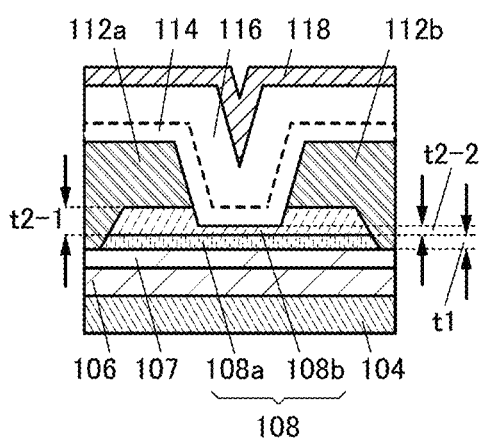
Figure 17C:
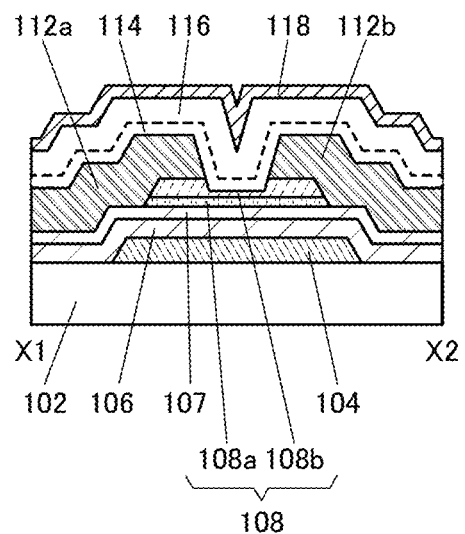
Figure 17D:
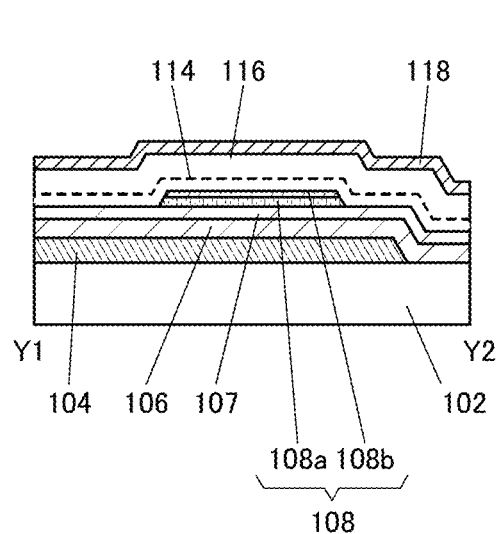

FIG. 17B is a cross-sectional enlarged view of the oxide semiconductor film 108 and the vicinity thereof in the transistor 100 illustrated in FIG. 17C.

In FIG. 17B, t1, t2-1, and t2-2 denote a thickness of the oxide semiconductor film 108a, one thickness of the oxide semiconductor film 108b, and the other thickness of the oxide semiconductor film 108b, respectively. The oxide semiconductor film 108b over the oxide semiconductor film 108a prevents the oxide semiconductor film 108a from being exposed to an etching gas, an etchant, or the like when the conductive films 112a and 112b are formed. This is why the oxide semiconductor film 108a is not or is hardly reduced in thickness. In contrast, in the oxide semiconductor film 108b, a portion not overlapping with the conductive films 112a and 112b is etched by formation of the conductive films 112a and 112b, so that a depression is formed in the etched region. In other words, a thickness of the oxide semiconductor film 108b in a region overlapping with the conductive films 112a and 112b is t2-1, and a thickness of the oxide semiconductor film 108b in a region not overlapping with the conductive films 112a and 112b is t2-2.

As for the relationships between the thicknesses of the oxide semiconductor film 108a and the oxide semiconductor film 108b, t2-1>t1>t2-2 is preferable. A transistor with the thickness relationships can have high field-effect mobility and less variation in threshold voltage in light irradiation.

When oxygen vacancy is formed in the oxide semiconductor film 108 included in the transistor 100, electrons serving as carriers are generated; as a result, the transistor 100 tends to be normally-on. Therefore, for stable transistor characteristics, it is important to reduce oxygen vacancy in the oxide semiconductor film 108, particularly oxygen vacancy in the oxide semiconductor film 108a. In the structure of the transistor of one embodiment of the present invention, excess oxygen is introduced into an insulating film over the oxide semiconductor film 108, here, the insulating film 114 and/or the insulating film 116 over the oxide semiconductor film 108, whereby oxygen is moved from the insulating film 114 and/or the insulating film 116 to the oxide semiconductor film 108 to fill oxygen vacancy in the oxide semiconductor film 108, particularly in the oxide semiconductor film 108a.

Note that it is preferable that the insulating films 114 and 116 each include a region (oxygen excess region) including oxygen in excess of that in the stoichiometric composition. In other words, the insulating films 114 and 116 are insulating films capable of releasing oxygen. Note that the oxygen excess region is formed in the insulating films 114 and 116 in such a manner that oxygen is introduced into the insulating films 114 and 116 after the deposition, for example. As a method for introducing oxygen, an ion implantation method, an ion doping method, a plasma immersion ion implantation method, plasma treatment, or the like may be employed.

In order to fill oxygen vacancy in the oxide semiconductor film 108a, the thickness of the portion including the channel region and the vicinity of the channel region in the oxide semiconductor film 108b is preferably small, and t2-2<t1 is preferably satisfied. For example, the thickness of the portion including the channel region and the vicinity of the channel region in the oxide semiconductor film 108b is preferably more than or equal to 1 nm and less than or equal to 20 nm, further preferably more than or equal to 3 nm and less than or equal to 10 nm.

Other constituent elements of the semiconductor device of this embodiment are described below in detail.

<<Substrate>>

There is no particular limitation on the property of a material and the like of the substrate 102 as long as the material has heat resistance enough to withstand at least heat treatment to be performed later. For example, a glass substrate, a ceramic substrate, a quartz substrate, or a sapphire substrate may be used as the substrate 102.

Alternatively, a single crystal semiconductor substrate or a polycrystalline semiconductor substrate of silicon or silicon carbide, a compound semiconductor substrate of silicon germanium, an SOI substrate, or the like can be used.

Alternatively, any of these substrates provided with a semiconductor element, an insulating film, or the like may be used as the substrate 102.

Note that in the case where a glass substrate is used as the substrate 102, a large substrate having any of the following sizes can be used: the 6th generation (1500 mm×1850 mm), the 7th generation (1870 mm×2200 mm), the 8th generation (2200 mm×2400 mm), the 9th generation (2400 mm×2800 mm), and the 10th generation (2950 mm×3400 mm). Thus, a large display device can be manufactured.

Alternatively, a flexible substrate may be used as the substrate 102, and the transistor 100 may be provided directly on the flexible substrate. Alternatively, a separation layer may be provided between the substrate 102 and the transistor 100. The separation layer can be used when part or the whole of a semiconductor device formed over the separation layer is separated from the substrate 102 and transferred onto another substrate. In such a case, the transistor 100 can be transferred to a substrate having low heat resistance or a flexible substrate as well.

<<Conductive Film Functioning as Gate Electrode, Source Electrode, and Drain Electrode>>

The conductive film 104 functioning as a gate electrode and the conductive films 112a and 112b functioning as a source electrode and a drain electrode, respectively, can each be formed using a metal element selected from chromium (Cr), copper (Cu), aluminum (Al), gold (Au), silver (Ag), zinc (Zn), molybdenum (Mo), tantalum (Ta), titanium (Ti), tungsten (W), manganese (Mn), nickel (Ni), iron (Fe), and cobalt (Co); an alloy including any of these metal elements as its component; an alloy including a combination of any of these metal elements; or the like.

Furthermore, the conductive films 104, 112a, and 112b may have a single-layer structure or a stacked-layer structure of two or more layers. For example, a single-layer structure of an aluminum film including silicon, a two-layer structure in which a titanium film is stacked over an aluminum film, a two-layer structure in which a titanium film is stacked over a titanium nitride film, a two-layer structure in which a tungsten film is stacked over a titanium nitride film, a two-layer structure in which a tungsten film is stacked over a tantalum nitride film or a tungsten nitride film, and a three-layer structure in which a titanium film, an aluminum film, and a titanium film are stacked in this order can be given. Alternatively, an alloy film or a nitride film in which aluminum and one or more elements selected from titanium, tantalum, tungsten, molybdenum, chromium, neodymium, and scandium are combined may be used.

The conductive films 104, 112a, and 112b can be formed using a light-transmitting conductive material such as indium tin oxide, indium oxide including tungsten oxide, indium zinc oxide including tungsten oxide, indium oxide including titanium oxide, indium tin oxide including titanium oxide, indium zinc oxide, or indium tin oxide to which silicon oxide is added.

A Cu—X alloy film (X is Mn, Ni, Cr, Fe, Co, Mo, Ta, or Ti) may be used for the conductive films 104, 112a, and 112b. Use of a Cu—X alloy film enables the manufacturing cost to be reduced because wet etching process can be used in the processing.

<<Insulating Film Functioning as Gate Insulating Film>>

As each of the insulating films 106 and 107 functioning as gate insulating films of the transistor 100, an insulating film including at least one of the following films formed by a plasma enhanced chemical vapor deposition (PECVD) method, a sputtering method, or the like can be used: a silicon oxide film, a silicon oxynitride film, a silicon nitride oxide film, a silicon nitride film, an aluminum oxide film, a hafnium oxide film, an yttrium oxide film, a zirconium oxide film, a gallium oxide film, a tantalum oxide film, a magnesium oxide film, a lanthanum oxide film, a cerium oxide film, and a neodymium oxide film. Note that instead of a stacked-layer structure of the insulating films 106 and 107, an insulating film of a single layer formed using a material selected from the above or an insulating film of three or more layers may be used.

The insulating film 106 has a function as a blocking film that inhibits penetration of oxygen. For example, in the case where excess oxygen is supplied to the insulating film 107, the insulating film 114, the insulating film 116, and/or the oxide semiconductor film 108, the insulating film 106 can inhibit penetration of oxygen.

Note that the insulating film 107 that is in contact with the oxide semiconductor film 108 functioning as a channel region of the transistor 100 is preferably an oxide insulating film and preferably includes a region including oxygen in excess of the stoichiometric composition (oxygen-excess region). In other words, the insulating film 107 is an insulating film capable of releasing oxygen. In order to provide the oxygen excess region in the insulating film 107, the insulating film 107 is formed in an oxygen atmosphere, for example. Alternatively, the oxygen excess region may be formed by introduction of oxygen into the insulating film 107 after the deposition. As a method for introducing oxygen, an ion implantation method, an ion doping method, a plasma immersion ion implantation method, plasma treatment, or the like may be employed.

In the case where hafnium oxide is used for the insulating film 107, the following effect is attained. Hafnium oxide has a higher dielectric constant than silicon oxide and silicon oxynitride. Therefore, by using hafnium oxide, the thickness of the insulating film 107 can be made large as compared with the case where silicon oxide is used; thus, leakage current due to tunnel current can be low. That is, it is possible to provide a transistor with a low off-state current. Moreover, hafnium oxide with a crystalline structure has higher dielectric constant than hafnium oxide with an amorphous structure. Therefore, it is preferable to use hafnium oxide with a crystalline structure in order to provide a transistor with a low off-state current. Examples of the crystalline structure include a monoclinic crystal structure and a cubic crystal structure. Note that one embodiment of the present invention is not limited thereto.

In this embodiment, a silicon nitride film is formed as the insulating film 106, and a silicon oxide film is formed as the insulating film 107. The silicon nitride film has a higher dielectric constant than a silicon oxide film and needs a larger thickness for electrostatic capacitance equivalent to that of the silicon oxide film. Thus, when the silicon nitride film is included in the gate insulating film of the transistor 100, the physical thickness of the insulating film can be increased. This makes it possible to reduce a decrease in withstand voltage of the transistor 100 and furthermore to increase the withstand voltage, thereby reducing electrostatic discharge damage to the transistor 100.

<<Oxide Semiconductor Film>>

The oxide semiconductor film 108 can be formed using the materials described above.

In the case where the oxide semiconductor film 108 comprises In-M-Zn oxide, it is preferable that the atomic ratio of metal elements of a sputtering target used for forming the In-M-Zn oxide satisfy In≥M and Zn≥M. As the atomic ratio of metal elements of such a sputtering target, In:M:Zn=1:1:1, In:M:Zn=1:1:1.2, In:M:Zn=2:1:3, In:M:Zn=3:1:2, and In:M:Zn=4:2:4.1 are preferable.

In the case where the oxide semiconductor film 108 comprises In-M-Zn oxide, it is preferable to use a target including polycrystalline In-M-Zn oxide as the sputtering target. The use of the target including polycrystalline In-M-Zn oxide facilitates formation of the oxide semiconductor film 108 having crystallinity. Note that the atomic ratios of metal elements in the formed oxide semiconductor film 108 vary from the above atomic ratio of metal elements of the sputtering target within a range of ±40% as an error. For example, when a sputtering target with an atomic ratio of In to Ga and Zn of 4:2:4.1 is used, the atomic ratio of In to Ga and Zn in the oxide semiconductor film 108 may be 4:2:3 or in the vicinity of 4:2:3.

The oxide semiconductor film 108a can be formed using the sputtering target having an atomic ratio of In:M:Zn=2:1:3, In:M:Zn=3:1:2, or In:M:Zn=4:2:4.1. The oxide semiconductor film 108b can be formed using the sputtering target having an atomic ratio of In:M:Zn=1:1:1 or In:M:Zn=1:1:1.2. Note that the atomic ratio of metal elements in a sputtering target used for forming the oxide semiconductor film 108b does not necessarily satisfy In≥M and Zn≥M, and may satisfy In≥M and Zn<M, such as In:M:Zn=1:3:2.

The energy gap of the oxide semiconductor film 108 is 2 eV or more, preferably 2.5 eV or more, further preferably 3 eV or more. The use of an oxide semiconductor having a wide energy gap can reduce off-state current of the transistor 100. In particular, an oxide semiconductor film having an energy gap more than or equal to 2 eV, preferably more than or equal to 2 eV and less than or equal to 3.0 eV is preferably used as the oxide semiconductor film 108a, and an oxide semiconductor film having an energy gap more than or equal to 2.5 eV and less than or equal to 3.5 eV is preferably used as the oxide semiconductor film 108b. Furthermore, the oxide semiconductor film 108b preferably has a higher energy gap than that of the oxide semiconductor film 108a.

Each thickness of the oxide semiconductor film 108a and the oxide semiconductor film 108b is more than or equal to 3 nm and less than or equal to 200 nm, preferably more than or equal to 3 nm and less than or equal to 100 nm, further preferably more than or equal to 3 nm and less than or equal to 50 nm. Note that the above-described thickness relationships between them are preferably satisfied.

An oxide semiconductor film with low carrier density is used as the oxide semiconductor film 108b. For example, the carrier density of the oxide semiconductor film 108b is lower than or equal to $1\times10^{17}/cm^3$, preferably lower than or equal to $1\times10^{15}/cm^3$, further preferably lower than or equal to $1\times10^{13}/cm^3$, still further preferably lower than or equal to $1\times10^{11}/cm^3$.

Note that, without limitation to the compositions and materials described above, a material with an appropriate composition may be used depending on required semiconductor characteristics and electrical characteristics (e.g., field-effect mobility and threshold voltage) of a transistor. Furthermore, in order to obtain required semiconductor characteristics of a transistor, it is preferable that the carrier density, the impurity concentration, the defect density, the atomic ratio of a metal element to oxygen, the interatomic distance, the density, and the like of the oxide semiconductor film 108a and the oxide semiconductor film 108b be set to be appropriate.

Note that it is preferable to use, as the oxide semiconductor film 108a and the oxide semiconductor film 108b, an oxide semiconductor film in which the impurity concentration is low and the density of defect states is low, in which case the transistor can have more excellent electrical characteristics. Here, the state in which the impurity concentration is low and the density of defect states is low (the amount of oxygen vacancy is small) is referred to as "highly purified intrinsic" or "substantially highly purified intrinsic". A highly purified intrinsic or substantially highly purified intrinsic oxide semiconductor film has few carrier generation sources, and thus can have a low carrier density. Thus, a transistor in which a channel region is formed in the oxide semiconductor film rarely has a negative threshold voltage (is rarely normally on). A highly purified intrinsic or substantially highly purified intrinsic oxide semiconductor film has a low density of defect states and accordingly has a low density of trap states in some cases. Furthermore, the highly purified intrinsic or substantially highly purified intrinsic oxide semiconductor film has an extremely low off-state current; even when an element has a channel width of $1\times10^6$ μm and a channel length L of 10 μm, the off-state current can be less than or equal to the measurement limit of a semiconductor parameter analyzer, that is, less than or equal to $1\times10^{-13}$ A, at a voltage (drain voltage) between a source electrode and a drain electrode of from 1 V to 10 V.

Accordingly, the transistor in which the channel region is formed in the highly purified intrinsic or substantially highly purified intrinsic oxide semiconductor film can have a small change in electrical characteristics and high reliability. Charges trapped by the trap states in the oxide semiconductor film take a long time to be released and may behave like fixed charges. Thus, the transistor whose channel region is formed in the oxide semiconductor film having a high density of trap states has unstable electrical characteristics in some cases. As examples of the impurities, hydrogen, nitrogen, alkali metal, alkaline earth metal, and the like are given.

Hydrogen included in the oxide semiconductor film reacts with oxygen bonded to a metal atom to be water, and also causes oxygen vacancy in a lattice from which oxygen is released (or a portion from which oxygen is released). Due to entry of hydrogen into the oxygen vacancy, an electron serving as a carrier is generated in some cases. Furthermore, in some cases, bonding of part of hydrogen to oxygen bonded to a metal atom causes generation of an electron serving as a carrier. Thus, a transistor including an oxide semiconductor film that contains hydrogen is likely to be normally on. Accordingly, it is preferable that hydrogen be reduced as much as possible in the oxide semiconductor film 108. Specifically, in the oxide semiconductor film 108, the concentration of hydrogen that is measured by SIMS is lower than or equal to $2\times10^{20}$ atoms/cm$^3$, preferably lower than or equal to $5\times10^{19}$ atoms/cm$^3$, further preferably lower than or equal to $1\times10^{19}$ atoms/cm$^3$, further preferably lower than or equal to $5\times10^{18}$ atoms/cm$^3$, further preferably lower than or equal to $1\times10^{18}$ atoms/cm$^3$, further preferably lower than or equal to $5\times10^{17}$ atoms/cm$^3$, and further preferably lower than or equal to $1\times10^{16}$ atoms/cm$^3$.

When silicon or carbon that is one of elements belonging to Group 14 is included in the oxide semiconductor film 108a, oxygen vacancy is increased in the oxide semiconductor film 108a, and the oxide semiconductor film 108a becomes an n-type film. Thus, the concentration of silicon or carbon (the concentration is measured by SIMS) in the oxide semiconductor film 108a or the concentration of silicon or carbon (the concentration is measured by SIMS) in the vicinity of an interface with the oxide semiconductor film 108a is set to be lower than or equal to $2\times10^{18}$ atoms/cm$^3$, preferably lower than or equal to $2\times10^{17}$ atoms/cm$^3$.

In addition, the concentration of alkali metal or alkaline earth metal of the oxide semiconductor film 108a, which is measured by SIMS, is lower than or equal to $1\times10^{18}$ atoms/cm$^3$, preferably lower than or equal to $2\times10^{16}$ atoms/cm$^3$. Alkali metal and alkaline earth metal might generate carriers when bonded to an oxide semiconductor, in which case the off-state current of the transistor might be increased. Therefore, it is preferable to reduce the concentration of alkali metal or alkaline earth metal of the oxide semiconductor film 108a.

Furthermore, when including nitrogen, the oxide semiconductor film 108a easily becomes n-type by generation of electrons serving as carriers and an increase of carrier density. Thus, a transistor including an oxide semiconductor film that contains nitrogen is likely to have normally-on characteristics. For this reason, nitrogen in the oxide semiconductor film is preferably reduced as much as possible; the concentration of nitrogen that is measured by SIMS is preferably set to be, for example, lower than or equal to $5\times10^{18}$ atoms/cm$^3$.

Each of the oxide semiconductor films 108a and 108b may have a non-single-crystal structure, for example. The non-single crystal structure includes a c-axis aligned crystalline oxide semiconductor (CAAC-OS), a polycrystalline structure, a microcrystalline structure, or an amorphous structure, for example. Among the non-single crystal structure, the amorphous structure has the highest density of defect states, whereas CAAC-OS has the lowest density of defect states.

<<Insulating Film Functioning as Protective Insulating Film of Transistor>>

The insulating films 114 and 116 each have a function of supplying oxygen to the oxide semiconductor film 108. The insulating film 118 has a function as a protective insulating film of the transistor 100. The insulating films 114 and 116 include oxygen. Furthermore, the insulating film 114 is an insulating film that can transmit oxygen. The insulating film 114 also functions as a film that relieves damage to the oxide semiconductor film 108 at the time of forming the insulating film 116 in a later step.

A silicon oxide film, a silicon oxynitride film, or the like with a thickness greater than or equal to 5 nm and less than or equal to 150 nm, preferably greater than or equal to 5 nm and less than or equal to 50 nm can be used as the insulating film 114.

In addition, it is preferable that the number of defects in the insulating film 114 be small and typically, the spin density corresponding to a signal that appears at g=2.001 due to a dangling bond of silicon be lower than or equal to $3\times10^{17}$ spins/cm$^3$ by electron spin resonance (ESR) measurement. This is because if the density of defects in the insulating film 114 is high, oxygen is bonded to the defects and the amount of oxygen that transmits the insulating film 114 is decreased.

Note that all oxygen entering the insulating film 114 from the outside does not move to the outside of the insulating film 114 and some oxygen remains in the insulating film 114. Furthermore, movement of oxygen occurs in the insulating film 114 in some cases in such a manner that oxygen enters the insulating film 114 and oxygen included in the insulating film 114 moves to the outside of the insulating film 114. When an oxide insulating film that can transmit oxygen is formed as the insulating film 114, oxygen released from the insulating film 116 provided over the insulating film 114 can be moved to the oxide semiconductor film 108 through the insulating film 114.

Note that the insulating film 114 can be formed using an oxide insulating film having a low density of states due to nitrogen oxide. Note that the density of states due to nitrogen oxide can be formed between the energy of the valence band maximum ($E_{v\_os}$) and the energy of the conduction band minimum ($E_{c\_os}$) of the oxide semiconductor film. A silicon oxynitride film that releases less nitrogen oxide, an aluminum oxynitride film that releases less nitrogen oxide, and the like can be used as the above oxide insulating film.

Note that a silicon oxynitride film that releases less nitrogen oxide is a film of which the amount of released ammonia is larger than the amount of released nitrogen oxide in thermal desorption spectroscopy (TDS) analysis; the amount of released ammonia is typically greater than or equal to $1\times10^{18}$/cm$^3$ and less than or equal to $5\times10^{19}$/cm$^3$. Note that the amount of released ammonia is the amount of ammonia released by heat treatment with which the surface temperature of a film becomes higher than or equal to 50° C. and lower than or equal to 650° C., preferably higher than or equal to 50° C. and lower than or equal to 550° C.

Nitrogen oxide ($NO_x$; x is greater than 0 and less than or equal to 2, preferably greater than or equal to 1 and less than or equal to 2), typically $NO_2$ or NO, forms levels in the insulating film 114, for example. The level is positioned in the energy gap of the oxide semiconductor film 108. Therefore, when nitrogen oxide is diffused to the interface between the insulating film 114 and the oxide semiconductor film 108, an electron is in some cases trapped by the level on the insulating film 114 side. As a result, the trapped electron remains in the vicinity of the interface between the insulating film 114 and the oxide semiconductor film 108; thus, the threshold voltage of the transistor is shifted in the positive direction.

Nitrogen oxide reacts with ammonia and oxygen in heat treatment. Since nitrogen oxide included in the insulating film 114 reacts with ammonia included in the insulating film 116 in heat treatment, nitrogen oxide included in the insulating film 114 is reduced. Therefore, an electron is hardly trapped at the vicinity of the interface between the insulating film 114 and the oxide semiconductor film 108.

By using such an oxide insulating film, the insulating film 114 can reduce the shift in the threshold voltage of the transistor, which leads to a smaller change in the electrical characteristics of the transistor.

Note that in an ESR spectrum at 100 K or lower of the insulating film 114, by heat treatment of a manufacturing process of the transistor, typically heat treatment at a temperature higher than or equal to 300° C. and lower than 350° C., a first signal that appears at a g-factor of greater than or equal to 2.037 and less than or equal to 2.039, a second signal that appears at a g-factor of greater than or equal to 2.001 and less than or equal to 2.003, and a third signal that appears at a g-factor of greater than or equal to 1.964 and less than or equal to 1.966 are observed. The split width of the first and second signals and the split width of the second and third signals that are obtained by ESR measurement using an X-band are each approximately 5 mT. The sum of the spin densities of the first signal that appears at a g-factor of greater than or equal to 2.037 and less than or equal to 2.039, the second signal that appears at a g-factor of greater than or equal to 2.001 and less than or equal to 2.003, and the third signal that appears at a g-factor of greater than or equal to 1.964 and less than or equal to 1.966 is lower than $1\times10^{18}$ spins/cm$^3$, typically higher than or equal to $1\times10^{17}$ spins/cm$^3$ and lower than $1\times10^{18}$ spins/cm$^3$.

In the ESR spectrum at 100 K or lower, the first signal that appears at a g-factor of greater than or equal to 2.037 and less than or equal to 2.039, the second signal that appears at a g-factor of greater than or equal to 2.001 and less than or equal to 2.003, and the third signal that appears at a g-factor of greater than or equal to 1.964 and less than or equal to 1.966 correspond to signals attributed to nitrogen oxide ($NO_x$; x is greater than 0 and less than or equal to 2, preferably greater than or equal to 1 and less than or equal to 2). Typical examples of nitrogen oxide include nitrogen monoxide and nitrogen dioxide. In other words, the lower the total spin density of the first signal that appears at a g-factor of greater than or equal to 2.037 and less than or equal to 2.039, the second signal that appears at a g-factor of greater than or equal to 2.001 and less than or equal to 2.003, and the third signal that appears at a g-factor of greater than or equal to 1.964 and less than or equal to 1.966 is, the lower the content of nitrogen oxide in the oxide insulating film is.

The concentration of nitrogen of the above oxide insulating film measured by SIMS is lower than or equal to $6\times10^{20}$ atoms/cm$^3$.

The above oxide insulating film is formed by a PECVD method at a film surface temperature higher than or equal to 220° C. and lower than or equal to 350° C. using silane and dinitrogen monoxide, whereby a dense and hard film can be formed.

The insulating film 116 is formed using an oxide insulating film that contains oxygen in excess of that in the stoichiometric composition. Part of oxygen is released by heating from the oxide insulating film including oxygen in excess of that in the stoichiometric composition. The oxide insulating film including oxygen in excess of that in the stoichiometric composition is an oxide insulating film of which the amount of released oxygen converted into oxygen atoms is greater than or equal to $1.0\times10^{19}$ atoms/cm$^3$, preferably greater than or equal to $3.0\times10^{20}$ atoms/cm$^3$ in TDS analysis. Note that the temperature of the film surface in the TDS analysis is preferably higher than or equal to 100° C. and lower than or equal to 700° C., or higher than or equal to 100° C. and lower than or equal to 500° C.

A silicon oxide film, a silicon oxynitride film, or the like with a thickness greater than or equal to 30 nm and less than or equal to 500 nm, preferably greater than or equal to 50 nm and less than or equal to 400 nm can be used as the insulating film 116.

It is preferable that the number of defects in the insulating film 116 be small, and typically the spin density corresponding to a signal that appears at g=2.001 due to a dangling bond of silicon be lower than $1.5\times10^{18}$ spins/cm$^3$, preferably lower than or equal to $1\times10^{18}$ spins/cm$^3$ by ESR measurement. Note that the insulating film 116 is provided more apart from the oxide semiconductor film 108 than the insulating film 114 is; thus, the insulating film 116 may have higher density of defects than the insulating film 114.

Furthermore, the insulating films 114 and 116 can be formed using insulating films formed of the same kinds of materials; thus, a boundary between the insulating films 114 and 116 cannot be clearly observed in some cases. Thus, in this embodiment, the boundary between the insulating films 114 and 116 is shown by a dashed line. Although a two-layer structure of the insulating films 114 and 116 is described in this embodiment, the present invention is not limited to this. For example, a single-layer structure of the insulating film 114 may be employed.

The insulating film 118 includes nitrogen. Alternatively, the insulating film 118 includes nitrogen and silicon. The insulating film 118 has a function of blocking oxygen, hydrogen, water, alkali metal, alkaline earth metal, or the like. It is possible to prevent outward diffusion of oxygen from the oxide semiconductor film 108, outward diffusion of oxygen included in the insulating films 114 and 116, and entry of hydrogen, water, or the like into the oxide semiconductor film 108 from the outside by providing the insulating film 118. A nitride insulating film, for example, can be used as the insulating film 118. The nitride insulating film is formed using silicon nitride, silicon nitride oxide, aluminum nitride, aluminum nitride oxide, or the like. Note that instead of the nitride insulating film having a blocking effect against oxygen, hydrogen, water, alkali metal, alkaline earth metal, and the like, an oxide insulating film having a blocking effect against oxygen, hydrogen, water, and the like may be provided. As the oxide insulating film having a blocking effect against oxygen, hydrogen, water, and the like, an aluminum oxide film, an aluminum oxynitride film, a gallium oxide film, a gallium oxynitride film, an yttrium oxide film, an yttrium oxynitride film, a hafnium oxide film, a hafnium oxynitride film, and the like can be given.

Although the variety of films such as the conductive films, the insulating films, and the oxide semiconductor films that are described above can be formed by a sputtering method or a PECVD method, such films may be formed by another method, e.g., a thermal chemical vapor deposition (CVD) method. Examples of the thermal CVD method include a metal organic chemical vapor deposition (MOCVD) method and an atomic layer deposition (ALD) method.

A thermal CVD method has an advantage that no defect due to plasma damage is generated since it does not utilize plasma for forming a film.

Deposition by a thermal CVD method may be performed in such a manner that a source gas and an oxidizer are supplied to the chamber at a time so that the pressure in a chamber is set to an atmospheric pressure or a reduced pressure, and react with each other in the vicinity of the substrate or over the substrate.

Deposition by an ALD method may be performed in such a manner that the pressure in a chamber is set to an atmospheric pressure or a reduced pressure, source gases for reaction are sequentially introduced into the chamber, and then the sequence of the gas introduction is repeated. For example, two or more kinds of source gases are sequentially supplied to the chamber by switching respective switching valves (also referred to as high-speed valves). For example, a first source gas is introduced, an inert gas (e.g., argon or nitrogen) or the like is introduced at the same time as or after the introduction of the first gas so that the source gases are not mixed, and then a second source gas is introduced. Note that in the case where the first source gas and the inert gas are introduced at a time, the inert gas serves as a carrier gas, and the inert gas may also be introduced at the same time as the introduction of the second source gas. Alternatively, the first source gas may be exhausted by vacuum evacuation instead of the introduction of the inert gas, and then the second source gas may be introduced. The first source gas is adsorbed on the surface of the substrate to form a first layer; then the second source gas is introduced to react with the first layer; as a result, a second layer is stacked over the first layer, so that a thin film is formed. The sequence of the gas introduction is repeated plural times until a desired thickness is obtained, whereby a thin film with excellent step coverage can be formed. The thickness of the thin film can be adjusted by the number of repetition times of the sequence of the gas introduction; therefore, an ALD method makes it possible to accurately adjust a thickness and thus is suitable for manufacturing a minute FET.

The variety of films such as the conductive films, the insulating films, the oxide semiconductor films, and the metal oxide films in this embodiment can be formed by a thermal CVD method such as an MOCVD method or an ALD method. For example, in the case where an In—Ga—Zn—O film is formed, trimethylindium, trimethylgallium, and dimethylzinc are used. Note that the chemical formula of trimethylindium is $In(CH_3)_3$. The chemical formula of trimethylgallium is $Ga(CH_3)_3$. The chemical formula of dimethylzinc is $Zn(CH_3)_2$. Without limitation to the above combination, triethylgallium (chemical formula: $Ga(C_2H_5)_3$) can be used instead of trimethylgallium and diethylzinc (chemical formula: $Zn(C_2H_5)_2$) can be used instead of dimethylzinc.

For example, in the case where a hafnium oxide film is formed by a deposition apparatus using an ALD method, two kinds of gases, that is, ozone ($O_3$) as an oxidizer and a source gas that is obtained by vaporizing liquid containing a solvent and a hafnium precursor compound (e.g., a hafnium alkoxide or a hafnium amide such as tetrakis(dimethylamide) hafnium (TDMAH)) are used. Note that the chemical formula of tetrakis(dimethylamide)hafnium is $Hf[N(CH_3)_2]_4$. Examples of another material liquid include tetrakis(ethylmethylamide)hafnium.

For example, in the case where an aluminum oxide film is formed by a deposition apparatus using an ALD method, two kinds of gases, e.g., $H_2O$ as an oxidizer and a source gas that is obtained by vaporizing liquid containing a solvent and an aluminum precursor compound (e.g., trimethylaluminum (TMA)) are used. Note that the chemical formula of trimethylaluminum is $Al(CH_3)_3$. Examples of another material liquid include tris(dimethylamide)aluminum, triisobutylaluminum, and aluminum tris(2,2,6,6-tetramethyl-3,5-heptanedionate).

For example, in the case where a silicon oxide film is formed by a deposition apparatus using an ALD method, hexachlorodisilane is adsorbed on a surface where a film is to be formed, chlorine included in the adsorbate is removed, and radicals of an oxidizing gas (e.g., $O_2$ or dinitrogen monoxide) are supplied to react with the adsorbate.

For example, in the case where a tungsten film is formed using a deposition apparatus using an ALD method, a $WF_6$ gas and a $B_2H_6$ gas are sequentially introduced plural times to form an initial tungsten film, and then a $WF_6$ gas and an $H_2$ gas are used, so that a tungsten film is formed. Note that a $SiH_4$ gas may be used instead of a $B_2H_6$ gas.

For example, in the case where an oxide semiconductor film, e.g., an In—Ga—Zn—O film is formed using a deposition apparatus using an ALD method, an $In(CH_3)_3$ gas and an $O_3$ gas are sequentially introduced plural times to form an InO layer, a GaO layer is formed using a $Ga(CH_3)_3$ gas and an $O_3$ gas, and then a ZnO layer is formed using a $Zn(CH_3)_2$ gas and an $O_3$ gas. Note that the order of these layers is not limited to this example. A mixed compound layer such as an In—Ga—O layer, an In—Zn—O layer, or a Ga—Zn—O layer may be formed by mixing these gases. Note that although an $H_2O$ gas that is obtained by bubbling water with an inert gas such as Ar may be used instead of an $O_3$ gas, it is preferable to use an $O_3$ gas, which does not contain H. Furthermore, instead of an $In(CH_3)_3$ gas, an $In(C_2H_5)_3$ gas may be used. Instead of a $Ga(CH_3)_3$ gas, a $Ga(C_2H_5)_3$ gas may be used. Furthermore, a $Zn(CH_3)_2$ gas may be used.

Note that this embodiment can be combined with any of the other embodiments in this specification as appropriate.

Embodiment 4

In this embodiment, the structure of a transistor that can be used in the input/output device of one embodiment of the present invention is described with reference to FIGS. 18A to 18C.

Structure Example of Semiconductor Device

Figure 18A:
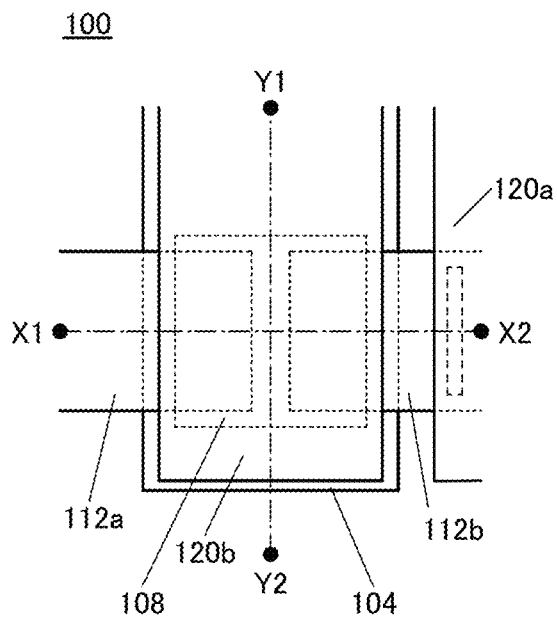
FIGS. 18A to 18C are a plan view and cross-sectional views illustrating a structure of a transistor of an embodiment.
Figure 18B:
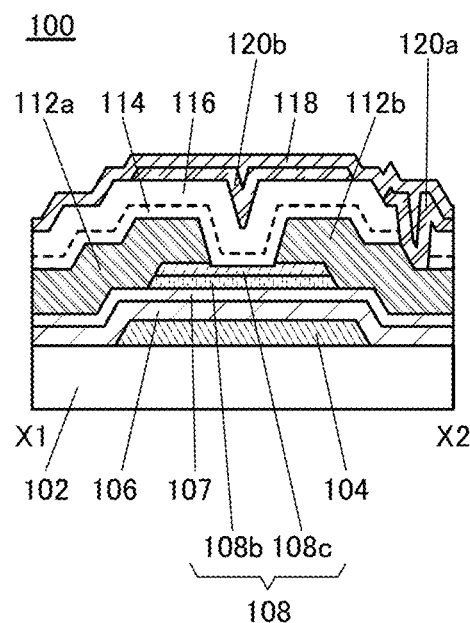
Figure 18C:
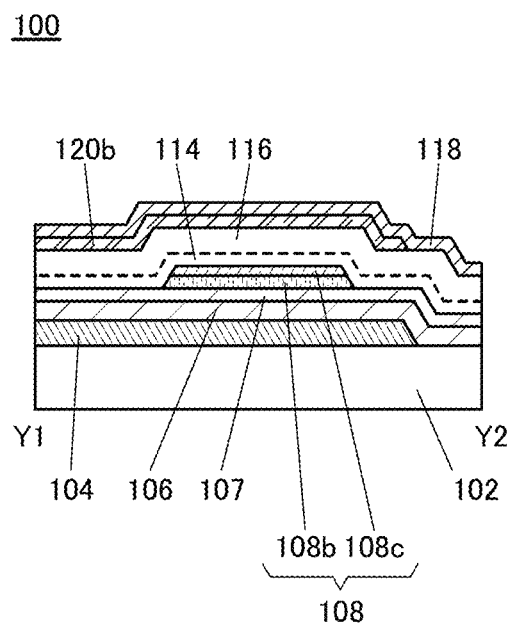

FIG. 18A is a top view of the transistor 100. FIG. 18B is a cross-sectional view taken along line X1-X2 in FIG. 18A. FIG. 18C is a cross-sectional view taken along line Y1-Y2 in FIG. 18A. Note that in FIG. 18A, some components of the transistor 100 (e.g., an insulating film serving as a gate insulating film) are not illustrated to avoid complexity. Furthermore, the direction of the line X1-X2 may be called a channel length direction, and the direction of the line Y1-Y2 may be called a channel width direction. As in FIG. 18A, some components are not illustrated in some cases in top views of transistors described below.

The transistor 100 can be used for the input/output device described in Embodiment 1.

For example, when the transistor 100 is used as the transistor M or the transistor MD, the substrate 102, the conductive film 104, a stacked film of the insulating film 106 and the insulating film 107, the oxide semiconductor film 108, the conductive film 112a, the conductive film 112b, a stacked film of the insulating film 114 and the insulating film 116, the insulating film 118, and a conductive film 120b can be referred to as the insulating film 501C, the conductive film 504, the insulating film 506, the semiconductor film 508, the conductive film 512A, the conductive film 512B, the insulating film 516, the insulating film 518, and the conductive film 524, respectively.

The transistor 100 includes the conductive film 104 functioning as a first gate electrode over the substrate 102, the insulating film 106 over the substrate 102 and the conductive film 104, the insulating film 107 over the insulating film 106, the oxide semiconductor film 108 over the insulating film 107, and the conductive films 112a and 112b functioning as source and drain electrodes electrically connected to the oxide semiconductor film 108, the insulating films 114 and 116 over the oxide semiconductor film 108 and the conductive films 112a and 112b, a conductive film 120a that is over the insulating film 116 and electrically connected to the conductive film 112b, the conductive film 120b over the insulating film 116, and the insulating film 118 over the insulating film 116 and the conductive films 120a and 120b.

The insulating films 106 and 107 function as a first gate insulating film of the transistor 100. The insulating films 114 and 116 function as a second gate insulating film of the transistor 100. The insulating film 118 functions as a protective insulating film of the transistor 100.

The conductive film 120b can be used as a second gate electrode of the transistor 100.

In the case where the transistor 100 is used in a display portion of the input/output device, the conductive film 120a can be used as an electrode of a display element, or the like.

The oxide semiconductor film 108 includes the oxide semiconductor film 108b (on the conductive film 104 side) that functions as a first gate electrode, and an oxide semiconductor film 108c over the oxide semiconductor film 108b. The oxide semiconductor films 108b and 108c contain In, M (M is Al, Ga, Y, or Sn), and Zn.

The oxide semiconductor film 108b preferably includes a region in which the atomic proportion of In is larger than the atomic proportion of M, for example. The oxide semiconductor film 108c preferably includes a region in which the atomic proportion of In is smaller than that in the oxide semiconductor film 108b.

The oxide semiconductor film 108b including the region in which the atomic proportion of In is larger than that of M can increase the field-effect mobility (also simply referred to as mobility or μFE) of the transistor 100. Specifically, the field-effect mobility of the transistor 100 can exceed 10 cm$^2$/Vs, preferably exceed 30 cm$^2$/Vs.

For example, the use of the transistor with high field-effect mobility for a gate driver that generates a gate signal (specifically, a demultiplexer connected to an output terminal of a shift register included in a gate driver) allows a semiconductor device or a display device to have a narrow frame.

On the other hand, the oxide semiconductor film 108b including the region in which the atomic proportion of In is larger than that of M makes it easier to change electrical characteristics of the transistor 100 in light irradiation. However, in the semiconductor device of one embodiment of the present invention, the oxide semiconductor film 108c is formed over the oxide semiconductor film 108b. Furthermore, the oxide semiconductor film 108c including the region in which the atomic proportion of In is smaller than that in the oxide semiconductor film 108b has larger Eg than the oxide semiconductor film 108b. For this reason, the oxide semiconductor film 108 that is a layered structure of the oxide semiconductor film 108b and the oxide semiconductor film 108c has high resistance to a negative bias stress test with light irradiation.

Impurities such as hydrogen or moisture entering the channel region of the oxide semiconductor film 108, particularly the oxide semiconductor film 108b adversely affect the transistor characteristics and therefore cause a problem. Moreover, it is preferable that the amount of impurities such as hydrogen or moisture in the channel region of the oxide semiconductor film 108b be as small as possible. Furthermore, oxygen vacancies formed in the channel region in the oxide semiconductor film 108b adversely affect the transistor characteristics and therefore cause a problem. For example, oxygen vacancies formed in the channel region in the oxide semiconductor film 108b are bonded to hydrogen to serve as a carrier supply source. The carrier supply source generated in the channel region in the oxide semiconductor film 108b causes a change in the electrical characteristics, typically, shift in the threshold voltage, of the transistor 100 including the oxide semiconductor film 108b. Therefore, it is preferable that the amount of oxygen vacancies in the channel region of the oxide semiconductor film 108b be as small as possible.

In view of this, one embodiment of the present invention is a structure in which insulating films in contact with the oxide semiconductor film 108, specifically the insulating film 107 formed under the oxide semiconductor film 108 and the insulating films 114 and 116 formed over the oxide semiconductor film 108 include excess oxygen. Oxygen or excess oxygen is transferred from the insulating film 107 and the insulating films 114 and 116 to the oxide semiconductor film 108, whereby the oxygen vacancies in the oxide semiconductor film can be reduced. As a result, a change in electrical characteristics of the transistor 100, particularly a change in electrical characteristics of the transistor 100 due to light irradiation, can be reduced.

In one embodiment of the present invention, a manufacturing method is used in which the number of manufacturing steps is not increased or an increase in the number of manufacturing steps is extremely small, because the insulating film 107 and the insulating films 114 and 116 are made to contain excess oxygen. Thus, the transistors 100 can be manufactured with high yield.

Specifically, in a step of forming the oxide semiconductor film 108b, the oxide semiconductor film 108b is formed by a sputtering method in an atmosphere containing an oxygen gas, whereby oxygen or excess oxygen is added to the insulating film 107 over which the oxide semiconductor film 108b is formed.

Furthermore, in a step of forming the conductive films 120a and 120b, the conductive films 120a and 120b are formed by a sputtering method in an atmosphere containing an oxygen gas, whereby oxygen or excess oxygen is added to the insulating film 116 over which the conductive films 120a and 120b are formed. Note that in some cases, oxygen or excess oxygen is added also to the insulating film 114 and the oxide semiconductor film 108 under the insulating film 116 when oxygen or excess oxygen is added to the insulating film 116.

<Oxide Conductor>

Next, an oxide conductor is described. In a step of forming the conductive films 120a and 120b, the conductive films 120a and 120b serve as a protective film for suppressing release of oxygen from the insulating films 114 and 116. The conductive films 120a and 120b serve as semiconductors before a step of forming the insulating film 118 and serve as conductors after the step of forming the insulating film 118.

To allow the conductive films 120a and 120b to serve as conductors, an oxygen vacancy is formed in the conductive films 120a and 120b and hydrogen is added from the insulating film 118 to the oxygen vacancy, whereby a donor level is formed in the vicinity of the conduction band. As a result, the conductivity of each of the conductive films 120a and 120b is increased, so that the conductive films 120a and 120b become conductors. The conductive films 120a and 120b having become conductors can each be referred to as an oxide conductor. Oxide semiconductors generally have a visible light transmitting property because of their large energy gap. An oxide conductor is an oxide semiconductor having a donor level in the vicinity of the conduction band. Therefore, the influence of absorption due to the donor level is small in an oxide conductor, and an oxide conductor has a visible light transmitting property comparable to that of an oxide semiconductor.

<Components of Semiconductor Device>

Components of the semiconductor device of this embodiment are described below in detail.

As materials described below, materials described in Embodiment 2 can be used.

The material that can be used for the substrate 102 described in Embodiment 2 can be used for the substrate 102 in this embodiment. Furthermore, the materials that can be used for the insulating films 106 and 107 described in Embodiment 2 can be used for the insulating films 106 and 107 in this embodiment.

In addition, the materials that can be used for the conductive films functioning as the gate electrode, the source electrode, and the drain electrode described in Embodiment 2 can be used for the conductive films functioning as the first gate electrode, the source electrode, and the drain electrode in this embodiment.

<<<Oxide Semiconductor Film>>>

The oxide semiconductor film 108 can be formed using the materials described above.

In the case where the oxide semiconductor film 108b comprises In-M-Zn oxide, it is preferable that the atomic ratio of metal elements of a sputtering target used for forming the In-M-Zn oxide satisfy In>M. The atomic ratio between metal elements in such a sputtering target is, for example, In:M:Zn=2:1:3, In:M:Zn=3:1:2, or In:M:Zn=4:2:4.1.

In the case where the oxide semiconductor film 108c comprises In-M-Zn oxide, it is preferable that the atomic ratio of metal elements of a sputtering target used for forming a film of the In-M-Zn oxide satisfy In≤M. The atomic ratio of metal elements in such a sputtering target is, for example, In:M:Zn=1:1:1, In:M:Zn=1:1:1.2, In:M:Zn=1:3:2, In:M:Zn=1:3:4, In:M:Zn=1:3:6, or In:M:Zn=1:4:5.

In the case where the oxide semiconductor films 108b and 108c comprise In-M-Zn oxide, it is preferable to use a target including polycrystalline In-M-Zn oxide as the sputtering target. The use of the target including polycrystalline In-M-Zn oxide facilitates formation of the oxide semiconductor films 108b and 108c having crystallinity. Note that the atomic ratios of metal elements in each of the formed oxide semiconductor films 108b and 108c vary from the above atomic ratio of metal elements of the sputtering target within a range of ±40% as an error. For example, when a sputtering target of the oxide semiconductor film 108b with an atomic ratio of In to Ga and Zn of 4:2:4.1 is used, the atomic ratio of In to Ga and Zn in the oxide semiconductor film 108b may be 4:2:3 or in the vicinity of 4:2:3.

The energy gap of the oxide semiconductor film 108 is 2 eV or more, preferably 2.5 eV or more, further preferably 3 eV or more. The use of an oxide semiconductor having a wide energy gap can reduce off-state current of the transistor 100. In particular, an oxide semiconductor film having an energy gap more than or equal to 2 eV, preferably more than or equal to 2 eV and less than or equal to 3.0 eV is preferably used as the oxide semiconductor film 108b, and an oxide semiconductor film having an energy gap more than or equal to 2.5 eV and less than or equal to 3.5 eV is preferably used as the oxide semiconductor film 108c. Furthermore, the oxide semiconductor film 108c preferably has a higher energy gap than the oxide semiconductor film 108b.

Each thickness of the oxide semiconductor film 108b and the oxide semiconductor film 108c is more than or equal to 3 nm and less than or equal to 200 nm, preferably more than or equal to 3 nm and less than or equal to 100 nm, further preferably more than or equal to 3 nm and less than or equal to 50 nm.

An oxide semiconductor film with low carrier density is used as the oxide semiconductor film 108c. For example, the carrier density of the oxide semiconductor film 108c is lower than or equal to $1\times10^{17}/cm^3$, preferably lower than or equal to $1\times10^{15}/cm^3$, further preferably lower than or equal to $1\times10^{13}/cm^3$, still further preferably lower than or equal to $1\times10^{11}/cm^3$.

Note that, without limitation to the compositions and materials described above, a material with an appropriate composition may be used depending on required semiconductor characteristics and electrical characteristics (e.g., field-effect mobility and threshold voltage) of a transistor. Furthermore, in order to obtain required semiconductor characteristics of a transistor, it is preferable that the carrier density, the impurity concentration, the defect density, the atomic ratio of a metal element to oxygen, the interatomic distance, the density, and the like of the oxide semiconductor film 108b and the oxide semiconductor film 108c be set to be appropriate.

Note that it is preferable to use, as the oxide semiconductor film 108b and the oxide semiconductor film 108c, an oxide semiconductor film in which the impurity concentration is low and the density of defect states is low, in which case the transistor can have more excellent electrical characteristics. Here, the state in which the impurity concentration is low and the density of defect states is low (the amount of oxygen vacancy is small) is referred to as "highly purified intrinsic" or "substantially highly purified intrinsic". A highly purified intrinsic or substantially highly purified intrinsic oxide semiconductor film has few carrier generation sources, and thus can have a low carrier density. Thus, a transistor in which a channel region is formed in the oxide semiconductor film rarely has a negative threshold voltage (is rarely normally on). A highly purified intrinsic or substantially highly purified intrinsic oxide semiconductor film has a low density of defect states and accordingly has a low density of trap states in some cases. Furthermore, the highly purified intrinsic or substantially highly purified intrinsic oxide semiconductor film has an extremely low off-state current; even when an element has a channel width of $1\times10^6$ μm and a channel length L of 10 μm, the off-state current can be less than or equal to the measurement limit of a semiconductor parameter analyzer, that is, less than or equal to $1\times10^{-13}$ A, at a voltage (drain voltage) between a source electrode and a drain electrode of from 1 V to 10 V.

Accordingly, the transistor in which the channel region is formed in the highly purified intrinsic or substantially highly purified intrinsic oxide semiconductor film can have a small change in electrical characteristics and high reliability. Charges trapped by the trap states in the oxide semiconductor film take a long time to be released and may behave like fixed charges. Thus, the transistor whose channel region is formed in the oxide semiconductor film having a high density of trap states has unstable electrical characteristics in some cases. As examples of the impurities, hydrogen, nitrogen, alkali metal, and alkaline earth metal are given.

Hydrogen included in the oxide semiconductor film reacts with oxygen bonded to a metal atom to be water, and also causes oxygen vacancy in a lattice from which oxygen is released (or a portion from which oxygen is released). Due to entry of hydrogen into the oxygen vacancy, an electron serving as a carrier is generated in some cases. Furthermore, in some cases, bonding of part of hydrogen to oxygen bonded to a metal atom causes generation of an electron serving as a carrier. Thus, a transistor including an oxide semiconductor film that contains hydrogen is likely to be normally on. Accordingly, it is preferable that hydrogen be reduced as much as possible in the oxide semiconductor film 108. Specifically, in the oxide semiconductor film 108, the concentration of hydrogen that is measured by SIMS is lower than or equal to $2\times10^{20}$ atoms/cm$^3$, preferably lower than or equal to $5\times10^{19}$ atoms/cm$^3$, further preferably lower than or equal to $1\times10^{19}$ atoms/cm$^3$, further preferably lower than or equal to $5\times10^{18}$ atoms/cm$^3$, further preferably lower than or equal to $1\times10^{18}$ atoms/cm$^3$, further preferably lower than or equal to $5\times10^{17}$ atoms/cm$^3$, and further preferably lower than or equal to $1\times10^{16}$ atoms/cm$^3$.

The oxide semiconductor film 108b preferably includes a region in which hydrogen concentration is smaller than that in the oxide semiconductor film 108c. A semiconductor device including the oxide semiconductor film 108b having the region in which hydrogen concentration is smaller than that in the oxide semiconductor film 108c can be increased in reliability.

When silicon or carbon that is one of elements belonging to Group 14 is included in the oxide semiconductor film 108b, oxygen vacancy is increased in the oxide semiconductor film 108b, and the oxide semiconductor film 108b becomes an n-type film. Thus, the concentration of silicon or carbon (the concentration is measured by SIMS) in the oxide semiconductor film 108b or the concentration of silicon or carbon (the concentration is measured by SIMS) in the vicinity of an interface with the oxide semiconductor film 108b is set to be lower than or equal to $2\times10^{18}$ atoms/cm$^3$, preferably lower than or equal to $2\times10^{17}$ atoms/cm$^3$.

In addition, the concentration of alkali metal or alkaline earth metal of the oxide semiconductor film 108b, which is measured by SIMS, is lower than or equal to $1\times10^{18}$ atoms/cm$^3$, preferably lower than or equal to $2\times10^{16}$ atoms/cm$^3$. Alkali metal and alkaline earth metal might generate carriers when bonded to an oxide semiconductor, in which case the off-state current of the transistor might be increased. Therefore, it is preferable to reduce the concentration of alkali metal or alkaline earth metal of the oxide semiconductor film 108b.

Furthermore, when including nitrogen, the oxide semiconductor film 108b easily becomes n-type by generation of electrons serving as carriers and an increase of carrier density. Thus, a transistor including an oxide semiconductor film that contains nitrogen is likely to have normally-on characteristics. For this reason, nitrogen in the oxide semiconductor film is preferably reduced as much as possible; the concentration of nitrogen that is measured by SIMS is preferably set to be, for example, lower than or equal to $5\times10^{18}$ atoms/cm$^3$.

The oxide semiconductor film 108b and the oxide semiconductor film 108c may have a non-single-crystal structure. The non-single crystal structure includes CAAC-OS, a polycrystalline structure, a microcrystalline structure, or an amorphous structure, for example. Among the non-single crystal structure, the amorphous structure has the highest density of defect states, whereas CAAC-OS has the lowest density of defect states.

<<Insulating Films Functioning as Second Gate Insulating Film>>

The insulating films 114 and 116 function as a second gate insulating film of the transistor 100. In addition, the insulating films 114 and 116 each have a function of supplying oxygen to the oxide semiconductor film 108. That is, the insulating films 114 and 116 contain oxygen. Furthermore, the insulating film 114 is an insulating film that can transmit oxygen. Note that the insulating film 114 also functions as a film that relieves damage to the oxide semiconductor film 108 at the time of forming the insulating film 116 in a later step.

For example, the insulating films 114 and 116 described in Embodiment 2 can be used as the insulating films 114 and 116 in this embodiment.

<<Oxide Semiconductor Film Functioning as Conductive Film and Oxide Semiconductor Film Functioning as Second Gate Electrode>>

The material of the oxide semiconductor film 108 described above can be used for the conductive film 120a functioning as a conductive film and the conductive film 120b functioning as the second gate electrode.

That is, the conductive film 120a functioning as a conductive film and the conductive film 120b functioning as a second gate electrode contain a metal element that is the same as that contained in the oxide semiconductor film 108 (the oxide semiconductor film 108b and the oxide semiconductor film 108c). For example, the conductive film 120b functioning as a second gate electrode and the oxide semiconductor film 108 (the oxide semiconductor film 108b and the oxide semiconductor film 108c) contain the same metal element; thus, the manufacturing cost can be reduced.

For example, in the case where the conductive film 120a functioning as a conductive film and the conductive film 120b functioning as a second gate electrode each comprise In-M-Zn oxide, the atomic ratio of metal elements in a sputtering target used for forming the In-M-Zn oxide preferably satisfies In≥M. The atomic ratio of metal elements in such a sputtering target is In:M:Zn=2:1:3, In:M:Zn=3:1:2, In:M:Zn=4:2:4.1, or the like.

The conductive film 120a functioning as a conductive film and the conductive film 120b functioning as a second gate electrode can each have a single-layer structure or a stacked-layer structure of two or more layers. Note that in the case where the conductive film 120a and the conductive film 120b each have a stacked-layer structure, the composition of the sputtering target is not limited to that described above.

<<Insulating Film Functioning as Protective Insulating Film of Transistor>>

The insulating film 118 serves as a protective insulating film of the transistor 100.

The insulating film 118 includes one or both of hydrogen and nitrogen. Alternatively, the insulating film 118 includes nitrogen and silicon. The insulating film 118 has a function of blocking oxygen, hydrogen, water, alkali metal, alkaline earth metal, or the like. It is possible to prevent outward diffusion of oxygen from the oxide semiconductor film 108, outward diffusion of oxygen included in the insulating films 114 and 116, and entry of hydrogen, water, or the like into the oxide semiconductor film 108 from the outside by providing the insulating film 118.

The insulating film 118 has a function of supplying one or both of hydrogen and nitrogen to the conductive film 120a functioning as a conductive film and the conductive film 120b functioning as a second gate electrode. The insulating film 118 preferably includes hydrogen and has a function of supplying the hydrogen to the conductive films 120a and 120b. The conductive films 120a and 120b supplied with hydrogen from the insulating film 118 function as conductors.

A nitride insulating film, for example, can be used as the insulating film 118. The nitride insulating film is formed using silicon nitride, silicon nitride oxide, aluminum nitride, aluminum nitride oxide, or the like.

Although the variety of films such as the conductive films, the insulating films, and the oxide semiconductor films that are described above can be formed by a sputtering method or a PECVD method, such films may be formed by another method, e.g., a thermal CVD method. Examples of the thermal CVD method include an MOCVD method and an ALD method. Specifically, the methods described in Embodiment 2 can be used.

Note that this embodiment can be combined with any of the other embodiments in this specification as appropriate.

Embodiment 5

In this embodiment, structures of a transistor which can be used in the input/output device of one embodiment of the present invention will be described with reference to FIGS. 19A and 19B and FIGS. 20A and 20B. Specifically, a semiconductor film described in this embodiment can be used in the transistor which can be used as the switch SW2, the transistor M, or the like.

Figure 19A:
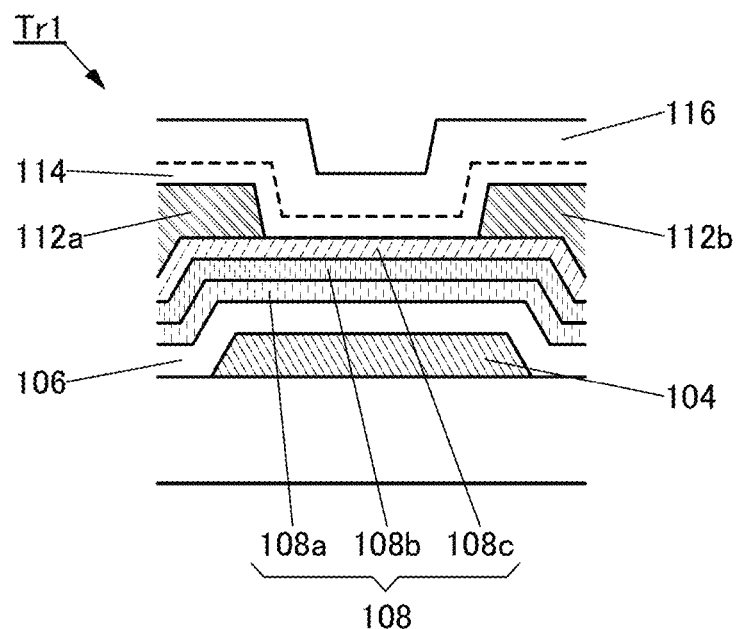
FIGS. 19A and 19B illustrate cross-sections of a semiconductor device.
Figure 19B:
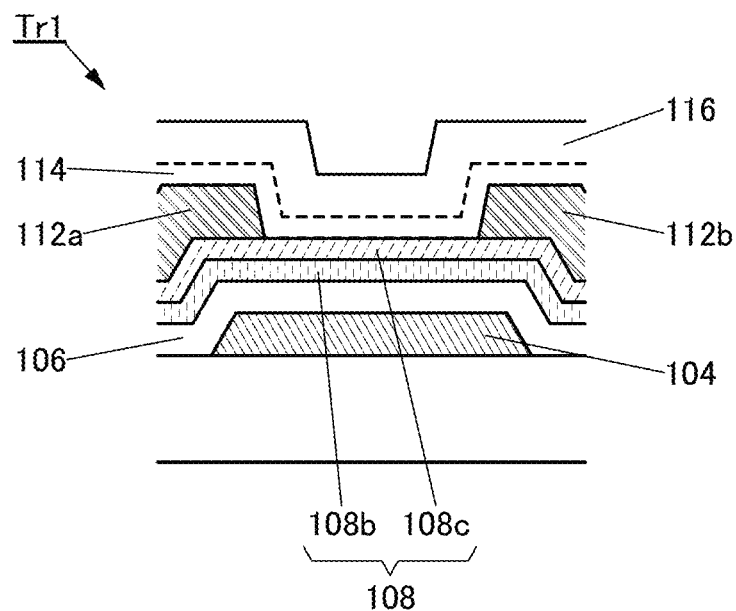

FIGS. 19A and 19B are cross-sectional views in the channel length (L) direction of the transistor which can be used in the input/output device of one embodiment of the present invention.

FIG. 19A is a cross-sectional view in the channel length (L) direction of the transistor including an oxide semiconductor film in which three films are stacked. FIG. 19B is a cross-sectional view in the channel length (L) direction of the transistor including an oxide semiconductor film in which two films are stacked.

Figure 20A:
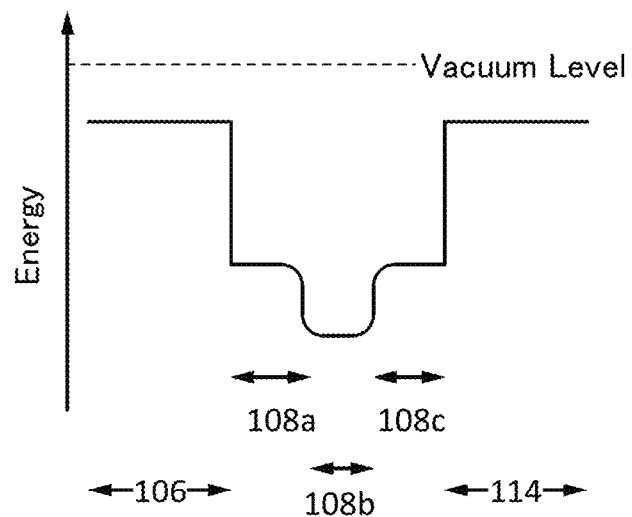
FIGS. 20A and 20B illustrate energy bands.
Figure 20B:
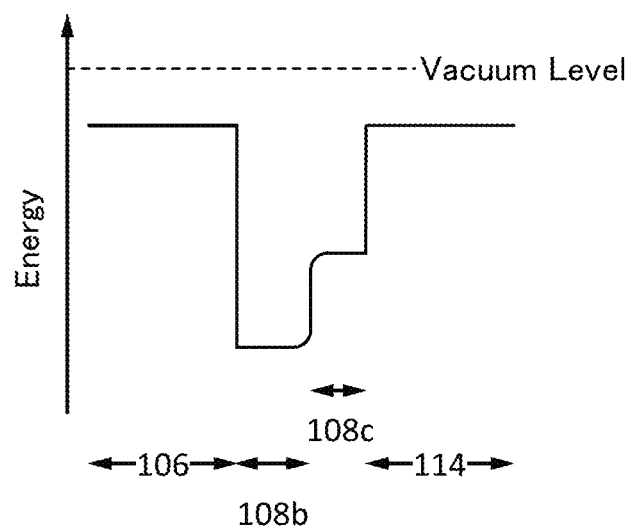

FIGS. 20A and 20B are schematic views each illustrating a band structure of a stacked-layer film including oxide semiconductor films and insulating films in contact with the oxide semiconductor films. For easy understanding, the band structure shows the energy level of the conduction band minimum ($E_c$) of each of the oxide semiconductor films and the insulating films included in the stacked-layer film.

FIG. 20A shows an example of a band structure in the thickness direction of a stack including the insulating film 106, the oxide semiconductor films 108a, 108b, and 108c, and the insulating film 114.

FIG. 20B shows an example of a band structure in the thickness direction of a stack including the insulating film 106, the oxide semiconductor films 108b and 108c, and the insulating film 114.

Structure Example 1 of Semiconductor Device

For example, a semiconductor film including three stacked films which is sandwiched between two insulating films can be used in a transistor of the input/output device of one embodiment of the present invention. Specifically, a semiconductor film in which the oxide semiconductor film 108a, the oxide semiconductor film 108b, and the oxide semiconductor film 108c are stacked and which is sandwiched between the insulating film 106 and the insulating film 114 can be used in a transistor (see FIG. 19A and FIG. 20A).

The oxide semiconductor film 108c has a region overlapping with the oxide semiconductor film 108a, and the oxide semiconductor film 108b has a region sandwiched between the oxide semiconductor film 108a and the oxide semiconductor film 108c.

The insulating film 114 has a region overlapping with the insulating film 106.

The oxide semiconductor film 108a has a region in contact with the insulating film 106 and the oxide semiconductor film 108c has a region in contact with the insulating film 114, and the regions overlap with each other.

FIG. 20A is a band diagram of a structure in which a silicon oxide film is used as each of the insulating films 106 and 114, an oxide semiconductor film formed using a metal oxide target having an atomic ratio of metal elements of In:Ga:Zn=1:3:2 is used as the oxide semiconductor film 108a, an oxide semiconductor film formed using a metal oxide target having an atomic ratio of metal elements of In:Ga:Zn=4:2:4.1 is used as the oxide semiconductor film 108b, and an oxide semiconductor film formed using a metal oxide target having an atomic ratio of metal elements of In:Ga:Zn=1:3:2 is used as the oxide semiconductor film 108c.

Structure Example 2 of Semiconductor Device

For example, a semiconductor film including two stacked films which is sandwiched between two insulating films can be used in a transistor of the input/output device of one embodiment of the present invention. Specifically, a semiconductor film in which the oxide semiconductor film 108b and the oxide semiconductor film 108c are stacked and which is sandwiched between the insulating film 106 and the insulating film 114 can be used in a transistor (see FIG. 19B and FIG. 20B).

The oxide semiconductor film 108c has a region overlapping with the oxide semiconductor film 108b.

The insulating film 114 has a region overlapping with the insulating film 106.

The oxide semiconductor film 108b has a region in contact with the insulating film 106 and the oxide semiconductor film 108c has a region in contact with the insulating film 114, and the regions overlap with each other.

FIG. 20B is a band diagram of a structure in which a silicon oxide film is used as each of the insulating films 106 and 114, an oxide semiconductor film formed using a metal oxide target having an atomic ratio of metal elements of In:Ga:Zn=4:2:4.1 is used as the oxide semiconductor film 108b, and a metal oxide film formed using a metal oxide target having an atomic ratio of metal elements of In:Ga:Zn=1:3:2 is used as the oxide semiconductor film 108c.

<Band Structure of Semiconductor Films>

As illustrated in FIGS. 20A and 20B, the energy level of the conduction band minimum gradually varies between the oxide semiconductor film 108a and the oxide semiconductor film 108b and between the oxide semiconductor film 108b and the oxide semiconductor film 108c. In other words, the energy level at the bottom of the conduction band is continuously varied or continuously connected. To obtain such a band structure, there exists no impurity, which forms a defect state such as a trap center or a recombination center, at the interface between the oxide semiconductor film 108a and the oxide semiconductor film 108b or at the interface between the oxide semiconductor film 108b and the oxide semiconductor film 108c.

To form a continuous junction between the oxide semiconductor film 108a and the oxide semiconductor film 108b and between the oxide semiconductor film 108b and the oxide semiconductor film 108c, the films are formed successively without exposure to the air by using a multi-chamber deposition apparatus (sputtering apparatus) provided with a load lock chamber.

With the band structure of FIG. 20A or FIG. 20B, the oxide semiconductor film 108b serves as a well, and a channel region is formed in the oxide semiconductor film 108b in the transistor with the stacked-layer structure.

The provision of the oxide semiconductor film 108a and/or the oxide semiconductor film 108c enables the oxide semiconductor film 108b to be distanced away from trap states.

In addition, the trap states might be more distant from the vacuum level than the energy level of the conduction band minimum (Ec) of the oxide semiconductor film 108b functioning as a channel region, so that electrons are likely to be accumulated in the trap states. When the electrons are accumulated in the trap states, the electrons become negative fixed electric charge, so that the threshold voltage of the transistor is shifted in the positive direction. Therefore, it is preferable that the energy level of the trap states be closer to the vacuum level than the energy level of the conduction band minimum (Ec) of the oxide semiconductor film 108b. Such a structure inhibits accumulation of electrons in the trap states. As a result, the on-state current and the field-effect mobility of the transistor can be increased.

The energy level of the conduction band minimum of each of the oxide semiconductor films 108a and 108c is closer to the vacuum level than that of the oxide semiconductor film 108b. Typically, a difference in energy level between the conduction band minimum of the oxide semiconductor film 108b and the conduction band minimum of each of the oxide semiconductor films 108a and 108c is 0.15 eV or more or 0.5 eV or more and 2 eV or less or 1 eV or less. That is, the difference between the electron affinity of each of the oxide semiconductor films 108a and 108c and the electron affinity of the oxide semiconductor film 108b is 0.15 eV or more or 0.5 eV or more and 2 eV or less or 1 eV or less.

In such a structure, the oxide semiconductor film 108b serves as a main path of current and functions as a channel region. In addition, since the oxide semiconductor films 108a and 108c each contain one or more metal elements that are the same as those contained in the oxide semiconductor film 108b in which a channel region is formed, interface scattering is less likely to occur at the interface between the oxide semiconductor film 108a and the oxide semiconductor film 108b or at the interface between the oxide semiconductor film 108b and the oxide semiconductor film 108c. Thus, the transistor can have high field-effect mobility because the movement of carriers is not hindered at the interface.

To prevent each of the oxide semiconductor films 108a and 108c from functioning as part of a channel region, a material having sufficiently low conductivity is used for the oxide semiconductor films 108a and 108c. Alternatively, a material which has a smaller electron affinity (a difference in energy level between the vacuum level and the conduction band minimum) than the oxide semiconductor film 108b and has a difference in energy level in the conduction band minimum from the oxide semiconductor film 108b (band offset) is used for the oxide semiconductor films 108a and 108c. Furthermore, to inhibit generation of a difference between threshold voltages due to the value of the drain voltage, it is preferable to form the oxide semiconductor films 108a and 108c using a material whose energy level of the conduction band minimum is closer to the vacuum level than that of the oxide semiconductor film 108b. For example, a difference in energy level between the conduction band minimum of the oxide semiconductor film 108b and the conduction band minimum of the oxide semiconductor films 108a and 108c is preferably 0.2 eV or more and further preferably 0.5 eV or more.

It is preferable that the oxide semiconductor films 108a and 108c not have a spinel crystal structure. This is because if the oxide semiconductor films 108a and 108c have a spinel crystal structure, constituent elements of the conductive films 112a and 112b might be diffused to the oxide semiconductor film 108b at the interface between the spinel crystal structure and another region. Note that each of the oxide semiconductor films 108a and 108c is preferably a CAAC-OS, which will be described later, in which case a higher blocking property against constituent elements of the conductive films 112a and 112b, for example, copper elements, is obtained.

The thickness of each of the oxide semiconductor films 108a and 108c is greater than or equal to a thickness that is capable of inhibiting diffusion of the constituent elements of the conductive films 112a and 112b to the oxide semiconductor film 108b, and less than a thickness that inhibits supply of oxygen from the insulating film 114 to the oxide semiconductor film 108b. For example, when the thickness of each of the oxide semiconductor films 108a and 108c is greater than or equal to 10 nm, diffusion of the constituent elements of the conductive films 112a and 112b to the oxide semiconductor film 108b can be inhibited. When the thickness of each of the oxide semiconductor films 108a and 108c is less than or equal to 100 nm, oxygen can be effectively supplied from the insulating film 114 to the oxide semiconductor film 108b.

When the oxide semiconductor films 108a and 108c are each an In-M-Zn oxide in which the atomic proportion of M (M is Al, Ga, Y, or Sn) is higher than that of In, the energy gap of each of the oxide semiconductor films 108a and 108c can be large and the electron affinity thereof can be small. Therefore, a difference in electron affinity between the oxide semiconductor film 108b and each of the oxide semiconductor films 108a and 108c may be controlled by the proportion of the element M. Furthermore, an oxygen vacancy is less likely to be generated in the oxide semiconductor layer in which the atomic proportion of M is higher than that of In because M is a metal element that is strongly bonded to oxygen.

When an In-M-Zn oxide is used for the oxide semiconductor films 108a and 108c, the proportions of In and M, not taking Zn and O into consideration, are as follows: the atomic percentage of In is preferably less than 50 atomic % and the atomic percentage of M is greater than 50 atomic % and further preferably the atomic percentage of In is less than 25 atomic % and the atomic percentage of M is greater than 75 atomic %. Alternatively, a gallium oxide film may be used as each of the oxide semiconductor films 108a and 108c.

Furthermore, in the case where each of the oxide semiconductor films 108a, 108b, and 108c is an In-M-Zn oxide, the proportion of M atoms in each of the oxide semiconductor films 108a and 108c is higher than that in the oxide semiconductor film 108b. Typically, the proportion of M atoms in each of the oxide semiconductor films 108a and 108c is 1.5 or more times, preferably twice or more times, and further preferably three or more times as high as that in the oxide semiconductor film 108b.

Furthermore, in the case where the oxide semiconductor films 108a, 108b, and 108c are each an In-M-Zn oxide, when the oxide semiconductor film 108b has an atomic ratio of In:M:Zn=$x_1$:$y_1$:$z_1$ and the oxide semiconductor films 108a and 108c each have an atomic ratio of In:M:Zn=$x_2$:$y_2$:$z_2$, $y_2/x_2$ is larger than $y_1/x_1$, preferably $y_2/x_2$ is 1.5 or more times as large as $y_1/x_1$, further preferably, $y_2/x_2$ is two or more times as large as $y_1/x_1$, or still further preferably $y_2/x_2$ is three or more times or four or more times as large as $y_1/x_1$. In this case, it is preferable that in the oxide semiconductor film 108b, $y_1$ be higher than or equal to $x_1$ because a transistor including the oxide semiconductor film 108b can have stable electric characteristics. However, when $y_1$ is three or more times as large as $x_1$, the field-effect mobility of the transistor including the oxide semiconductor film 108b is reduced. Accordingly, $y_1$ is preferably smaller than three times $x_1$.

In the case where the oxide semiconductor film 108b is an In-M-Zn oxide and a target having the atomic ratio of metal elements of In:M:Zn=$x_1$:$y_1$:$z_1$ is used for depositing the oxide semiconductor film 108b, $x_1/y_1$ is preferably greater than or equal to ⅓ and less than or equal to 6, and further preferably greater than or equal to 1 and less than or equal to 6, and $z_1/y_1$ is preferably greater than or equal to ⅓ and less than or equal to 6, and further preferably greater than or equal to 1 and less than or equal to 6. Note that when $z_1/y_1$ is greater than or equal to 1 and less than or equal to 6, a CAAC-OS to be described later is easily formed as the oxide semiconductor film 108b. Typical examples of the atomic ratio of the metal elements of the target include In:M:Zn=4:2:4.1, In:M:Zn=1:1:1.2, and In:M:Zn=3:1:2.

In the case where the oxide semiconductor films 108a and 108c are each an In-M-Zn oxide and a target having an atomic ratio of metal elements of In:M:Zn=$x_2$:$y_2$:$z_2$ is used for depositing the oxide semiconductor films 108a and 108c, $x_2/y_2$ is preferably less than $x_1/y_1$, and $z_2/y_2$ is preferably greater than or equal to ⅓ and less than or equal to 6, and further preferably greater than or equal to 1 and less than or equal to 6. When the atomic proportion of M is higher than that of indium, the energy gap of the oxide semiconductor films 108a and 108c can be large and the electron affinity thereof can be small; therefore, $y_2/x_2$ is preferably higher than or equal to 3 or higher than or equal to 4. Typical examples of the atomic ratio of the metal elements of the target include In:M:Zn=1:3:2, In:M:Zn=1:3:4, In:M:Zn=1:3:5, InM:Zn=1:3:6, In:M:Zn=1:4:2, In:M:Zn=1:4:4, In:M:Zn=1:4:5, and In:M:Zn=1:5:5.

Furthermore, in the case where the oxide semiconductor films 108a and 108c are each an In-M oxide, when a divalent metal element (e.g., zinc) is not included as M, the oxide semiconductor films 108a and 108c which do not include a spinel crystal structure can be formed. As each of the oxide semiconductor films 108a and 108c, for example, an In—Ga oxide film can be used. The In—Ga oxide film can be formed by a sputtering method using an In—Ga metal oxide target (In:Ga=7:93), for example. To deposit the oxide semiconductor films 108a and 108c by a sputtering method using DC discharge, on the assumption that an atomic ratio of In:M is x:y, it is preferable that y/(x+y) be less than or equal to 0.96, and further preferably less than or equal to 0.95, for example, 0.93.

In each of the oxide semiconductor films 108a, 108b, and 108c, the proportions of the atoms in the above atomic proportion vary within a range of ±40% as an error.

Note that this embodiment can be combined with any of the other embodiments in this specification as appropriate.

Embodiment 6

In this embodiment, a structure of a data processor of one embodiment of the present invention is described with reference to FIGS. 21A to 21C, FIGS. 22A to 22C, and FIGS. 23A and 23B.

Figure 21A:
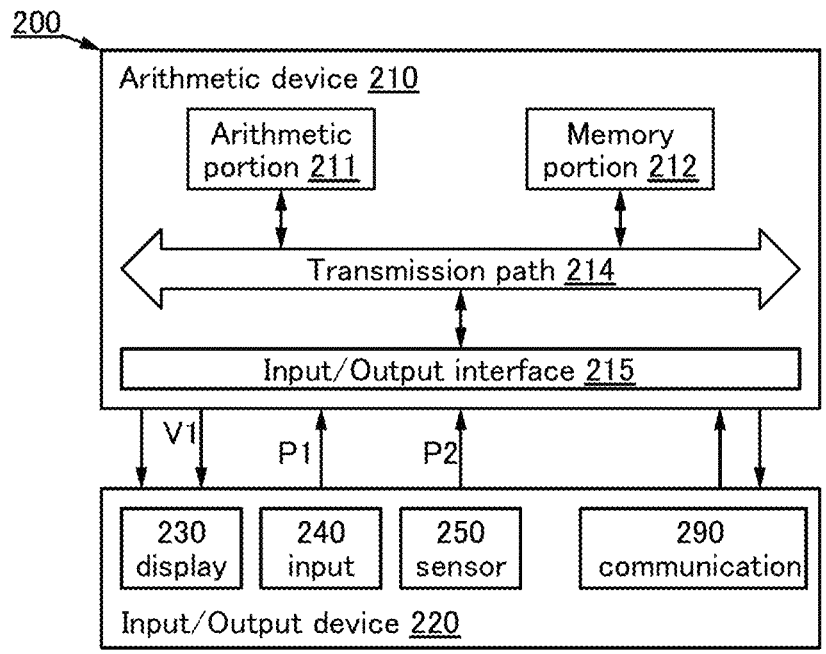
FIGS. 21A to 21C are a block diagram and projection views illustrating structures of a data processor of an embodiment.
Figure 21B:
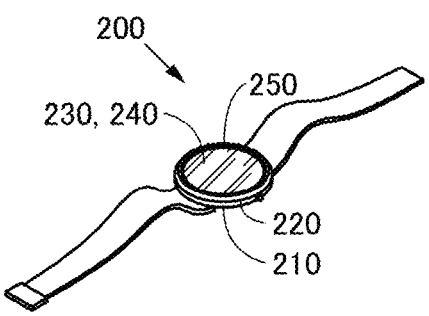
Figure 21C:
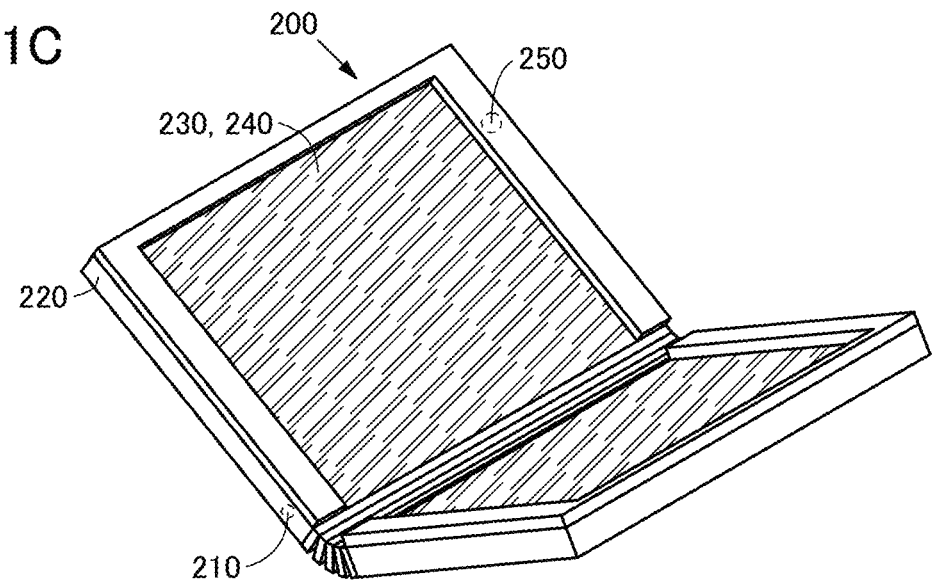

FIG. 21A is a block diagram illustrating a structure of a data processor 200. FIGS. 21B and 21C are projection views illustrating examples of external views of the data processor 200.

Figure 22A:
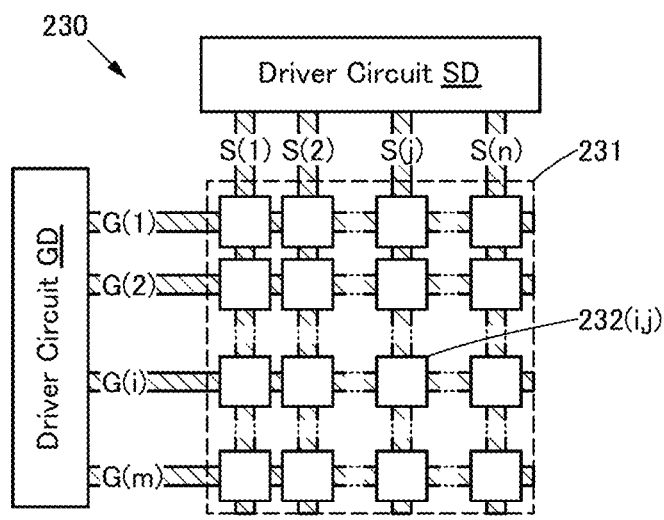
FIGS. 22A to 22C are block diagrams and a circuit diagram illustrating structures of a display portion of an embodiment.
Figure 22B:
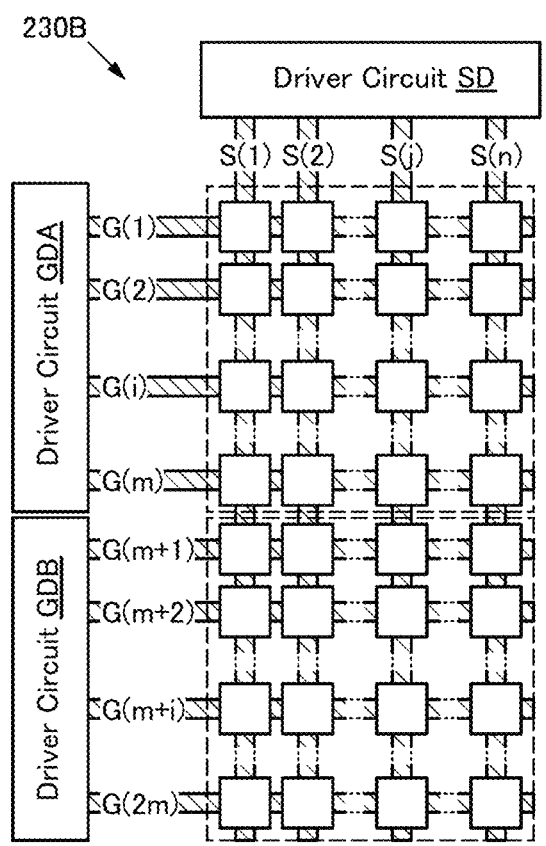
Figure 22C:
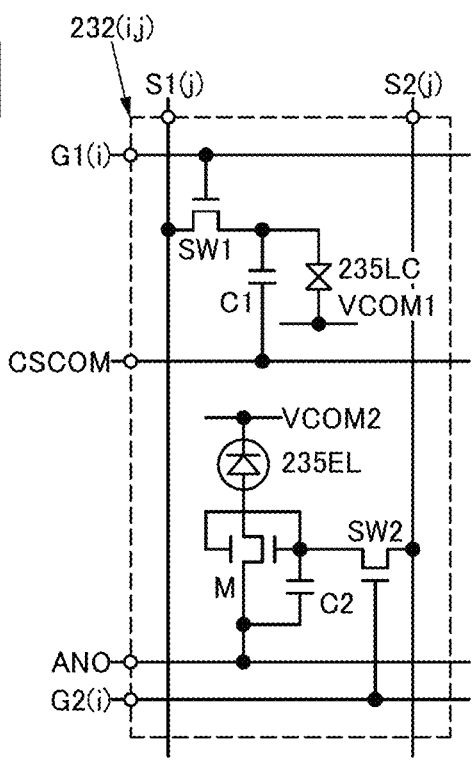

FIG. 22A is a block diagram illustrating a configuration of a display portion 230. FIG. 22B is a block diagram illustrating a configuration of a display portion 230B. FIG. 22C is a circuit diagram illustrating a configuration of a pixel 232(i,j).

Structure Example of Data Processor

The data processor 200 described in this embodiment includes an input/output device 220 and an arithmetic device 210 (see FIG. 21A).

The input/output device 220 is configured to supply the positional information P1 and pressure information and to receive the image information V1 and the control information. For example, a crown that can be pushed in a housing, a pressure sensitive sensor in contact with the crown or the like, or the like can be used.

The arithmetic device 210 is configured to receive positional information P1 and pressure information and to supply image information V1 and control information.

The arithmetic device 210 is configured to generate the image information V1 and the control information in accordance with the pressure information.

The input/output device 220 includes the display portion 230 that displays the image information V1, an input portion 240 that supplies the positional information P1, and a sensor portion 250 that supplies the pressure information.

The display portion 230 has a display panel. The sensor portion 250 includes a pressure sensitive sensor and is configured to generate the pressure information in accordance with a signal from the pressure sensitive sensor.

The arithmetic device 210 includes an arithmetic portion 211 and a memory portion 212.

The memory portion 212 stores a program executed by the arithmetic portion 211.

The program includes the step of selecting the first mode when pressure information exceeding a predetermined threshold is supplied and the step of selecting the second mode when pressure information exceeding a predetermined threshold is not supplied for more than a predetermined period.

The arithmetic portion 211 is configured to supply a control signal in the first mode that is different from a control signal supplied in the second mode.

The control signal includes a signal for refreshing display of the display panel.

The arithmetic device 210 is configured to supply the control signal in the second mode so that the frequency of refreshing the display of the display panel is lower than that in the first mode.

The above-described data processor of one embodiment of the present invention includes the input/output device that supplies pressure information and the arithmetic device that supplies control information that varies in accordance with the pressure information.

With such a structure, the mode of the data processor can be switched with the push, for example. Thus, a novel data processor that is highly convenient or reliable can be provided.

<Structure>

The data processor of one embodiment of the present invention includes the arithmetic device 210 or the input/output device 220.

<<Arithmetic Portion 210>>

The arithmetic device 210 includes the arithmetic portion 211, the memory portion 212, a transmission path 214, or an input/output interface 215 (see FIG. 21A).

<<Arithmetic Portion 211>>

The arithmetic portion 211 is configured to, for example, execute a program. For example, a CPU described in Embodiment 5 can be used. In that case, power consumption can be sufficiently reduced.

<<Memory Portion 212>>

The memory portion 212 is configured to, for example, store the program executed by the arithmetic portion 211, initial information, setting information, an image, or the like.

Specifically, a hard disk, a flash memory, a memory including a transistor including an oxide semiconductor, or the like can be used for the memory portion 212.

<<Input/Output Interface 215 and Transmission Path 214>>

The input/output interface 215 includes a terminal or a wiring and is configured to supply and receive information. For example, the input/output interface 215 can be electrically connected to the transmission path 214 and the input/output device 220.

The transmission path 214 includes a wiring and is configured to supply and receive information. For example, the transmission path 214 can be electrically connected to the input/output interface 215. In addition, the transmission path 214 can be electrically connected to the arithmetic portion 211, the memory portion 212, or the input/output interface 215.

<<Input/Output Device 220>>

The input/output device 220 includes the display portion 230, the input portion 240, the sensor portion 250, or a communication portion 290. For example, the input/output device described in Embodiment 1 can be used. Accordingly, power consumption can be reduced.

<<Display Portion 230>>

The display portion 230 includes a display region 231, a driver circuit GD, and a driver circuit SD (see FIG. 22A).

The display region 231 includes a plurality of pixels $232(i,1)$ to $232(i,n)$ arranged in the row direction, a plurality of pixels $232(i,j)$ to $232(m,j)$ arranged in the column direction, scan lines $G1(i)$ and $G2(i)$ electrically connected to the pixels $232(i,1)$ to $232(i,n)$, and signal lines $S1(j)$ and $S2(j)$ electrically connected to the pixels $232(i,j)$ to $232(m,j)$. Note that i is an integer greater than or equal to 1 and less than or equal to m, j is an integer greater than or equal to 1 and less than or equal to n, and each of m and n is an integer greater than or equal to 1.

Note that the pixel $232(i,j)$ is electrically connected to the scan line $G1(i)$, the scan line $G2(i)$, the signal lines $S1(j)$ and $S2(j)$, the wiring ANO, the wiring CSCOM, the wiring VCOM1, and the wiring VCOM2 (see FIG. 22C).

The display portion can include a plurality of driver circuits. For example, the display portion 230B can include a driver circuit GDA and a driver circuit GDB (see FIG. 22B).

<<Driver Circuit GD>>

The driver circuit GD is configured to supply a selection signal in accordance with the control information.

For example, the driver circuit GD is configured to supply a selection signal to one scan line at a frequency of 30 Hz or higher, preferably 60 Hz or higher, in accordance with the control information. Accordingly, moving images can be smoothly displayed.

For example, the driver circuit GD is configured to supply a selection signal to one scan line at a frequency of lower than 30 Hz, preferably lower than 1 Hz, further preferably less than once per minute, in accordance with the control information. Accordingly, a still image can be displayed while flickering is suppressed.

For example, in the case where a plurality of driver circuits is provided, the driver circuits GDA and GDB may supply the selection signals at different frequencies. Specifically, the selection signal can be supplied at a higher frequency to a region on which moving images are smoothly displayed than to a region on which a still image is displayed in a state where flickering is suppressed.

<<Driver Circuit SD>>

The driver circuit SD is configured to supply an image signal in accordance with the image information V1.

<<Pixel $232(i,j)$>>

The pixel $232(i,j)$ includes a first display element 235LC and a second display element 235EL overlapping with the first display element 235LC. The pixel $232(i,j)$ further includes a pixel circuit for driving the first display element 235LC and a pixel circuit for driving the second display element 235EL (see FIG. 22C).

<<First Display Element 235LC>>

For example, a display element having a function of controlling transmission or reflection of light can be used as the first display element 235LC. For example, a combined structure of a polarizing plate and a liquid crystal element or a MEMS shutter display element can be used. The use of a reflective display element can reduce power consumption of a display panel. Specifically, a reflective liquid crystal display element can be used as the first display element 235LC.

The first display element 235LC includes a first electrode, a second electrode, and a liquid crystal layer. The liquid crystal layer contains a liquid crystal material whose orientation is controlled by voltage applied between the first electrode and the second electrode. For example, the orientation of the liquid crystal material can be controlled by an electric field in the thickness direction of the liquid crystal layer (also referred to as the vertical direction) or an electric field in the direction intersecting with the vertical direction (also referred to as the horizontal direction or the diagonal direction).

<<Second Display Element 235EL>>

A display element having a function of emitting light can be used as the second display element 235EL, for example. Specifically, an organic EL element can be used.

More specifically, an organic EL element that emits white light can be used as the second display element 235EL.

Alternatively, an organic EL element that emits blue light, green light, or red light can be used as the second display element 235EL.

<<Pixel Circuit>>

A pixel circuit including a circuit that is configured to drive the first display element 235LC or the second display element 235EL can be used.

A switch, a transistor, a diode, a resistor, an inductor, or a capacitor can be used in the pixel circuit.

For example, one or a plurality of transistors can be used as a switch. Alternatively, a plurality of transistors connected in parallel, in series, or in combination of parallel connection and series connection can be used as a switch.

<<Transistor>>

For example, semiconductor films formed at the same step can be used for transistors in the driver circuit and the pixel circuit.

As the transistors in the driver circuit and the pixel circuit, bottom-gate transistors, top-gate transistors, or the like can be used.

A manufacturing line for a bottom-gate transistor including amorphous silicon as a semiconductor can be easily remodeled into a manufacturing line for a bottom-gate transistor including an oxide semiconductor as a semiconductor, for example. Furthermore, for example, a manufacturing line for a top-gate transistor including polysilicon as a semiconductor can be easily remodeled into a manufacturing line for a top-gate transistor including an oxide semiconductor as a semiconductor.

For example, a transistor including a semiconductor containing an element of Group 14 can be used. Specifically, a semiconductor containing silicon can be used for a semiconductor film. For example, single crystal silicon, polysilicon, microcrystalline silicon, amorphous silicon, or the like can be used for the semiconductor film of the transistor.

Note that the temperature for forming a transistor using polysilicon in a semiconductor is lower than the temperature for forming a transistor using single crystal silicon in a semiconductor.

In addition, the transistor using polysilicon in a semiconductor has higher field-effect mobility than the transistor using amorphous silicon in a semiconductor film, and therefore a pixel including the transistor using polysilicon can have a high aperture ratio. Moreover, pixels arranged at high resolution, a gate driver circuit, and a source driver circuit can be formed over the same substrate. As a result, the number of components included in an electronic device can be reduced.

In addition, the transistor using polysilicon in a semiconductor film has higher reliability than the transistor using amorphous silicon in a semiconductor.

For example, a transistor including an oxide semiconductor can be used. Specifically, an oxide semiconductor containing indium or an oxide semiconductor containing indium, gallium, and zinc can be used for a semiconductor film.

For example, a transistor having a lower leakage current in an off state than a transistor that uses amorphous silicon for a semiconductor film can be used. Specifically, a transistor that uses an oxide semiconductor for a semiconductor film can be used.

A pixel circuit including the transistor that uses an oxide semiconductor in the semiconductor film can hold an image signal for a longer time than a pixel circuit including a transistor that uses amorphous silicon in a semiconductor film. Specifically, the selection signal can be supplied at a frequency of lower than 30 Hz, preferably lower than 1 Hz, further preferably less than once per minute while flickering is suppressed. Consequently, eyestrain on a user of the data processor can be reduced, and power consumption for driving can be reduced.

Alternatively, for example, a transistor including a compound semiconductor can be used. Specifically, a semiconductor containing gallium arsenide can be used for a semiconductor film.

For example, a transistor including an organic semiconductor can be used. Specifically, an organic semiconductor containing any of polyacenes and graphene can be used for the semiconductor film.

<<Input Portion 240>>

A variety of human interfaces or the like can be used as the input portion 240 (see FIG. 21A).

For example, a keyboard, a mouse, a touch sensor, a microphone, a camera, or the like can be used as the input portion 240. Note that a touch sensor having a region overlapping with the display portion 230 can be used. An input/output device that includes the display portion 230 and a touch sensor having a region overlapping with the display portion 230 can be referred to as a touch panel.

For example, a user can make various gestures (e.g., tap, drag, swipe, and pinch in) using his/her finger as a pointer on the touch panel.

The arithmetic device 210, for example, analyzes information on the position, track, or the like of the finger on the touch panel and determines that a specific gesture is supplied when the analysis results meet predetermined conditions. Therefore, the user can supply a certain operation instruction associated with a certain gesture by using the gesture.

For instance, the user can supply a "scrolling instruction" for changing a portion where image information is displayed by using a gesture of touching and moving his/her finger on the touch panel.

<<Sensor Portion 250>>

The sensor portion 250 is configured to supply information P2, such as pressure information, by sensing its surroundings.

For example, a camera, an acceleration sensor, a direction sensor, a pressure sensor, a temperature sensor, a humidity sensor, an illuminance sensor, or a global positioning system (GPS) signal receiving circuit can be used as the sensor portion 250.

For example, when the arithmetic device 210 determines that the ambient light level measured by an illuminance sensor of the sensor portion 250 is sufficiently higher than the predetermined illuminance, image data is displayed using the first display element 235LC. When the arithmetic device 210 determines that it is dim, image data is displayed using the first display element 235LC and the second display element 235EL. When the arithmetic device 210 determines that it is dark, image data is displayed using the second display element 235EL.

Specifically, an image is displayed with a reflective liquid crystal element and/or an organic EL element depending on the ambient brightness.

Thus, image data can be displayed in such a manner that, for example, a reflective display element is used under strong ambient light and a self-luminous display element is used in dim light. As a result, a novel data processor that has low power consumption and is highly convenient or reliable can be provided.

For example, a sensor measuring chromaticity of ambient light, such as a CCD camera, can be used in the sensor portion 250. Owing to this, white balance can be adjusted in accordance with the chromaticity of ambient light sensed by the sensor portion 250.

Specifically, in the first step, imbalance disruption of white balance of ambient light is measured.

In the second step, the intensity of light of a color that is insufficient in an image to be displayed by the first display element using reflection of ambient light is estimated.

In the third step, ambient light is reflected by the first display element, and light is emitted from the second display element so that light of the insufficient color is supplemented, whereby the image is displayed.

In this manner, display can be performed with adjusted white balance by utilizing light reflected by the first display element and light emitted from the second display element. Thus, a novel data processor that can perform display with low power consumption or with adjusted white balance and that is highly convenient and reliable can be provided.

<<Communication Portion 290>>

The communication portion 290 is configured to supply and acquire information to/from a network.

<Program>

A program of one embodiment of the present invention is described with reference to FIGS. 23A and 23B.

Figure 23A:
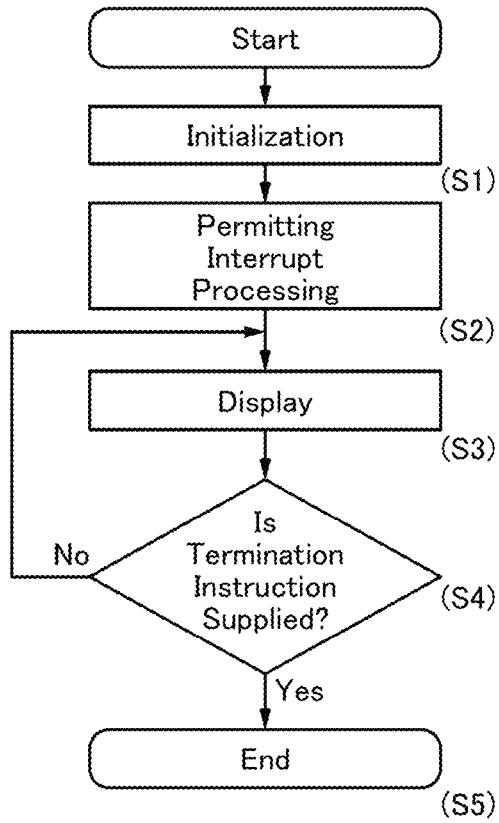
FIGS. 23A and 23B are flow charts each showing a program of an embodiment.
Figure 23B:
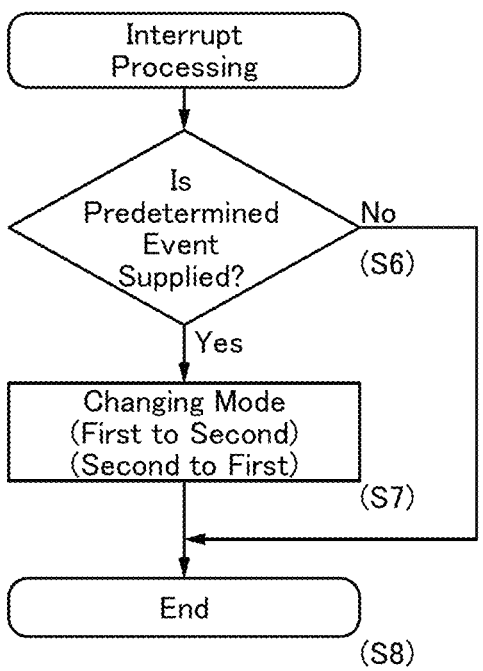

FIG. 23A is a flow chart showing main processing of the program of one embodiment of the present invention, and FIG. 23B is a flow chart showing interrupt processing.

The program of one embodiment of the present invention is composed of the following steps (see FIG. 23A).

<<First Step>>

In the first step, setting is initialized (see (S1) in FIG. 23A).

For example, predetermined image information that is to be displayed on starting and information for specifying a method of displaying the image information are acquired from the memory portion 212. Specifically, a still image can be used as the predetermined image information. A method of refreshing image information at a frequency lower than that in the case of using a moving image can be used as the method of displaying image information.

<<Second Step>>

In the second step, interrupt processing is permitted (see (S2) in FIG. 23A). Note that an arithmetic device allowed to execute the interrupt processing can perform the interrupt processing in parallel with the main processing. The arithmetic device that has returned from the interrupt processing to the main processing can reflect the results of the interrupt processing in the main processing.

The arithmetic device may execute the interrupt processing when a counter has an initial value, and the counter may be set at a value other than the initial value when the arithmetic device returns from the interrupt processing. Thus, the interrupt processing is ready to be executed after the program is started up.

<<Third Step>>

In the third step, image information is displayed in a mode selected in the first step or the interrupt processing (see (S3) in FIG. 23A). Note that the method of displaying image information is specified by a mode.

For example, the first mode or the second mode can be selected.

<<First Mode>>

Specifically, a method of supplying selection signals to a scan line at a frequency of 30 Hz or more, preferably 60 Hz or more, and performing display in accordance with the selection signals can be used as the first mode.

The supply of selection signals at a frequency of 30 Hz or more, preferably 60 Hz or more, can display a smooth moving image.

For example, an image is refreshed at a frequency of 30 Hz or more, preferably 60 Hz or more, so that an image smoothly following the user's operation can be displayed on the data processor 200 the user operates.

<<Second Mode>>

Specifically, a method of supplying selection signals to a scan line at a frequency of less than 30 Hz, preferably less than 1 Hz, further preferably once a minute and performing display in accordance with the selection signals can be used as the second mode.

The supply of selection signals at a frequency of less than 30 Hz, preferably less than 1 Hz, further preferably once a minute, can perform display with flickers reduced. Furthermore, power consumption can be reduced.

For example, when a light-emitting element is used as the second display element, the light-emitting element can be configured to emit light in a pulsed manner so as to display image data. Specifically, an organic EL element can be configured to emit light in a pulsed manner, and its afterglow can be used for display. The organic EL element has excellent frequency characteristics; thus, time for driving the light-emitting element can be shortened, and thus power consumption can be reduced in some cases. Alternatively, heat generation can be inhibited, and thus the deterioration of the light-emitting element can be suppressed in some cases.

For example, when the data processor 200 is used for a clock or watch, the display can be refreshed at a frequency of once a second or once a minute.

<<Fourth Step>>

In the fourth step, the program moves to the fifth step when a termination instruction is supplied, and the program moves to the third step when the termination instruction is not supplied (see (S4) in FIG. 23A).

For example, the termination instruction supplied in the interrupt processing can be used.

<<Fifth Step>>

In the fifth step, the program terminates (see (S5) in FIG. 23A).

<<Interrupt Processing>>

The interrupt processing includes sixth to eighth steps described below (see FIG. 23B).

<<Sixth Step>>

In the sixth step, the processing proceeds to the seventh step when a predetermined event has been supplied, whereas the processing proceeds to the eighth step when the predetermined event has not been supplied (see (S6) in FIG. 23B). For example, whether the predetermined event is supplied in a predetermined period or not can be a branch condition. Specifically, the predetermined period can be longer than 0 seconds and shorter than or equal to 5 seconds, preferably shorter than or equal to 1 second, further preferably shorter than or equal to 0.5 seconds, still further preferably shorter than or equal to 0.1 seconds.

<<Seventh Step>>

In the seventh step, the mode is changed (see (S7) in FIG. 23B). Specifically, the mode is changed to the second mode when the first mode has been selected, or the mode is changed to the first mode when the second mode has been selected.

<<Eighth Step>>

In the eighth step, the interrupt processing terminates (see (S8) in FIG. 23B).

<<Predetermined Event>>

For example, the following events can be used as the predetermined event: events supplied using a pointing device such as a mouse (e.g., "click" and "drag") and events supplied to a touch panel with a finger or the like used as a pointer (e.g., "tap", "drag", and "swipe").

For example, the position of a slide bar pointed by a pointer, the swipe speed, and the drag speed can be used as arguments assigned to an instruction associated with the predetermined event.

For example, data sensed by the sensor portion 250 is compared to the set threshold, and the compared results can be used for the event.

Specifically, a crown that can be pushed in a housing, a pressure sensitive sensor in contact with the crown, or the like can be used (see FIG. 21B).

For example, a photoelectric conversion element provided in a housing can be used (see FIG. 21C).

<<Instruction Associated with Predetermined Event>>

For example, the termination instruction can be associated with a predetermined event.

For example, "page-turning instruction" for switching displayed image information from one to another can be associated with a predetermined event. Note that a parameter for determining the page-turning speed or the like when the "page-turning instruction" is executed can be supplied using the predetermined event.

For example, "scroll instruction" for moving the display position of part of image information and displaying another part continuing from that part can be associated with a predetermined event. Note that a parameter for determining the moving speed of the display position or the like when the "scroll instruction" is executed can be supplied using the predetermined event.

For example, an instruction for generating image information can be associated with a predetermined event. Note that the ambient luminance sensed by the sensor portion 250 may be determined on the basis of a parameter for determining the brightness of a generated image.

For example, an instruction or the like for acquiring information distributed via a push service using the communication portion 290 can be associated with a predetermined event. Note that positional information sensed by the sensor portion 250 may be used for the determination of the presence or absence of a qualification for acquiring information. Specifically, the determination of the presence of a qualification for acquiring information may be taken when the user is in a predetermined class room, school, conference room, office, or building (see FIG. 21C). For example, educational materials can be fed from a classroom of a school, a university, or the like and displayed, so that the data processor 200 can be used as a schoolbook or the like. Alternatively, materials distributed from a conference room in, for example, a company can be received and displayed.

Note that this embodiment can be combined with any of the other embodiments in this specification as appropriate.

Embodiment 7

In this embodiment, a semiconductor device (memory device) that can retain stored data even when not powered and that has an unlimited number of write cycles, and a CPU including the semiconductor device are described. The CPU described in this embodiment can be used for the data processor described in Embodiment 6, for example.

<Memory Device>

Figure 24A:
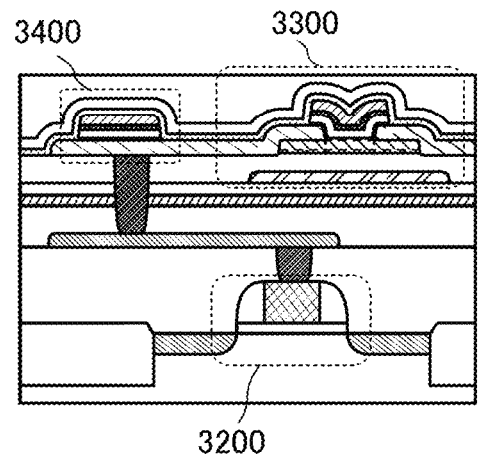
FIGS. 24A to 24C are a cross-sectional view and circuit diagrams illustrating structures of a semiconductor device of an embodiment.
Figure 24B:
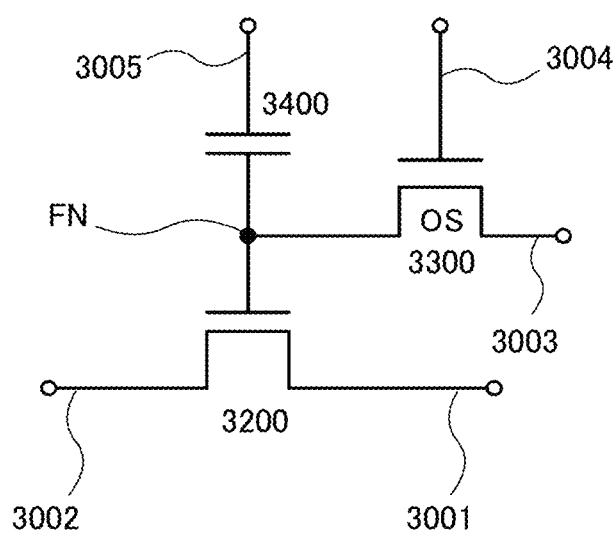
Figure 24C:
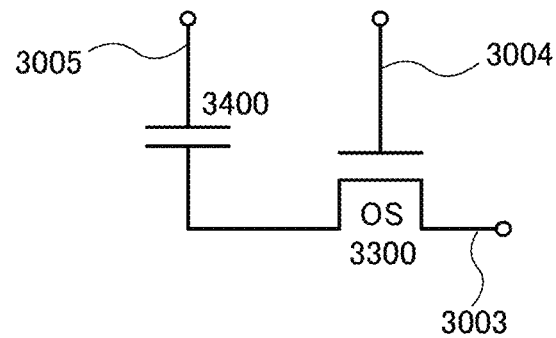

An example of a semiconductor device (memory device) that can retain stored data even when not powered and that has an unlimited number of write cycles is shown in FIGS. 24A to 24C. Note that FIG. 24B is a circuit diagram of the structure in FIG. 24A.

The semiconductor device illustrated in FIGS. 24A and 24B includes a transistor 3200 using a first semiconductor material, a transistor 3300 using a second semiconductor material, and a capacitor 3400.

The first and second semiconductor materials preferably have different energy gaps. For example, the first semiconductor material can be a semiconductor material other than an oxide semiconductor (examples of such a semiconductor material include silicon (including strained silicon), germanium, silicon germanium, silicon carbide, gallium arsenide, aluminum gallium arsenide, indium phosphide, gallium nitride, and an organic semiconductor), and the second semiconductor material can be an oxide semiconductor. A transistor using a material other than an oxide semiconductor, such as single crystal silicon, can operate at high speed easily. On the other hand, a transistor including an oxide semiconductor has a low off-state current.

The transistor 3300 is a transistor in which a channel is formed in a semiconductor layer including an oxide semiconductor. Since the off-state current of the transistor 3300 is small, stored data can be retained for a long period. In other words, power consumption can be sufficiently reduced because a semiconductor memory device in which refresh operation is unnecessary or the frequency of refresh operation is extremely low can be provided.

In FIG. 24B, a first wiring 3001 is electrically connected to a source electrode of the transistor 3200. A second wiring 3002 is electrically connected to a drain electrode of the transistor 3200. A third wiring 3003 is electrically connected to one of a source electrode and a drain electrode of the transistor 3300. A fourth wiring 3004 is electrically connected to a gate electrode of the transistor 3300. A gate electrode of the transistor 3200 and the other of the source electrode and the drain electrode of the transistor 3300 are electrically connected to one electrode of the capacitor 3400. A fifth wiring 3005 is electrically connected to the other electrode of the capacitor 3400.

The semiconductor device in FIG. 24A has a feature that the potential of the gate electrode of the transistor 3200 can be retained, and thus enables writing, retaining, and reading of data as follows.

Writing and retaining of data are described. First, the potential of the fourth wiring 3004 is set to a potential at which the transistor 3300 is turned on, so that the transistor 3300 is turned on. Accordingly, the potential of the third wiring 3003 is supplied to the gate electrode of the transistor 3200 and the capacitor 3400. That is, a predetermined charge is supplied to the gate electrode of the transistor 3200 (writing). Here, one of two kinds of charges providing different potential levels (hereinafter referred to as a low-level charge and a high-level charge) is supplied. After that, the potential of the fourth wiring 3004 is set to a potential at which the transistor 3300 is turned off, so that the transistor 3300 is turned off. Thus, the charge supplied to the gate electrode of the transistor 3200 is held (retaining).

Since the off-state current of the transistor 3300 is extremely small, the charge of the gate electrode of the transistor 3200 is retained for a long time.

Next, reading of data is described. An appropriate potential (a reading potential) is supplied to the fifth wiring 3005 while a predetermined potential (a constant potential) is supplied to the first wiring 3001, whereby the potential of the second wiring 3002 varies depending on the amount of charge retained in the gate electrode of the transistor 3200. This is because in the case of using an n-channel transistor as the transistor 3200, an apparent threshold voltage $V_{th\_H}$ at the time when the high-level charge is given to the gate electrode of the transistor 3200 is lower than an apparent threshold voltage $V_{th\_L}$ at the time when the low-level charge is given to the gate electrode of the transistor 3200. Here, an apparent threshold voltage refers to the potential of the fifth wiring 3005 that is needed to turn on the transistor 3200. Thus, the potential of the fifth wiring 3005 is set to a potential $V_0$ that is between $V_{th\_H}$ and $V_{th\_L}$, whereby charge supplied to the gate electrode of the transistor 3200 can be determined. For example, in the case where the high-level charge is supplied to the gate electrode of the transistor 3200 in writing and the potential of the fifth wiring 3005 is $V_0$ ($>V_{th\_H}$), the transistor 3200 is turned on. In the case where the low-level charge is supplied to the gate electrode of the transistor 3200 in writing, even when the potential of the fifth wiring 3005 is $V_0$ ($<V_{th\_L}$), the transistor 3200 remains off. Thus, the data retained in the gate electrode of the transistor 3200 can be read by determining the potential of the second wiring 3002.

Note that in the case where memory cells are arrayed, it is necessary that data of a desired memory cell is read. For example, the fifth wiring 3005 of memory cells from which data is not read may be supplied with a potential at which the transistor 3200 is turned off regardless of the potential supplied to the gate electrode, that is, a potential lower than $V_{th\_H}$, whereby only data of a desired memory cell can be read. Alternatively, the fifth wiring 3005 of the memory cells from which data is not read may be supplied with a potential at which the transistor 3200 is turned on regardless of the potential supplied to the gate electrode, that is, a potential higher than $V_{th\_L}$, whereby only data of a desired memory cell can be read.

The semiconductor device illustrated in FIG. 24C is different from the semiconductor device illustrated in FIG. 24A in that the transistor 3200 is not provided. Also in this case, writing and retaining operation of data can be performed in a manner similar to the semiconductor device illustrated in FIG. 24A.

Next, reading of data of the semiconductor device illustrated in FIG. 24C is described. When the transistor 3300 is turned on, the third wiring 3003 that is in a floating state and the capacitor 3400 are electrically connected to each other, and the charge is redistributed between the third wiring 3003 and the capacitor 3400. As a result, the potential of the third wiring 3003 is changed. The amount of change in the potential of the third wiring 3003 varies depending on the potential of the one electrode of the capacitor 3400 (or the charge accumulated in the capacitor 3400).

For example, the potential of the third wiring 3003 after the charge redistribution is $(C_B \times V_{B0} + C \times V)/(C_B + C)$, where V is the potential of the one electrode of the capacitor 3400, C is the capacitance of the capacitor 3400, $C_B$ is the capacitance component of the third wiring 3003, and $V_{B0}$ is the potential of the third wiring 3003 before the charge redistribution. Thus, it can be found that, assuming that the memory cell is in either of two states in which the potential of the one electrode of the capacitor 3400 is $V_1$ and $V_0$ ($V_1 > V_0$), the potential of the third wiring 3003 in the case of retaining the potential $V_1$ ($=(C_B \times V_{B0} + C \times V_1)/(C_B + C)$) is higher than the potential of the third wiring 3003 in the case of retaining the potential $V_0$ ($=(C_B \times V_{B0} + C \times V_0)/(C_B + C)$).

Then, by comparing the potential of the third wiring 3003 with a predetermined potential, data can be read.

In this case, a transistor including the first semiconductor material may be used for a driver circuit for driving a memory cell, and a transistor including the second semiconductor material may be stacked over the driver circuit as the transistor 3300.

When including a transistor in which a channel formation region is formed using an oxide semiconductor and which has an extremely small off-state current, the semiconductor device described in this embodiment can retain stored data for an extremely long time. In other words, refresh operation becomes unnecessary or the frequency of the refresh operation can be extremely low, which leads to a sufficient reduction in power consumption. Moreover, stored data can be retained for a long time even when power is not supplied (note that a potential is preferably fixed).

Furthermore, in the semiconductor device described in this embodiment, high voltage is not needed for writing data and there is no problem of deterioration of elements. Unlike in a conventional nonvolatile memory, for example, it is not necessary to inject and extract electrons into and from a floating gate; thus, a problem such as deterioration of a gate insulating film is not caused. That is, the semiconductor device described in this embodiment does not have a limit on the number of times data can be rewritten, which is a problem of a conventional nonvolatile memory, and the reliability thereof is drastically improved. Furthermore, data is written depending on the state of the transistor (on or off), whereby high-speed operation can be easily achieved.

The above memory device can also be used in an LSI such as a digital signal processor (DSP), a custom LSI, or a programmable logic device (PLD), in addition to a central processing unit (CPU), and a radio frequency identification (RF-ID), for example.

<CPU>

Figure 25:
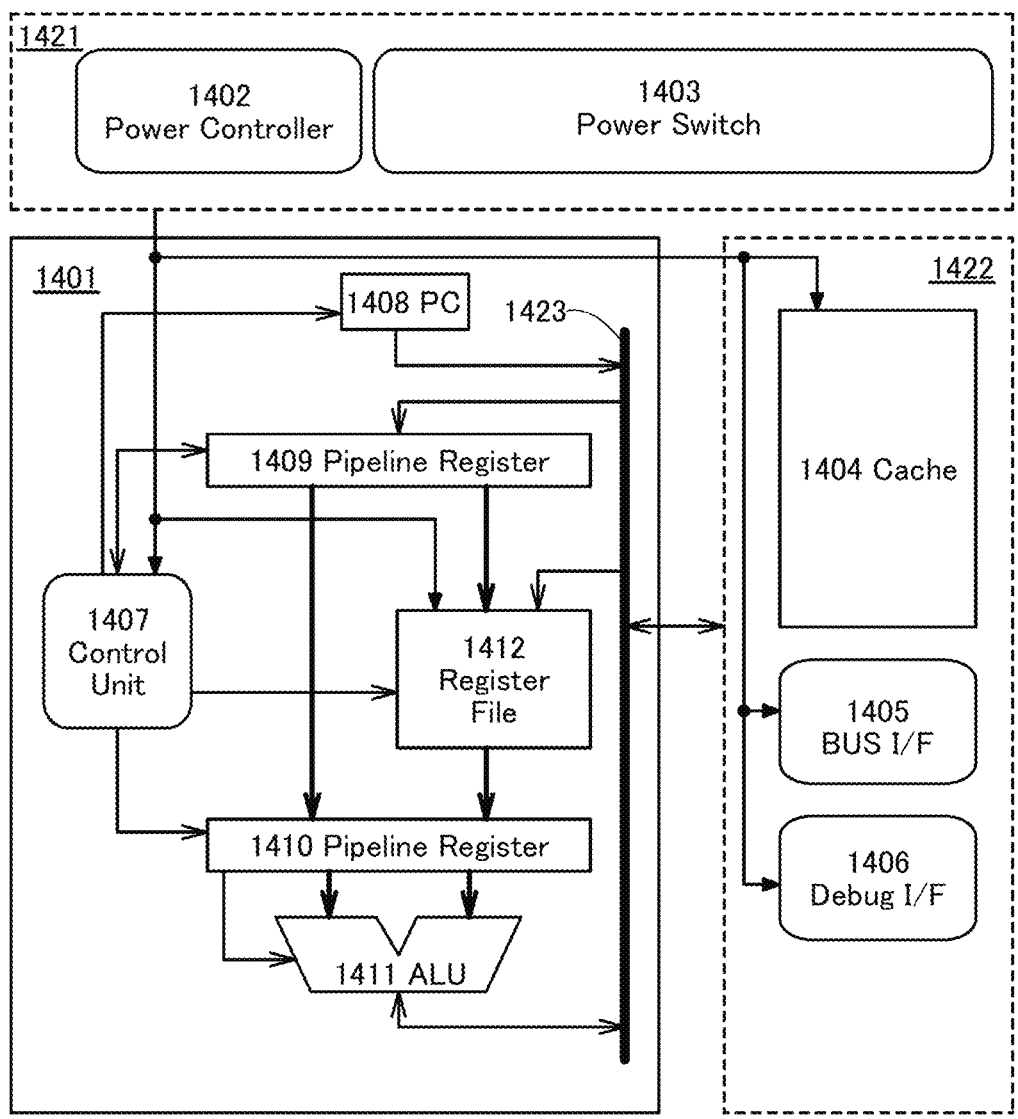
FIG. 25 is a block diagram illustrating a structure of a CPU of an embodiment.

A semiconductor device 1400 illustrated in FIG. 25 includes a CPU core 1401, a power management unit 1421, and a peripheral circuit 1422. The power management unit 1421 includes a power controller 1402 and a power switch 1403. The peripheral circuit 1422 includes a cache 1404 including cache memory, a bus interface (BUS I/F) 1405, and a debug interface (Debug I/F) 1406. The CPU core 1401 includes a data bus 1423, a control unit 1407, a program counter (PC) 1408, a pipeline register 1409, a pipeline register 1410, an arithmetic logic unit (ALU) 1411, and a register file 1412. Data is transmitted between the CPU core 1401 and the peripheral circuit 1422 such as the cache 1404 via the data bus 1423.

The semiconductor device (cell) can be applied to many logic circuits typified by the power controller 1402 and the control unit 1407, particularly to all logic circuits that can be constituted using standard cells. Accordingly, the semiconductor device 1400 can be small. The semiconductor device 1400 can have reduced power consumption. The semiconductor device 1400 can have a higher operating speed. The semiconductor device 1400 can have a smaller power supply voltage variation.

When p-channel Si transistors and the transistor described in the above embodiment which includes an oxide semiconductor (preferably an oxide containing In, Ga, and Zn) in a channel formation region are used in the semiconductor device (cell) and the semiconductor device (cell) is applied to the semiconductor device 1400, the semiconductor device 1400 can be small. The semiconductor device 1400 can have reduced power consumption. The semiconductor device 1400 can have a higher operating speed. Particularly when the Si transistors are only p-channel ones, the manufacturing cost can be reduced.

The control unit 1407 has functions of decoding and executing instructions contained in a program such as inputted applications by integrally controlling the operations of the PC 1408, the pipeline registers 1409 and 1410, the ALU 1411, the register file 1412, the cache 1404, the bus interface 1405, the debug interface 1406, and the power controller 1402.

The ALU 1411 has a function of performing a variety of arithmetic operations such as four arithmetic operations and logic operations.

The cache 1404 has a function of temporarily storing frequently used data. The PC 1408 is a register having a function of storing an address of an instruction to be executed next. Although not illustrated in FIG. 25, the cache 1404 includes a cache controller for controlling the operation of the cache memory.

The pipeline register 1409 has a function of temporarily storing instruction data.

The register file 1412 includes a plurality of registers including a general purpose register and can store data that is read from the main memory, data obtained as a result of arithmetic operations in the ALU 1411, or the like.

The pipeline register 1410 has a function of temporarily storing data used for arithmetic operations of the ALU 1411, data obtained as a result of arithmetic operations of the ALU 1411, or the like.

The bus interface 1405 functions as a path for data between the semiconductor device 1400 and devices outside the semiconductor device 1400. The debug interface 1406 functions as a path of a signal for inputting an instruction to control debugging to the semiconductor device 1400.

The power switch 1403 has a function of controlling supply of the power supply voltage to circuits other than the power controller 1402 in the semiconductor device 1400. These circuits belong to several different power domains. The power switch 1403 controls whether the power supply voltage is supplied to circuits in the same power domain. The power controller 1402 has a function of controlling the operation of the power switch 1403.

The semiconductor device 1400 having the above structure is capable of performing power gating. An example of the flow of the power gating operation will be described.

First, the CPU core 1401 sets the timing for stopping the supply of the power supply voltage in a register of the power controller 1402. Next, an instruction to start power gating is sent from the CPU core 1401 to the power controller 1402. Then, the registers and the cache 1404 in the semiconductor device 1400 start data saving. Subsequently, the power switch 1403 stops the supply of the power supply voltage to the circuits other than the power controller 1402 in the semiconductor device 1400. Then, an interrupt signal is input to the power controller 1402, thereby starting the supply of the power supply voltage to the circuits included in the semiconductor device 1400. Note that a counter may be provided in the power controller 1402 to be used to determine the timing of starting the supply of the power supply voltage regardless of input of an interrupt signal. Next, the registers and the cache 1404 start data restoration. After that, execution of an instruction is resumed in the control unit 1407.

This power gating can be performed in the entire processor or one or more logic circuits included in the processor. The supply of power can be stopped even for a short time. Accordingly, power consumption can be reduced at a fine granularity in space or time.

In performing power gating, data held by the CPU core 1401 or the peripheral circuit 1422 is preferably restored in a short time. In that case, the power can be turned on or off in a short time, and an effect of saving power becomes significant.

In order that the data held by the CPU core 1401 or the peripheral circuit 1422 be restored in a short time, the data is preferably restored to a flip-flop circuit itself (referred to as a flip-flop circuit capable of backup operation). Furthermore, the data is preferably restored to an SRAM cell itself (referred to as an SRAM cell capable of backup operation). The flip-flop circuit and SRAM cell which are capable of backup operation preferably include transistors including an oxide semiconductor (preferably an oxide containing In, Ga, and Zn) in a channel formation region. Consequently, the transistor has a low off-state current; thus, the flip-flop circuit and SRAM cell which are capable of backup operation can retain data for a long time without power supply. When the transistor has a high switching speed, the flip-flop circuit and SRAM cell which are capable of backup operation can restore and return data in a short time in some cases.

An example of the flip-flop circuit capable of backup operation is described with reference to FIG. 26.

Figure 26:
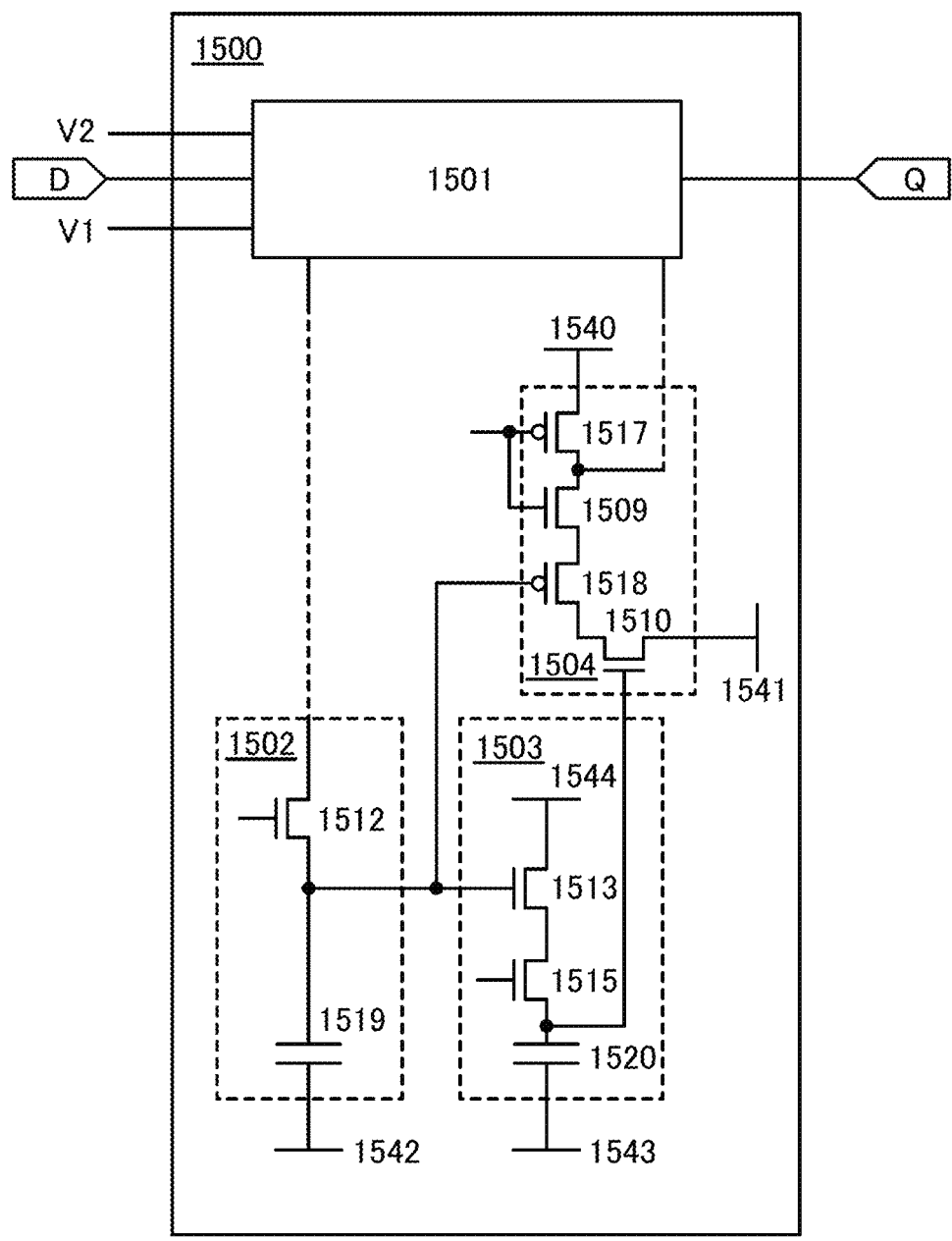
FIG. 26 is a circuit diagram illustrating a structure of a memory element of an embodiment.

A semiconductor device 1500 shown in FIG. 26 is an example of the flip-flop circuit capable of backup operation. The semiconductor device 1500 includes a first memory circuit 1501, a second memory circuit 1502, a third memory circuit 1503, and a read circuit 1504. As a power supply voltage, a potential difference between a potential V1 and a potential V2 is supplied to the semiconductor device 1500. One of the potential V1 and the potential V2 is at a high level, and the other is at a low level. An example of the structure of the semiconductor device 1500 when the potential V1 is at a low level and the potential V2 is at a high level is described below.

The first memory circuit 1501 has a function of retaining data when a signal D including the data is input in a period during which the power supply voltage is supplied to the semiconductor device 1500. The first memory circuit 1501 outputs a signal Q including the retained data in the period during which the power supply voltage is supplied to the semiconductor device 1500. On the other hand, the first memory circuit 1501 cannot retain data in a period during which the power supply voltage is not supplied to the semiconductor device 1500. That is, the first memory circuit 1501 can be referred to as a volatile memory circuit.

The second memory circuit 1502 has a function of reading the data held in the first memory circuit 1501 to store (or restore) it. The third memory circuit 1503 has a function of reading the data held in the second memory circuit 1502 to store (or restore) it. The read circuit 1504 has a function of reading the data held in the second memory circuit 1502 or the third memory circuit 1503 to store (or return) it in (to) the first memory circuit 1501.

In particular, the third memory circuit 1503 has a function of reading the data held in the second memory circuit 1502 to store (or restore) it even in the period during which the power supply voltage is not supplied to the semiconductor device 1500.

As shown in FIG. 26, the second memory circuit 1502 includes a transistor 1512 and a capacitor 1519. The third memory circuit 1503 includes a transistor 1513, a transistor 1515, and a capacitor 1520. The read circuit 1504 includes a transistor 1510, a transistor 1518, a transistor 1509, and a transistor 1517.

The transistor 1512 has a function of charging and discharging the capacitor 1519 in accordance with data held in the first memory circuit 1501. The transistor 1512 is desirably capable of charging and discharging the capacitor 1519 at a high speed in accordance with data held in the first memory circuit 1501. Specifically, the transistor 1512 desirably contains crystalline silicon (preferably polycrystalline silicon, more preferably single crystal silicon) in a channel formation region.

The on/off state of the transistor 1513 is determined in accordance with the charge held in the capacitor 1519. The transistor 1515 has a function of charging and discharging the capacitor 1520 in accordance with the potential of a wiring 1544 when the transistor 1513 is in a conduction state. It is preferable that the off-state current of the transistor 1515 be extremely small. Specifically, the transistor 1515 desirably contains an oxide semiconductor (preferably an oxide containing In, Ga, and Zn) in a channel formation region.

Specific connection relations between the elements are as follows. One of a source and a drain of the transistor 1512 is connected to the first memory circuit 1501. The other of the source and the drain of the transistor 1512 is connected to one electrode of the capacitor 1519, a gate of the transistor 1513, and a gate of the transistor 1518. The other electrode of the capacitor 1519 is connected to a wiring 1542. One of a source and a drain of the transistor 1513 is connected to the wiring 1544. The other of the source and the drain of the transistor 1513 is connected to one of a source and a drain of the transistor 1515. The other of the source and the drain of the transistor 1515 is connected to one electrode of the capacitor 1520 and a gate of the transistor 1510. The other electrode of the capacitor 1520 is connected to a wiring 1543. One of a source and a drain of the transistor 1510 is connected to a wiring 1541. The other of the source and the drain of the transistor 1510 is connected to one of a source and a drain of the transistor 1518. The other of the source and the drain of the transistor 1518 is connected to one of a source and a drain of the transistor 1509. The other of the source and the drain of the transistor 1509 is connected to one of a source and a drain of the transistor 1517 and the first memory circuit 1501. The other of the source and the drain of the transistor 1517 is connected to a wiring 1540. Although a gate of the transistor 1509 is connected to a gate of the transistor 1517 in FIG. 26, it is not necessarily connected to the gate of the transistor 1517.

The transistor described in the above embodiment as an example can be applied to the transistor 1515. Because of the low off-state current of the transistor 1515, the semiconductor device 1500 can retain data for a long time without power supply. The favorable switching characteristics of the transistor 1515 allow the semiconductor device 1500 to perform high-speed backup and recovery.

At least part of this embodiment can be implemented in combination with any of the other embodiments described in this specification as appropriate.

Embodiment 8

In this embodiment, display modules and electronic devices that include a display panel of one embodiment of the present invention are described with reference to FIGS. 27A to 27H.

FIGS. 27A to 27G illustrate electronic devices. These electronic devices can include a housing 5000, a display portion 5001, a speaker 5003, an LED lamp 5004, operation keys 5005 (including a power switch and an operation switch), a connection terminal 5006, a sensor 5007 (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared ray), a microphone 5008, and the like.

Figure 27A:
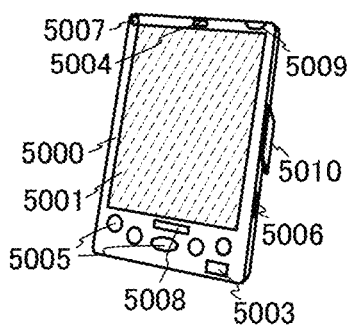
FIGS. 27A to 27H each illustrate a structure of an electronic device of an embodiment.
Figure 27B:
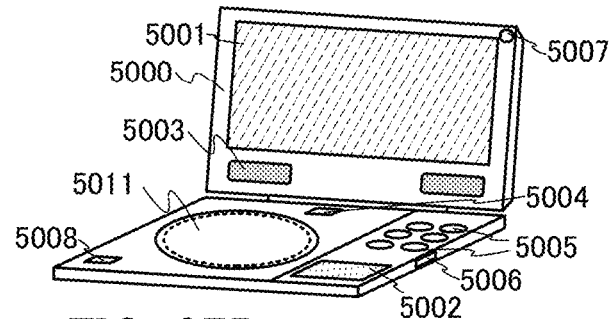
Figure 27C:
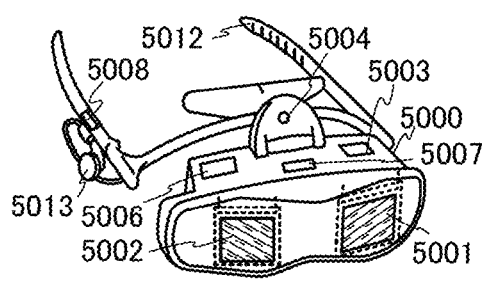
Figure 27D:
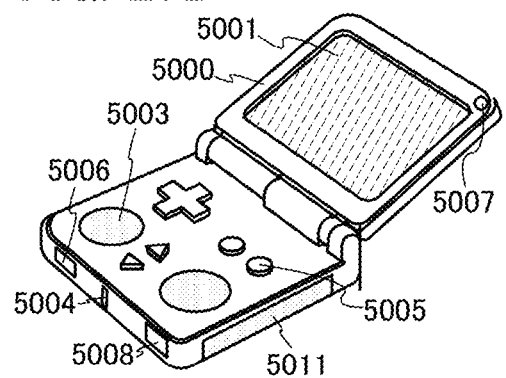
Figure 27E:
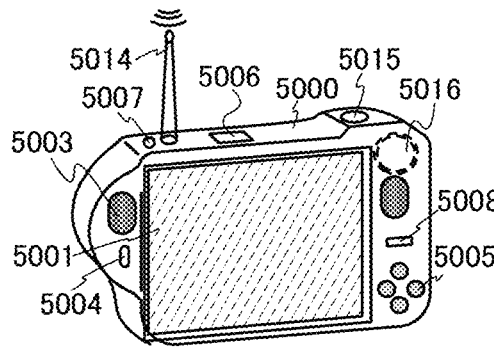
Figure 27F:
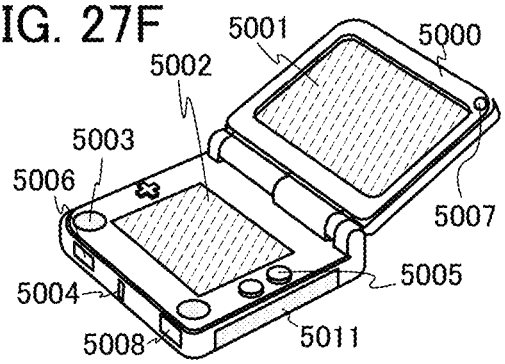
Figure 27G:
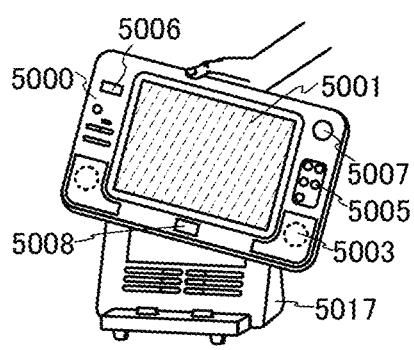

FIG. 27A illustrates a mobile computer that can include a switch 5009, an infrared port 5010, and the like in addition to the above components. FIG. 27B illustrates a portable image reproducing device (e.g., a DVD reproducing device) provided with a recording medium, and the portable image reproducing device can include a second display portion 5002, a recording medium reading portion 5011, and the like in addition to the above components. FIG. 27C illustrates a goggle-type display that can include the second display portion 5002, a support portion 5012, an earphone 5013, and the like in addition to the above components. FIG. 27D illustrates a portable game console that can include the recording medium reading portion 5011 and the like in addition to the above components. FIG. 27E illustrates a digital camera with a television reception function, and the digital camera can include an antenna 5014, a shutter button 5015, an image receiving portion 5016, and the like in addition to the above components. FIG. 27F illustrates a portable game console that can include the second display portion 5002, the recording medium reading portion 5011, and the like in addition to the above components. FIG. 27G illustrates a portable television receiver that can include a charger 5017 capable of transmitting and receiving signals, and the like in addition to the above components.

The electronic devices in FIGS. 27A to 27G can have a variety of functions such as a function of displaying a variety of information (e.g., a still image, a moving image, and a text image) on the display portion, a touch panel function, a function of displaying a calendar, date, time, and the like, a function of controlling processing with a variety of software (programs), a wireless communication function, a function of being connected to a variety of computer networks with a wireless communication function, a function of transmitting and receiving a variety of data with a wireless communication function, and a function of reading out a program or data stored in a recording medium and displaying it on the display portion. Furthermore, the electronic device including a plurality of display portions can have a function of displaying image information mainly on one display portion while displaying text information mainly on another display portion, a function of displaying a three-dimensional image by displaying images on a plurality of display portions with a parallax taken into account, or the like. Furthermore, the electronic device including an image receiving portion can have a function of shooting a still image, a function of taking moving images, a function of automatically or manually correcting a shot image, a function of storing a shot image in a recording medium (an external recording medium or a recording medium incorporated in the camera), a function of displaying a shot image on the display portion, or the like. Note that functions of the electronic devices in FIGS. 27A to 27G are not limited thereto, and the electronic devices can have a variety of functions.

Figure 27H:
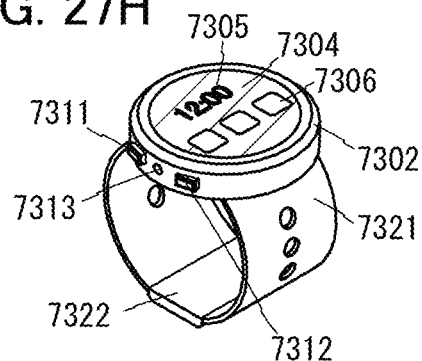

FIG. 27H illustrates a smart watch, which includes a housing 7302, a display panel 7304, operation buttons 7311 and 7312, a connection terminal 7313, a band 7321, a clasp 7322, and the like.

The display panel 7304 mounted in the housing 7302 serving as a bezel includes a non-rectangular display region. The display panel 7304 may have a rectangular display region. The display panel 7304 can display an icon 7305 indicating time, another icon 7306, and the like.

The smart watch in FIG. 27H can have a variety of functions such as a function of displaying a variety of information (e.g., a still image, a moving image, and a text image) on the display portion, a touch panel function, a function of displaying a calendar, date, time, and the like, a function of controlling processing with a variety of software (programs), a wireless communication function, a function of being connected to a variety of computer networks with a wireless communication function, a function of transmitting and receiving a variety of data with a wireless communication function, and a function of reading out a program or data stored in a recording medium and displaying it on the display portion.

The housing 7302 can include a speaker, a sensor (a sensor having a function of measuring force, displacement, position, speed, acceleration, angular velocity, rotational frequency, distance, light, liquid, magnetism, temperature, chemical substance, sound, time, hardness, electric field, current, voltage, electric power, radiation, flow rate, humidity, gradient, oscillation, odor, or infrared rays), a microphone, and the like. Note that the smart watch can be manufactured using the light-emitting element for the display panel 7304.

This embodiment can be combined with any of the other embodiments in this specification as appropriate.

Embodiment 9

In this embodiment, the composition and structure of an oxide semiconductor that can be used in one embodiment of the present invention are described with reference to FIGS. 30A to 30C, FIG. 31, FIG. 32, FIGS. 33A to 33E, FIGS. 34A to 34E, FIGS. 35A to 35D, FIGS. 36A and 36B, and FIG. 37.

<4-1. Composition of Oxide Semiconductor>

The composition of an oxide semiconductor is described below.

An oxide semiconductor preferably contains at least indium or zinc. In particular, indium and zinc are preferably contained. In addition, aluminum, gallium, yttrium, tin, or the like is preferably contained. Furthermore, one or more elements selected from boron, silicon, titanium, iron, nickel, germanium, zirconium, molybdenum, lanthanum, cerium, neodymium, hafnium, tantalum, tungsten, magnesium, or the like may be contained.

Here, the case where an oxide semiconductor contains indium, an element M, and zinc is considered. The element M is aluminum, gallium, yttrium, tin, or the like. Alternatively, the element M can be boron, silicon, titanium, iron, nickel, germanium, zirconium, molybdenum, lanthanum, cerium, neodymium, hafnium, tantalum, tungsten, magnesium, or the like. Note that two or more of the above elements may be used in combination as the element M.

First, preferred ranges of the atomic ratio of indium, the element M, and zinc contained in an oxide semiconductor according to an embodiment of the present invention are described with reference to FIGS. 30A to 30C. Note that the proportion of oxygen atoms is not shown. The terms of the atomic ratio of indium, the element M, and zinc contained in the oxide semiconductor are denoted by [In], [M], and [Zn], respectively.

Figure 30A:
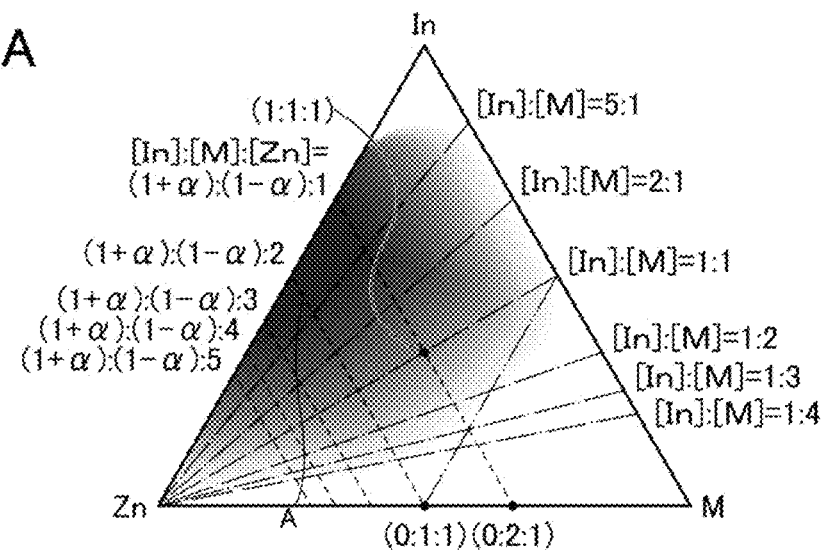
FIGS. 30A to 30C each illustrate an atomic ratio range of an oxide semiconductor.
Figure 30B:
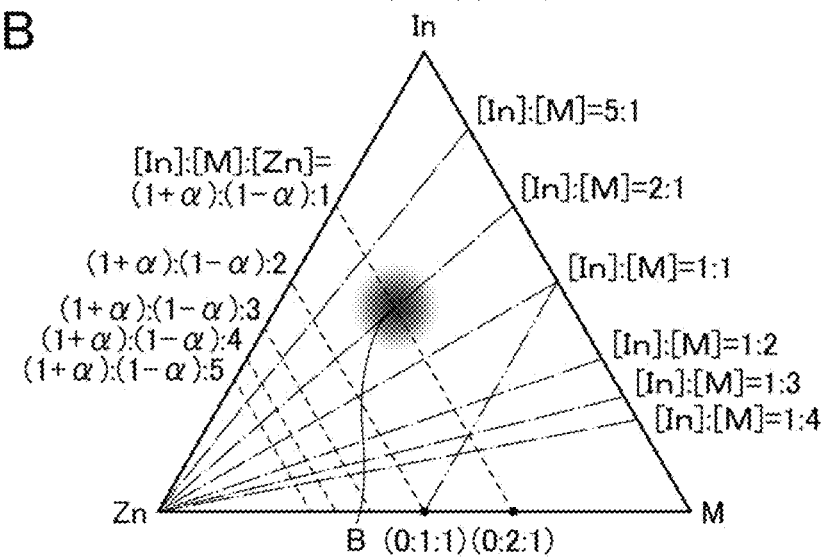
Figure 30C:
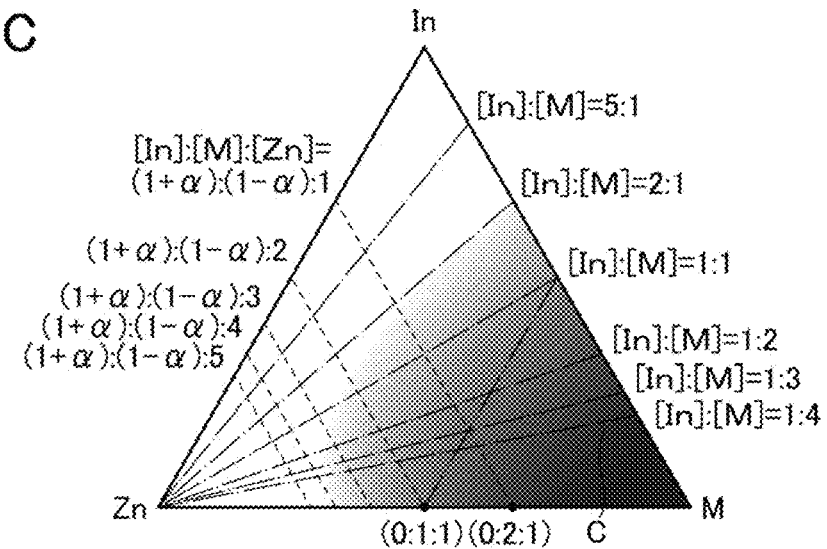

In FIGS. 30A to 30C, broken lines indicate a line where the atomic ratio [In]:[M]:[Zn] is $(1+\alpha):(1-\alpha):1$, where $-1 \le \alpha \le 1$, a line where the atomic ratio [In]:[M]:[Zn] is $(1+\alpha):(1-\alpha):2$, a line where the atomic ratio [In]:[M]:[Zn] is $(1+\alpha):(1-\alpha):3$, a line where the atomic ratio [In]:[M]:[Zn] is $(1+\alpha):(1-\alpha):4$, and a line where the atomic ratio [In]:[M]:[Zn] is $(1+\alpha):(1-\alpha):5$.

Dashed-dotted lines indicate a line where the atomic ratio [In]:[M]:[Zn] is $1:1:\beta$, where $\beta \ge 0$, a line where the atomic ratio [In]:[M]:[Zn] is $1:2:\beta$, a line where the atomic ratio [In]:[M]:[Zn] is $1:3:\beta$, a line where the atomic ratio [In]:[M]:[Zn] is $1:4:\beta$, a line where the atomic ratio [In]:[M]:[Zn] is $2:1:\beta$, and a line where the atomic ratio [In]:[M]:[Zn] is $5:1:\beta$.

FIGS. 30A and 30B show examples of the preferred ranges of the atomic ratio of indium, the element M, and zinc contained in an oxide semiconductor in one embodiment of the present invention.

Figure 31:
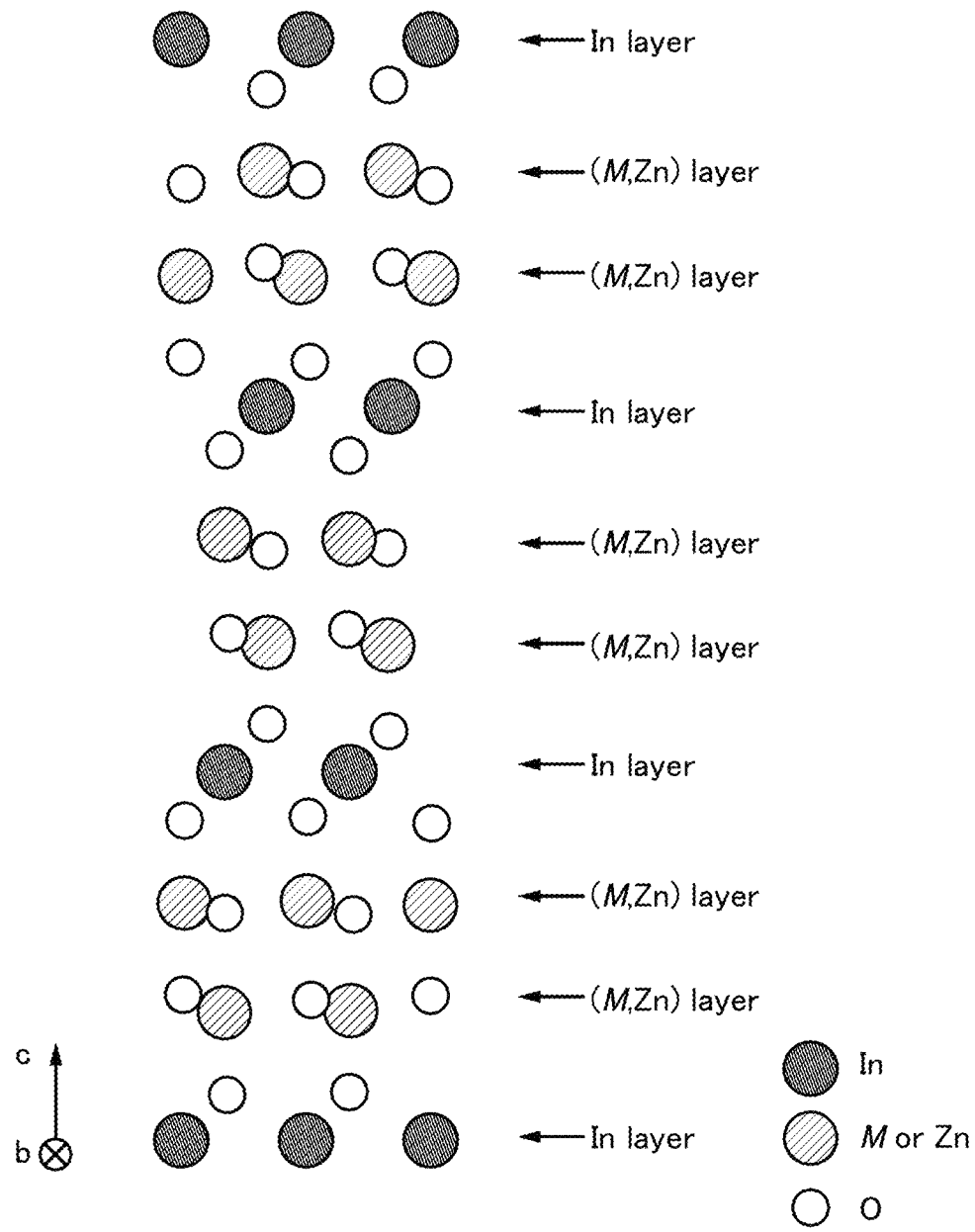
FIG. 31 illustrates an $InMZnO_4$ crystal.

FIG. 31 shows an example of the crystal structure of $InMZnO_4$ whose atomic ratio [In]:[M]:[Zn] is 1:1:1. The crystal structure shown in FIG. 31 is $InMZnO_4$ observed from a direction parallel to a b-axis. Note that a metal element in a layer that contains M, Zn, and oxygen (hereinafter, this layer is referred to as an "(M,Zn) layer") in FIG. 31 represents the element M or zinc. In that case, the proportion of the element M is the same as the proportion of zinc. The element M and zinc can be replaced with each other, and their arrangement is random.

$InMZnO_4$ has a layered crystal structure (also referred to as a layered structure) and includes one layer that contains indium and oxygen (hereinafter referred to as an In layer) for every two (M,Zn) layers that contain the element M, zinc, and oxygen, as shown in FIG. 31.

Indium and the element M can be replaced with each other. Thus, when the element M in the (M,Zn) layer is replaced with indium, the layer can also be referred to as an (In,M,Zn) layer. In that case, a layered structure that contains one In layer for every two (In,M,Zn) layers is obtained.

An oxide whose atomic ratio [In]:[M]:[Zn] is 1:1:2 has a layered structure that contains one In layer for every three (M,Zn) layers. In other words, if [Zn] is higher than [In] and [M], the proportion of the (M,Zn) layer to the In layer becomes higher when the oxide is crystallized.

Note that in the case where the number of (M,Zn) layers with respect to one In layer is not an integer in the oxide, the oxide might have a plurality of kinds of layered structures where the number of (M,Zn) layers with respect to one In layer is an integer. For example, in the case of [In]:[M]:[Zn]=1:1:1.5, the oxide may have a mix of a layered structure including one In layer for every two (M,Zn) layers and a layered structure including one In layer for every three (M,Zn) layers.

For example, in the case where the oxide is formed with a sputtering apparatus, a film having an atomic ratio deviated from the atomic ratio of a target is formed. In particular, [Zn] in the film might be smaller than [Zn] in the target depending on the substrate temperature in deposition.

A plurality of phases (e.g., two phases and three phases) exist in the oxide in some cases. For example, with an atomic ratio [In]:[M]:[Zn] that is close to 0:2:1, two phases of a spinel crystal structure and a layered crystal structure are likely to exist. In addition, with an atomic ratio [In]:[M]:[Zn] that is close to 1:0:0, two phases of a bixbyite crystal structure and a layered crystal structure are likely to exist. In the case where a plurality of phases exist in the oxide, a grain boundary might be formed between different crystal structures.

In addition, the oxide semiconductor containing indium in a higher proportion can have high carrier mobility (electron mobility). This is because in an oxide semiconductor containing indium, the element M, and zinc, the s orbital of heavy metal mainly contributes to carrier transfer, and when the indium content in the oxide semiconductor is increased, overlaps of the s orbitals of indium atoms are increased; Thus, an oxide semiconductor having a high content of indium has higher carrier mobility than an oxide semiconductor having a low content of indium.

In contrast, when the indium content and the zinc content in an oxide become lower, carrier mobility becomes lower. Thus, with atomic ratios of [In]:[M]:[Zn]=0:1:0 and in the vicinity thereof (e.g., a region C in FIG. 30C), insulation performance becomes better.

Accordingly, an oxide in one embodiment of the present invention preferably has an atomic ratio represented by a region A in FIG. 30A. With the atomic ratio, a layered structure with high carrier mobility and a few grain boundaries is easily obtained.

A region B in FIG. 30B represents an atomic ratio of [In]:[M]:[Zn]=4:2:3 or 4:2:4.1 and the vicinity thereof. The vicinity includes an atomic ratio of [In]:[M]:[Zn]=5:3:4. An oxide with an atomic ratio represented by the region B is an excellent oxide that has particularly high crystallinity and high carrier mobility.

Note that a condition where an oxide forms a layered structure is not uniquely determined by an atomic ratio. There is a difference in the degree of difficulty in forming a layered structure among atomic ratios. Even with the same atomic ratio, whether a layered structure is formed or not depends on a formation condition. Thus, the illustrated regions each represent an atomic ratio with which an oxide has a layered structure, and boundaries of the regions A to C are not clear.

<4-2. Carrier Density of Oxide Semiconductor>

Next, the carrier density of an oxide semiconductor will be described below.

Examples of a factor affecting the carrier density of an oxide semiconductor include oxygen vacancy ($V_O$) and impurities in the oxide semiconductor.

As the amount of oxygen vacancy in the oxide semiconductor increases, the density of defect states increases when hydrogen is bonded to the oxygen vacancy (this state is also referred to as $V_O H$). The density of defect states also increases with an increase in the amount of impurity in the oxide semiconductor. Hence, the carrier density of an oxide semiconductor can be controlled by controlling the density of defect states in the oxide semiconductor.

A transistor using the oxide semiconductor in a channel region will be described below.

The carrier density of the oxide semiconductor is preferably reduced in order to inhibit the negative shift of the threshold voltage of the transistor or reduce the off-state current of the transistor. In order to reduce the carrier density of the oxide semiconductor, the impurity concentration in the oxide semiconductor is reduced so that the density of defect states can be reduced. In this specification and the like, a state with a low impurity concentration and a low density of defect states is referred to as a highly purified intrinsic or substantially highly purified intrinsic state. The carrier density of a highly purified intrinsic oxide semiconductor is lower than $8\times10^{15}$ cm$^{-3}$, preferably lower than $1\times10^{11}$ cm$^{-3}$, and further preferably lower than $1\times10^{10}$ cm$^{-3}$ and is higher than or equal to $1\times10^{-9}$ cm$^{-3}$.

In contrast, the carrier density of the oxide semiconductor is preferably increased in order to improve the on-state current of the transistor or improve the field-effect mobility of the transistor. In order to increase the carrier density of the oxide semiconductor, the impurity concentration or the density of defect states in the oxide semiconductor is slightly increased. Alternatively, the bandgap of the oxide semiconductor is preferably narrowed. For example, an oxide semiconductor that has a slightly high impurity concentration or a slightly high density of defect states in the range where a favorable on/off ratio is obtained in the $I_d$-$V_g$ characteristics of the transistor can be regarded as substantially intrinsic. Furthermore, an oxide semiconductor that has a high electron affinity and thus has a narrow bandgap so as to increase the density of thermally excited electrons (carriers) can be regarded as substantially intrinsic. Note that a transistor using an oxide semiconductor with higher electron affinity has lower threshold voltage.

The oxide semiconductor with an increased carrier density has somewhat n-type conductivity; thus, it can be referred to as a "slightly-n" oxide semiconductor.

The carrier density of a substantially intrinsic oxide semiconductor is preferably higher than or equal to $1\times10^5$ cm$^{-3}$ and lower than $1\times10^{18}$ cm$^{-3}$, further preferably higher than or equal to $1\times10^7$ cm$^{-3}$ and lower than or equal to $1\times10^{17}$ cm$^{-3}$, still further preferably higher than or equal to $1\times10^9$ cm$^{-3}$ and lower than or equal to $5\times10^{16}$ cm$^{-3}$, yet further preferably higher than or equal to $1\times10^{10}$ cm$^{-3}$ and lower than or equal to $1\times10^{16}$ cm$^{-3}$, and yet still preferably higher than or equal to $1\times10^{11}$ cm$^{-3}$ and lower than or equal to $1\times10^{15}$ cm$^{-3}$.

Figure 32:
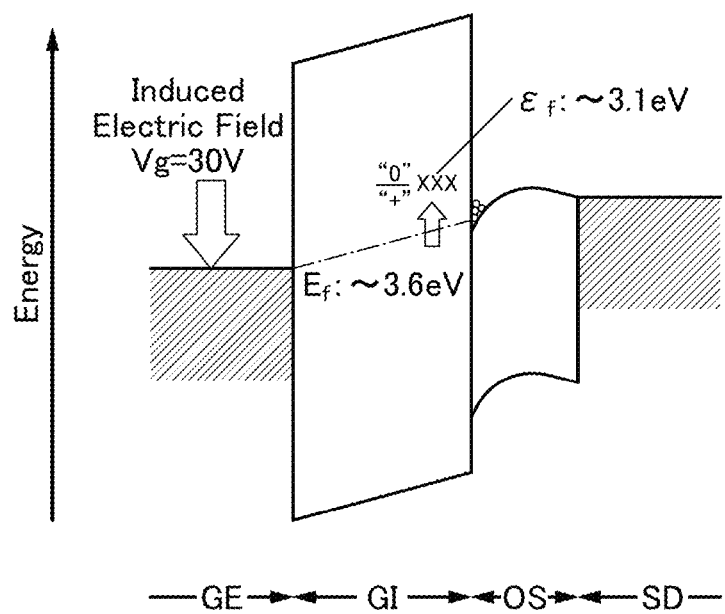
FIG. 32 illustrates an energy band diagram of a transistor including an oxide semiconductor in a channel region.

The use of the substantially intrinsic oxide semiconductor may improve the reliability of a transistor. Here, the reason why the reliability of a transistor in which the oxide semiconductor is used for a channel region is described with reference to FIG. 32. FIG. 32 is an energy band diagram of the transistor in which the oxide semiconductor is used for the channel region.

In FIG. 32, GE, GI, OS, and SD refer to a gate electrode, a gate insulating film, an oxide semiconductor, and a source/drain electrode, respectively. In other words, FIG. 32 shows an example of energy bands of the gate electrode, the gate insulating film, the oxide semiconductor, and the source/drain electrode in contact with the oxide semiconductor.

In FIG. 32, a silicon oxide film and an In—Ga—Zn oxide are used for the gate insulating film and the oxide semiconductor, respectively. The transition level ($\epsilon f$) of a defect that might be formed in the silicon oxide film is assumed to be formed at a position approximately 3.1 eV away from the conduction band minimum of the gate insulating film. Furthermore, the Fermi level (Ef) of the silicon oxide film at the interface between the oxide semiconductor and the silicon oxide film when the gate voltage (Vg) is 30 V is assumed to be formed at a position approximately 3.6 eV away from the conduction band minimum of the gate insulating film. Note that the Fermi level of the silicon oxide film changes depending on the gate voltage. For example, the Fermi level (Ef) of the silicon oxide film at the interface between the oxide semiconductor and the silicon oxide film is lowered as the gate voltage is increased. A white circle and x in FIG. 32 represent an electron (carrier) and a defect state in the silicon oxide film, respectively.

As shown in FIG. 32, when thermal excitation of carriers occurs during the application of a gate voltage, the carriers are trapped by the defect states (x in the diagram) and the charge state of the defect states is changed from positive ("+") to neutral ("0"). In other words, when the value obtained by adding the thermal excitation energy to the Fermi level (Ef) of the silicon oxide film becomes greater than the transition level (εf) of a defect, the charge state of the defect states in the silicon oxide film is changed from positive to neutral, so that the threshold voltage of the transistor shifts in the positive direction.

When the oxide semiconductor is replaced with another oxide semiconductor with higher electron affinity, the Fermi level of the interface between the gate insulating film and the oxide semiconductor might be changed. When an oxide semiconductor with different electron affinity is used as described above, the conduction band minimum of the gate insulating film becomes relatively high at the interface between the gate insulating film and the oxide semiconductor or in the vicinity of the interface. In that case, the defect state (x in FIG. 32) which might be formed in the gate insulating film also becomes relatively high, so that the energy difference between the Fermi level of the gate insulating film and the Fermi level of the oxide semiconductor is increased. The increase in energy difference leads to a reduction in the amount of charge trapped in the gate insulating film. For example, a change in the charge state of the defect state which might be formed in the silicon oxide film becomes smaller, so that to change in the threshold voltage of the transistor by gate bias temperature (GBT) stress can be reduced.

Note that when the oxide semiconductor is used for a channel region of a transistor, carrier scattering or the like at a grain boundary can be reduced; thus, the transistor can have high field-effect mobility. In addition, the transistor can have high reliability.

Charge trapped by the defect states in the oxide semiconductor takes a long time to be released and may behave like fixed charge. Thus, the transistor in which a channel region is formed in the oxide semiconductor and which has a high impurity concentration and a high density of defect states might have unstable electrical characteristics.

To obtain stable electrical characteristics of the transistor, it is effective to reduce the concentration of impurities in the oxide semiconductor. In order to reduce the concentration of impurities in the oxide semiconductor, the concentration of impurities in a film which is adjacent to the oxide semiconductor is preferably reduced. As examples of the impurities, hydrogen, nitrogen, alkali metal, alkaline earth metal, iron, nickel, silicon, and the like are given.

<4-3. Structure of Oxide Semiconductor>

Next, the structure of an oxide semiconductor is described.

An oxide semiconductor is classified into a single-crystal oxide semiconductor and a non-single-crystal oxide semiconductor. Examples of the non-single-crystal oxide semiconductor include a c-axis aligned crystalline oxide semiconductor (CAAC-OS), a polycrystalline oxide semiconductor, a nanocrystalline oxide semiconductor (nc-OS), an amorphous-like oxide semiconductor (a-like OS), and an amorphous oxide semiconductor.

From another perspective, an oxide semiconductor is classified into an amorphous oxide semiconductor and a crystalline oxide semiconductor. Examples of the crystalline oxide semiconductor include a single-crystal oxide semiconductor, a CAAC-OS, a polycrystalline oxide semiconductor, and an nc-OS.

An amorphous structure is generally thought to be isotropic and have no non-uniform structure, to be metastable and have no fixed atomic arrangement, to have a flexible bond angle, and to have a short-range order but have no long-range order, for example.

In other words, a stable oxide semiconductor cannot be regarded as a completely amorphous oxide semiconductor. Moreover, an oxide semiconductor that is not isotropic (e.g., an oxide semiconductor that has a periodic structure in a microscopic region) cannot be regarded as a completely amorphous oxide semiconductor. In contrast, an a-like OS, which is not isotropic, has an unstable structure that contains a void. Because of its instability, an a-like OS has physical properties similar to those of an amorphous oxide semiconductor.

[CAAC-OS]

First, a CAAC-OS is described.

A CAAC-OS is one of oxide semiconductors and has a plurality of c-axis aligned crystal parts (also referred to as pellets).

Figure 33A:
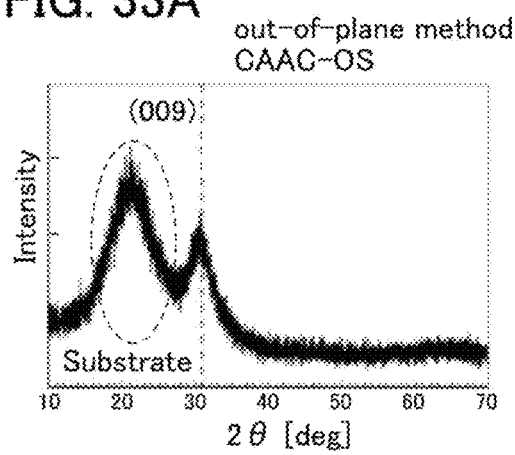
FIGS. 33A to 33E show structural analyses of a CAAC-OS and a single crystal oxide semiconductor by XRD and selected-area electron diffraction patterns of a CAAC-OS.

Analysis of a CAAC-OS by X-ray diffraction (XRD) is described. For example, when the structure of a CAAC-OS including an $InGaZnO_4$ crystal, which is classified into the space group R–3m, is analyzed by an out-of-plane method, a peak appears at a diffraction angle (2θ) of around 31° as shown in FIG. 33A. This peak is derived from the (009) plane of the $InGaZnO_4$ crystal, which indicates that crystals in the CAAC-OS have c-axis alignment and that the c-axes are aligned in the direction substantially perpendicular to a surface over which the CAAC-OS film is formed (also referred to as a formation surface) or a top surface of the CAAC-OS film. A peak sometimes appears at 2θ of around 36° in addition to the peak at 2θ of around 31°. The peak at 2θ of around 36° is attributed to a crystal structure classified into the space group Fd–3m; thus, this peak is preferably not exhibited in the CAAC-OS.

Figure 33B:
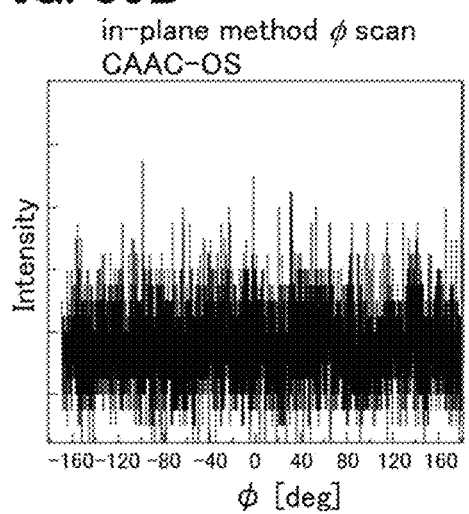
Figure 33C:
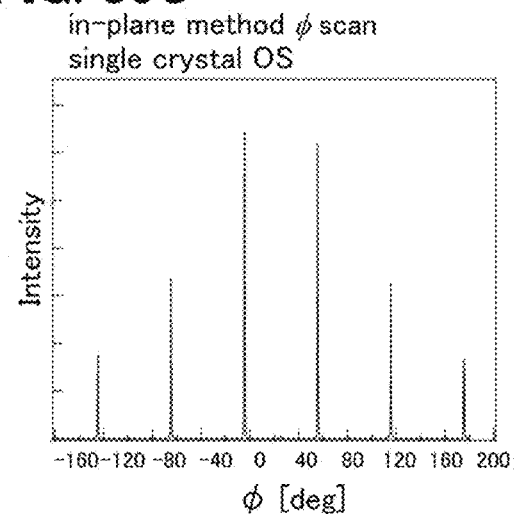
Figure 33D:
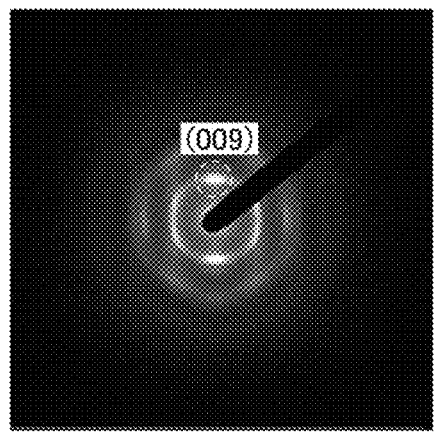

On the other hand, in structural analysis of the CAAC-OS by an in-plane method in which an X-ray is incident on the CAAC-OS in the direction parallel to the formation surface, a peak appears at 2θ of around 56°. This peak is derived from the (110) plane of the $InGaZnO_4$ crystal. When analysis (φ scan) is performed with 2θ fixed at around 56° while the sample is rotated around a normal vector to the sample surface as an axis (φ axis), as shown in FIG. 33B, a peak is not clearly observed. In contrast, in the case where single-crystal $InGaZnO_4$ is subjected to φ scan with 2θ fixed at around 56°, as shown in FIG. 33C, six peaks which are derived from crystal planes equivalent to the (110) plane are observed. Accordingly, the structural analysis using XRD shows that the directions of the a-axes and b-axes are irregularly oriented in the CAAC-OS.

Figure 33E:
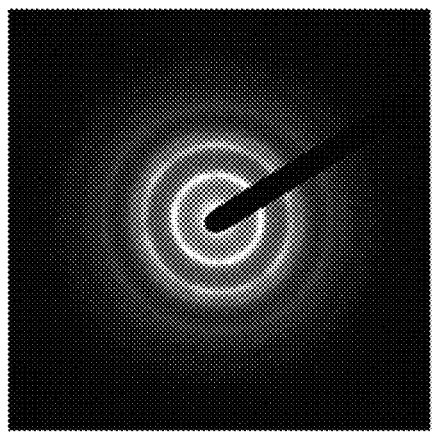

Next, a CAAC-OS analyzed by electron diffraction is described. For example, when an electron beam with a probe diameter of 300 nm is incident on a CAAC-OS including an $InGaZnO_4$ crystal in the direction parallel to the formation surface of the CAAC-OS, a diffraction pattern (also referred to as a selected-area electron diffraction pattern) in FIG. 33D can be obtained. This diffraction pattern includes spots derived from the (009) plane of the $InGaZnO_4$ crystal. Thus, the results of electron diffraction also indicate that pellets included in the CAAC-OS have c-axis alignment and that the c-axes are aligned in the direction substantially perpendicular to the formation surface or the top surface of the CAAC-OS. Meanwhile, FIG. 33E shows a diffraction pattern obtained in such a manner that an electron beam with a probe diameter of 300 nm is incident on the same sample in the direction perpendicular to the sample surface. In FIG. 33E, a ring-like diffraction pattern is observed. Thus, the results of electron diffraction using an electron beam with a probe diameter of 300 nm also indicate that the a-axes and b-axes of the pellets included in the CAAC-OS do not have regular alignment. The first ring in FIG. 33E is derived from the (010) plane, the (100) plane, and the like of the InGaZnO$_4$ crystal. The second ring in FIG. 33E is derived from the (110) plane and the like.

In a combined analysis image (also referred to as a high-resolution transmission electron microscope (TEM) image) of a bright-field image and a diffraction pattern of a CAAC-OS, which is obtained using a TEM, a plurality of pellets can be observed. However, even in the high-resolution TEM image, a boundary between pellets, that is, a grain boundary is not clearly observed in some cases. Thus, in the CAAC-OS, a reduction in electron mobility due to the grain boundary is less likely to occur.

Figure 34A:
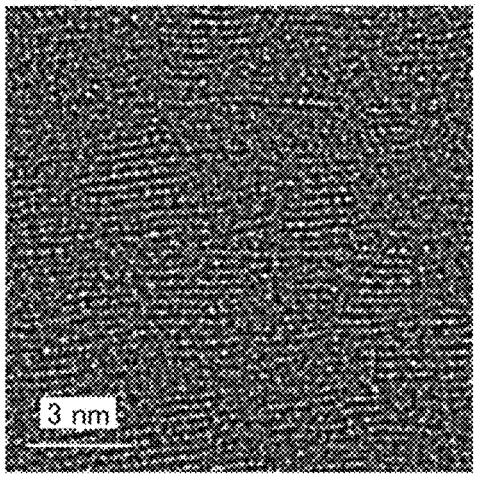
FIGS. 34A to 34E show a cross-sectional TEM image and plan-view TEM images of a CAAC-OS and images obtained through analysis thereof.

FIG. 34A shows a high-resolution TEM image of a cross section of the CAAC-OS which is observed in the direction substantially parallel to the sample surface. The high-resolution TEM image is obtained with a spherical aberration corrector function. The high-resolution TEM image obtained with a spherical aberration corrector function is particularly referred to as a Cs-corrected high-resolution TEM image. The Cs-corrected high-resolution TEM image can be observed with, for example, an atomic resolution analytical electron microscope JEM-ARM200F manufactured by JEOL Ltd.

FIG. 34A shows pellets in which metal atoms are arranged in a layered manner. FIG. 34A proves that the size of a pellet is greater than or equal to 1 nm or greater than or equal to 3 nm. Therefore, the pellet can also be referred to as a nanocrystal (nc). Furthermore, the CAAC-OS can also be referred to as an oxide semiconductor including c-axis aligned nanocrystals (CANC). A pellet reflects unevenness of a formation surface or a top surface of the CAAC-OS and is parallel to the formation surface or the top surface of the CAAC-OS.

Figure 34B:
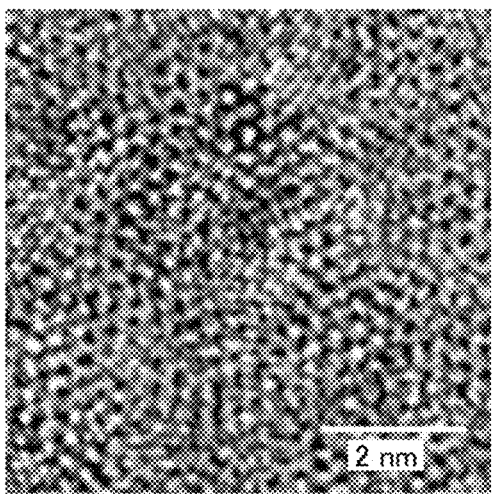
Figure 34C:
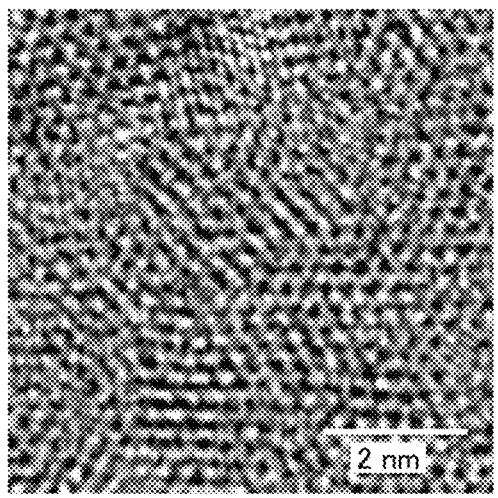
Figure 34D:
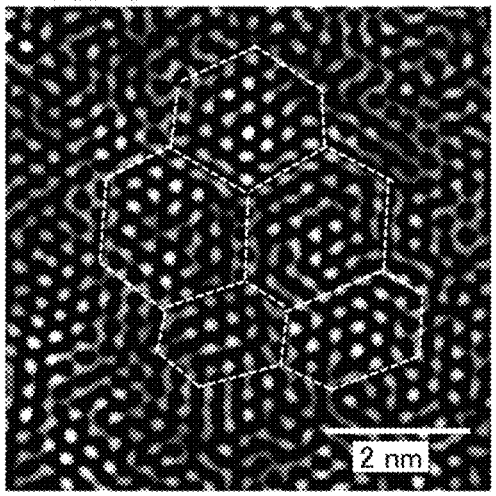
Figure 34E:
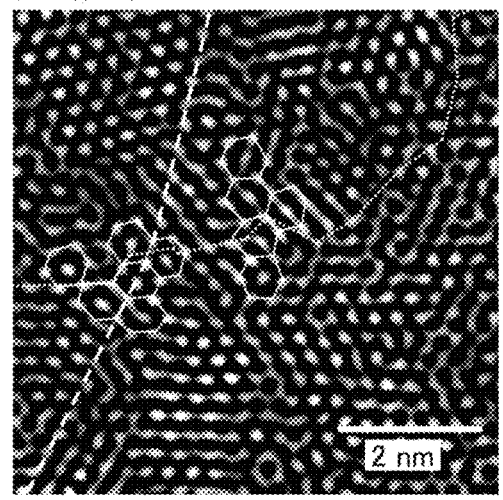

FIGS. 34B and 34C show Cs-corrected high-resolution TEM images of a plane of the CAAC-OS observed in the direction substantially perpendicular to the sample surface. FIGS. 34D and 34E are images obtained by image processing of FIGS. 34B and 34C. The method of image processing is as follows. The image in FIG. 34B is subjected to fast Fourier transform (FFT) to obtain an FFT image. Then, mask processing is performed on the obtained FFT image such that part in the range of 2.8 nm$^{-1}$ to 5.0 nm$^{-1}$ from the reference point is left. After the mask processing, the FFT image is subjected to inverse fast Fourier transform (IFFT) to obtain a processed image. The image obtained in this manner is referred to as an FFT filtering image. The FFT filtering image is a Cs-corrected high-resolution TEM image from which a periodic component is extracted and shows a lattice arrangement.

In FIG. 34D, a portion in which the lattice arrangement is broken is shown by dashed lines. A region surrounded by dashed lines corresponds to one pellet. The portion denoted by the dashed lines is a junction of pellets. The dashed lines draw a hexagon, which means that the pellet has a hexagonal shape. Note that the shape of the pellet is not always a regular hexagon but is a non-regular hexagon in many cases.

In FIG. 34E, a dotted line denotes a portion between a region where a lattice arrangement is well aligned and another region where a lattice arrangement is well aligned, and dashed lines denote the directions of the lattice arrangements. A clear crystal grain boundary cannot be observed even in the vicinity of the dotted line. When a lattice point in the vicinity of the dotted line is regarded as a center and surrounding lattice points are joined, a distorted hexagon, a distorted pentagon, or a distorted heptagon can be formed, for example. That is, a lattice arrangement is distorted so that formation of a crystal grain boundary is inhibited. This is probably because the CAAC-OS can tolerate distortion owing to a low density of arrangement of oxygen atoms in an a-b plane direction, the interatomic bond distance changed by substitution of a metal element, and the like.

As described above, the CAAC-OS has c-axis alignment, its pellets (nanocrystals) are connected in the a-b plane direction, and its crystal structure has distortion. For this reason, the CAAC-OS can also be referred to as an oxide semiconductor including a c-axis-aligned a-b-plane-anchored (CAA) crystal.

The CAAC-OS is an oxide semiconductor with high crystallinity. Entry of impurities, formation of defects, or the like might decrease the crystallinity of an oxide semiconductor. This means that the CAAC-OS has few impurities and defects (e.g., oxygen vacancies).

Note that an impurity means an element other than the main components of an oxide semiconductor, such as hydrogen, carbon, silicon, or a transition metal element. For example, an element (e.g., silicon) having stronger bonding force to oxygen than a metal element constituting a part of an oxide semiconductor extracts oxygen from the oxide semiconductor, which results in a disordered atomic arrangement and reduced crystallinity of the oxide semiconductor. A heavy metal such as iron or nickel, argon, carbon dioxide, or the like has a large atomic radius (or molecular radius), and thus disturbs the atomic arrangement of the oxide semiconductor and decreases crystallinity.

[nc-OS]

Next, an nc-OS is described.

Analysis of an nc-OS by XRD is described. When the structure of an nc-OS is analyzed by an out-of-plane method, a peak indicating orientation does not appear. That is, a crystal of an nc-OS does not have orientation.

Figure 35A:
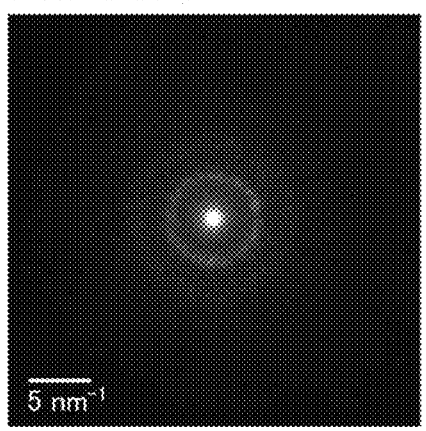
FIGS. 35A to 35D show electron diffraction patterns and a cross-sectional TEM image of an nc-OS.
Figure 35B:
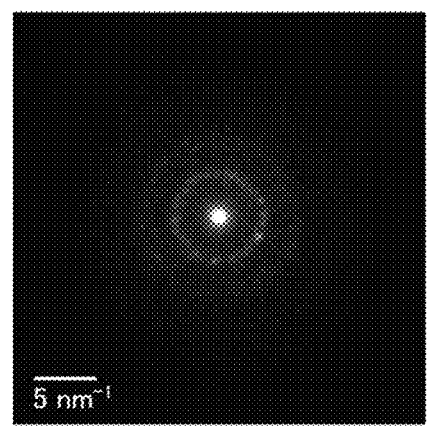

For example, when an electron beam with a probe diameter of 50 nm is incident on a 34-nm-thick region of a thinned nc-OS including an InGaZnO$_4$ crystal in the direction parallel to the formation surface, a ring-like diffraction pattern (nanobeam electron diffraction pattern) shown in FIG. 35A is observed. FIG. 35B shows a diffraction pattern (nanobeam electron diffraction pattern) obtained when an electron beam with a probe diameter of 1 nm is incident on the same sample. In FIG. 35B, a plurality of spots are observed in a ring-like region. Thus, ordering in an nc-OS is not observed with an electron beam with a probe diameter of 50 nm but is observed with an electron beam with a probe diameter of 1 nm.

Figure 35C:
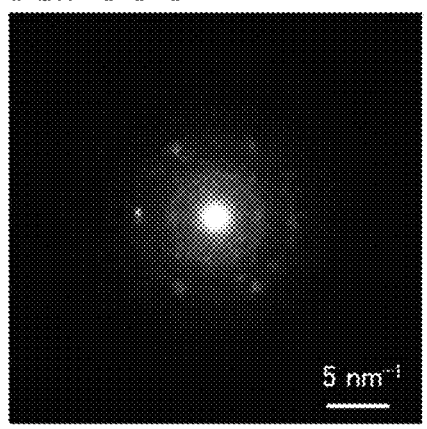

When an electron beam with a probe diameter of 1 nm is incident on a region with a thickness less than 10 nm, an electron diffraction pattern in which spots are arranged in an approximately regular hexagonal shape as shown in FIG. 35C is observed in some cases. This means that an nc-OS has a well-ordered region, that is, a crystal, in the thickness range of less than 10 nm. Note that an electron diffraction pattern having regularity is not observed in some regions because crystals are aligned in various directions.

Figure 35D:
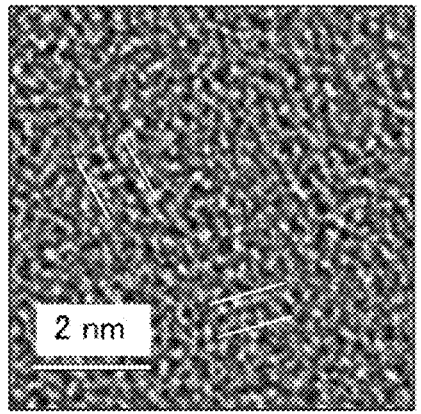

FIG. 35D shows a Cs-corrected high-resolution TEM image of a cross section of an nc-OS observed in the direction substantially parallel to the formation surface. In the high-resolution TEM image, the nc-OS has a region in which a crystal part is observed as indicated by additional lines and a region in which a crystal part is not clearly observed. In most cases, the size of a crystal part included in the nc-OS is greater than or equal to 1 nm and less than or equal to 10 nm, specifically greater than or equal to 1 nm and less than or equal to 3 nm. Note that an oxide semiconductor including a crystal part whose size is greater than 10 nm and less than or equal to 100 nm may be referred to as a microcrystalline oxide semiconductor.

In a high-resolution TEM image of the nc-OS, for example, a grain boundary is not clearly observed in some cases. Note that there is a possibility that the origin of the nanocrystal is the same as that of a pellet in a CAAC-OS. Therefore, a crystal part of the nc-OS may be referred to as a pellet in the following description.

As described above, in the nc-OS, a microscopic region (for example, a region with a size greater than or equal to 1 nm and less than or equal to 10 nm, in particular, a region with a size greater than or equal to 1 nm and less than or equal to 3 nm) has a periodic atomic arrangement. There is no regularity of crystal orientation between different pellets in the nc-OS. Thus, the orientation of the whole film is not observed. Accordingly, in some cases, the nc-OS cannot be distinguished from an a-like OS or an amorphous oxide semiconductor, depending on an analysis method.

Since there is no regularity of crystal orientation between the pellets (nanocrystals), the nc-OS can also be referred to as an oxide semiconductor including random aligned nanocrystals (RANC) or an oxide semiconductor including non-aligned nanocrystals (NANC).

The nc-OS is an oxide semiconductor that has higher regularity than an amorphous oxide semiconductor. Therefore, the nc-OS has a lower density of defect states than the a-like OS and the amorphous oxide semiconductor. Note that there is no regularity of crystal orientation between different pellets in the nc-OS. Therefore, the nc-OS has a higher density of defect states than the CAAC-OS.

[a-Like OS]

An a-like OS has a structure between the structure of an nc-OS and the structure of an amorphous oxide semiconductor.

Figure 36A:
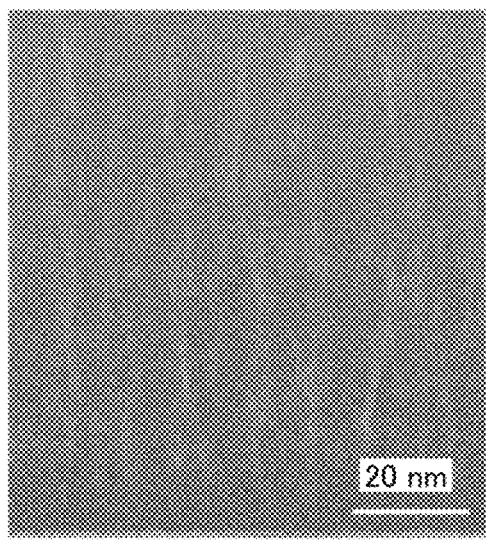
FIGS. 36A and 36B show cross-sectional TEM images of an a-like OS.
Figure 36B:
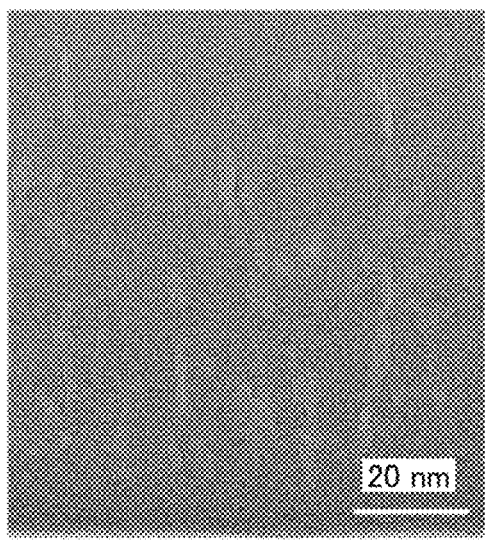

FIGS. 36A and 36B show high-resolution cross-sectional TEM images of an a-like OS. The high-resolution cross-sectional TEM image of the a-like OS in FIG. 36A is taken at the start of the electron irradiation. The high-resolution cross-sectional TEM image of the a-like OS in FIG. 36B is taken after the irradiation with electrons ($e^-$) at $4.3 \times 10^8$ $e^-/nm^2$. FIGS. 36A and 36B show that striped bright regions extending vertically are observed in the a-like OS from the start of the electron irradiation. It can be also found that the shape of the bright region changes after the electron irradiation. Note that the bright region is presumably a void or a low-density region.

The a-like OS has an unstable structure because it contains a void. To verify that an a-like OS has an unstable structure as compared with a CAAC-OS and an nc-OS, a change in structure caused by electron irradiation is described below.

An a-like OS, an nc-OS, and a CAAC-OS are prepared as samples. Each of the samples is an In—Ga—Zn oxide.

First, a high-resolution cross-sectional TEM image of each sample is obtained. The high-resolution cross-sectional TEM images show that all the samples have crystal parts.

It is known that a unit cell of an InGaZnO$_4$ crystal has a structure in which nine layers including three In—O layers and six Ga—Zn—O layers are stacked in the c-axis direction. The distance between the adjacent layers is equivalent to the lattice spacing on the (009) plane (also referred to as d value). The value is calculated to be 0.29 nm from crystal structural analysis. Accordingly, a portion in which the spacing between lattice fringes is greater than or equal to 0.28 nm and less than or equal to 0.30 nm is regarded as a crystal part of InGaZnO$_4$ in the following description. Each lattice fringe corresponds to the a-b plane of the InGaZnO$_4$ crystal.

Figure 37:
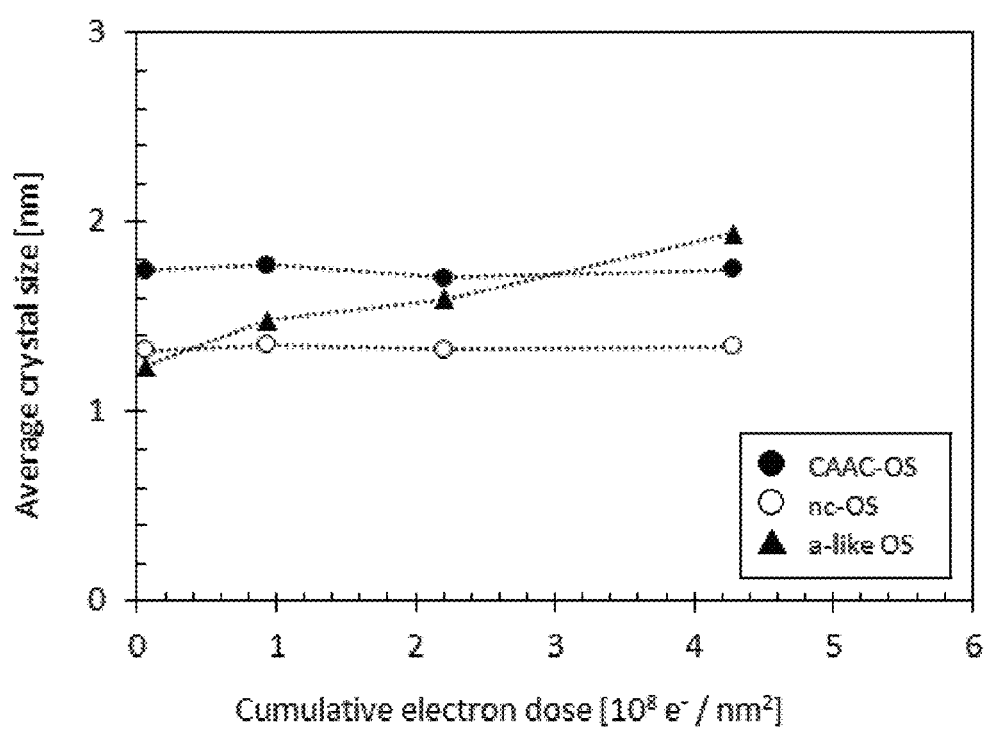
FIG. 37 shows a change in crystal part of an In—Ga—Zn oxide induced by electron irradiation.

FIG. 37 shows a change in the average size of crystal parts (at 22 points to 30 points) in each sample. Note that the crystal part size corresponds to the length of a lattice fringe. FIG. 37 indicates that the crystal part size in the a-like OS increases with an increase in the cumulative electron dose in obtaining TEM images, for example. As shown in FIG. 37, a crystal part with a size of approximately 1.2 nm (also referred to as an initial nucleus) at the start of TEM observation grows to a size of approximately 1.9 nm at a cumulative electron ($e^-$) dose of $4.2 \times 10^8$ $e^-/nm^2$. In contrast, the crystal part sizes in the nc-OS and the CAAC-OS show few changes from the start of electron irradiation to a cumulative electron dose of $4.2 \times 10^8$ $e^-/nm^2$. As shown in FIG. 37, the crystal part sizes in the nc-OS and the CAAC-OS are approximately 1.3 nm and approximately 1.8 nm, respectively, regardless of the cumulative electron dose. For the electron beam irradiation and TEM observation, a Hitachi H-9000NAR transmission electron microscope was used. The conditions of the electron beam irradiation were as follows: the accelerating voltage was 300 kV; the current density was $6.7 \times 10^5$ $e^-/(nm^2 \cdot s)$; and the diameter of an irradiation region was 230 nm.

In this manner, growth of the crystal part in the a-like OS may be induced by electron irradiation. In contrast, in the nc-OS and the CAAC-OS, growth of the crystal part is hardly induced by electron irradiation. That is, the a-like OS has an unstable structure as compared with the nc-OS and the CAAC-OS.

The a-like OS has a lower density than the nc-OS and the CAAC-OS because it contains a void. Specifically, the density of the a-like OS is higher than or equal to 78.6% and lower than 92.3% of the density of the single-crystal oxide semiconductor having the same composition. The density of the nc-OS and the density of the CAAC-OS are each higher than or equal to 92.3% and lower than 100% of the density of the single-crystal oxide semiconductor having the same composition. It is difficult to deposit an oxide semiconductor having a density lower than 78% of the density of the single-crystal oxide semiconductor.

For example, in the case of an oxide semiconductor whose atomic ratio of In to Ga to Zn is 1:1:1, the density of single-crystal InGaZnO$_4$ with a rhombohedral crystal structure is 6.357 g/cm$^3$. Accordingly, in the case of the oxide semiconductor whose atomic ratio of In to Ga to Zn is 1:1:1, the density of the a-like OS is higher than or equal to 5.0 g/cm$^3$ and lower than 5.9 g/cm$^3$, for example. In the case of the oxide semiconductor whose atomic ratio of In to Ga to Zn is 1:1:1, the density of the nc-OS and the density of the CAAC-OS are each higher than or equal to 5.9 g/cm$^3$ and lower than 6.3 g/cm$^3$, for example.

In the case where an oxide semiconductor having a certain composition does not exist in a single-crystal state, single-crystal oxide semiconductors with different compositions are combined at an adequate ratio, which makes it possible to calculate a density equivalent to that of a single-crystal oxide semiconductor with the desired composition. The density of a single-crystal oxide semiconductor having the desired composition may be calculated using a weighted average with respect to the combination ratio of the single-crystal oxide semiconductors with different compositions. Note that it is preferable to use as few kinds of single-crystal oxide semiconductors as possible to calculate the density.

As described above, oxide semiconductors have various structures and various properties. Note that an oxide semiconductor may be a stacked film including two or more of an amorphous oxide semiconductor, an a-like OS, an nc-OS, and a CAAC-OS, for example.

The structure described in this embodiment can be used in appropriate combination with any of the structures described in the other embodiments.

For example, in this specification and the like, an explicit description "X and Y are connected" means that X and Y are electrically connected, X and Y are functionally connected, and X and Y are directly connected. Accordingly, without being limited to a predetermined connection relationship, for example, a connection relationship shown in drawings or texts, another connection relationship is included in the drawings or the texts.

Here, X and Y each denote an object (e.g., a device, an element, a circuit, a wiring, an electrode, a terminal, a conductive film, or a layer).

Examples of the case where X and Y are directly connected include the case where an element that allows an electrical connection between X and Y (e.g., a switch, a transistor, a capacitor, an inductor, a resistor, a diode, a display element, a light-emitting element, or a load) is not connected between X and Y, and the case where X and Y are connected without the element that allows the electrical connection between X and Y provided therebetween.

For example, in the case where X and Y are electrically connected, one or more elements that enable an electrical connection between X and Y (e.g., a switch, a transistor, a capacitor, an inductor, a resistor, a diode, a display element, a light-emitting element, or a load) can be connected between X and Y. Note that the switch is controlled to be turned on or off. That is, the switch is conducting or not conducting (is turned on or off) to determine whether current flows therethrough or not. Alternatively, the switch has a function of selecting and changing a current path. Note that the case where X and Y are electrically connected includes the case where X and Y are directly connected.

For example, in the case where X and Y are functionally connected, one or more circuits that enable a functional connection between X and Y (e.g., a logic circuit such as an inverter, a NAND circuit, or a NOR circuit; a signal converter circuit such as a D/A converter circuit, an A/D converter circuit, or a gamma correction circuit; a potential level converter circuit such as a power supply circuit (e.g., a step-up circuit or a step-down circuit) or a level shifter circuit for changing the potential level of a signal; a voltage source; a current source; a switching circuit; an amplifier circuit such as a circuit that can increase signal amplitude, the amount of current, or the like, an operational amplifier, a differential amplifier circuit, a source follower circuit, and a buffer circuit; a signal generation circuit; a memory circuit; or a control circuit) can be connected between X and Y. For example, even when another circuit is interposed between X and Y, X and Y are functionally connected if a signal output from X is transmitted to Y. Note that the case where X and Y are functionally connected includes the case where X and Y are directly connected and the case where X and Y are electrically connected.

Note that in this specification and the like, an explicit description "X and Y are electrically connected" means that X and Y are electrically connected (i.e., the case where X and Y are connected with another element or another circuit provided therebetween), X and Y are functionally connected (i.e., the case where X and Y are functionally connected with another circuit provided therebetween), and X and Y are directly connected (i.e., the case where X and Y are connected without another element or another circuit provided therebetween). That is, in this specification and the like, the explicit description "X and Y are electrically connected" is the same as the description "X and Y are connected".

For example, any of the following expressions can be used for the case where a source (or a first terminal or the like) of a transistor is electrically connected to X through (or not through) Z1 and a drain (or a second terminal or the like) of the transistor is electrically connected to Y through (or not through) Z2, or the case where a source (or a first terminal or the like) of a transistor is directly connected to one part of Z1 and another part of Z1 is directly connected to X while a drain (or a second terminal or the like) of the transistor is directly connected to one part of Z2 and another part of Z2 is directly connected to Y.

Examples of the expressions include, "X, Y, a source (or a first terminal or the like) of a transistor, and a drain (or a second terminal or the like) of the transistor are electrically connected to each other, and X, the source (or the first terminal or the like) of the transistor, the drain (or the second terminal or the like) of the transistor, and Y are electrically connected to each other in this order", "a source (or a first terminal or the like) of a transistor is electrically connected to X, a drain (or a second terminal or the like) of the transistor is electrically connected to Y, and X, the source (or the first terminal or the like) of the transistor, the drain (or the second terminal or the like) of the transistor, and Y are electrically connected to each other in this order", and "X is electrically connected to Y through a source (or a first terminal or the like) and a drain (or a second terminal or the like) of a transistor, and X, the source (or the first terminal or the like) of the transistor, the drain (or the second terminal or the like) of the transistor, and Y are provided to be connected in this order". When the connection order in a circuit configuration is defined by an expression similar to the above examples, a source (or a first terminal or the like) and a drain (or a second terminal or the like) of a transistor can be distinguished from each other to specify the technical scope.

Other examples of the expressions include, "a source (or a first terminal or the like) of a transistor is electrically connected to X through at least a first connection path, the first connection path does not include a second connection path, the second connection path is a path between the source (or the first terminal or the like) of the transistor and a drain (or a second terminal or the like) of the transistor, Z1 is on the first connection path, the drain (or the second terminal or the like) of the transistor is electrically connected to Y through at least a third connection path, the third connection path does not include the second connection path, and Z2 is on the third connection path" and "a source (or a first terminal or the like) of a transistor is electrically connected to X at least with a first connection path through Z1, the first connection path does not include a second connection path, the second connection path includes a connection path through which the transistor is provided, a drain (or a second terminal or the like) of the transistor is electrically connected to Y at least with a third connection path through Z2, and the third connection path does not include the second connection path." Still another example of the expression is "a source (or a first terminal or the like) of a transistor is electrically connected to X through at least Z1 on a first electrical path, the first electrical path does not include a second electrical path, the second electrical path is an electrical path from the source (or the first terminal or the like) of the transistor to a drain (or a second terminal or the like) of the transistor, the drain (or the second terminal or the like) of the transistor is electrically connected to Y through at least Z2 on a third electrical path, the third electrical path does not include a fourth electrical path, and the fourth electrical path is an electrical path from the drain (or the second terminal or the like) of the transistor to the source (or the first terminal or the like) of the transistor". When the connection path in a circuit structure is defined by an expression similar to the above examples, a source (or a first terminal or the like) and a drain (or a second terminal or the like) of a transistor can be distinguished from each other to specify the technical scope.

Note that these expressions are examples and there is no limitation on the expressions. Here, X, Y, Z1, and Z2 each denote an object (e.g., a device, an element, a circuit, a wiring, an electrode, a terminal, a conductive film, and a layer).

Even when independent components are electrically connected to each other in a circuit diagram, one component has functions of a plurality of components in some cases. For example, when part of a wiring also functions as an electrode, one conductive film functions as the wiring and the electrode. Thus, "electrical connection" in this specification includes in its category such a case where one conductive film has functions of a plurality of components.

EXPLANATION OF REFERENCE

AF1: alignment film, AF2: alignment film, ANO: wiring, BR: conductive film, C1: capacitor, C2: capacitor, CF1: coloring film, CL(g): control line, CSCOM: wiring, DC: detection circuit, FPC1: flexible printed circuit, FPC2: flexible printed circuit, GD: driver circuit, GDA: driver circuit, GDB: driver circuit, G1: scan line, G2: scan line, KB1: structure, M: transistor, MB: transistor, MD: transistor, MDB: transistor, ML(h): signal line, OSC: oscillator circuit, P1: positional information, P2: information, S1(j): signal line, S2(j): signal line, SD: driver circuit, SW1: switch, SW1B: switch, SW2: switch, V1: image information, VCOM1: wiring, VCOM2: wiring, 100: transistor, 102: substrate, 104: conductive film, 106: insulating film, 107: insulating film, 108: oxide semiconductor film, 108a: oxide semiconductor film, 108b: oxide semiconductor film, 108c: oxide semiconductor film, 112a: conductive film, 112b: conductive film, 114: insulating film, 116: insulating film, 118: insulating film, 120a: conductive film, 120b: conductive film, 200: data processor, 210: arithmetic device, 211: arithmetic portion, 212: memory portion, 214: transmission path, 215: input/output interface, 220: input/output device, 230: display portion, 230B: display portion, 231: display region, 232: pixel, 235EL: display element, 235LC: display element, 240: input portion, 250: sensor portion, 290: communication portion, 501C: insulating film, 504: conductive film, 505: bonding layer, 506: insulating film, 508: semiconductor film, 508A: region, 508B: region, 508C: region, 511B: conductive film, 511C: conductive film, 511D: wiring, 512A: conductive film, 512B: conductive film, 514: insulating film, 516: insulating film, 518: insulating film, 519B: terminal, 519C: terminal, 519D: terminal, 519E: terminal, 520: functional layer, 521: insulating film, 522: connection portion, 524: conductive film, 528: insulating film, 530: pixel circuit, 550: display element, 551: electrode, 552: electrode, 553: layer, 570: substrate, 591A: opening, 591B: opening, 591C: opening, 604: conductive film, 606: insulating film, 608: semiconductor film, 612A: conductive film, 612B: conductive film, 614: insulating film, 616: insulating film, 622: opening, 624: conductive film, 700TPA: input/output device, 700TPB: input/output device, 700TPC: input/output device, 702: pixel, 705: sealant, 706: insulating film, 709: bonding layer, 710: substrate, 719: terminal, 720: functional layer, 750: display element, 751: electrode, 751H: opening, 752: electrode, 752C: electrode, 753: layer, 770: substrate, 770D: functional film, 770P: functional film, 771: insulating film, 775: sensing element, 1400: semiconductor device, 1401: CPU core, 1402: power controller, 1403: power switch, 1404: cache, 1405: bus interface, 1406: debug interface, 1407: control unit, 1408: PC, 1409: pipeline register, 1410: pipeline register, 1411: ALU, 1412: register file, 1421: power management unit, 1422: peripheral circuit, 1423: data bus, 1500: semiconductor device, 1501: memory circuit, 1502: memory circuit, 1503: memory circuit, 1504: circuit, 1509: transistor, 1510: transistor, 1512: transistor, 1513: transistor, 1515: transistor, 1517: transistor, 1518: transistor, 1519: capacitor, 1520: capacitor, 1540: wiring, 1541: wiring, 1542: wiring, 1543: wiring, 1544: wiring, 3001: wiring, 3002: wiring, 3003: wiring, 3004: wiring, 3005: wiring, 3200: transistor, 3300: transistor, 3400: capacitor, 5000: housing, 5001: display portion, 5002: display portion, 5003: speaker, 5004: LED lamp, 5005: operation key, 5006: connection terminal, 5007: sensor, 5008: microphone, 5009: switch, 5010: infrared port, 5011: recording medium reading portion, 5012: support portion, 5013: earphone, 5014: antenna, 5015: shutter button, 5016: image receiving portion, 5017: charger, 7302: housing, 7304: display panel, 7305: icon, 7306: icon, 7311: operation button, 7312: operation button, 7313: connection terminal, 7321: band, 7322: clasp.

This application is based on Japanese Patent Application serial no. 2016-006818 filed with Japan Patent Office on Jan. 18, 2016, the entire contents of which are hereby incorporated by reference.

The invention claimed is:
1. An input/output device comprising:
a display portion comprising:
a signal line; and
a pixel electrically connected to the signal line, the pixel comprising:
a first display element;
a first conductive film electrically connected to the first display element;
a second conductive film;
a first insulating film between the first conductive film and the second conductive film;
a pixel circuit electrically connected to each of the signal line and the second conductive film, the pixel circuit comprising a first transistor and a second transistor;
a second insulating film comprising a first surface and a second surface which face each other; and
a second display element electrically connected to the pixel circuit; and
an input portion configured to sense an object approaching a region overlapping with the display portion, the input portion comprising a sensing element,
wherein the sensing element comprises a control line and the signal line,
wherein the signal line is positioned so that an electric field which is partly blocked by the object is formed between the signal line and the control line,
wherein the first conductive film and the second conductive film overlap each other,
wherein the first insulating film comprises a first opening, wherein the second conductive film is electrically connected to the first conductive film through the first opening,
wherein the first transistor and the second transistor overlap each other,
wherein the first transistor comprises a first semiconductor film,
wherein the second transistor comprises a second semiconductor film,
wherein the first surface is in contact with the first semiconductor film,
wherein the second surface is in contact with the second semiconductor film, and
wherein the display portion and the input portion overlap each other.

2. The input/output device according to claim 1,
wherein the first semiconductor film and the second semiconductor film overlap each other,
wherein the first semiconductor film comprises a first region in which a channel is formed,
wherein the second semiconductor film comprises a second region in which a channel is formed, and
wherein the first region and the second region do not overlap each other.

3. The input/output device according to claim 1, wherein the second display element is positioned so that display using the second display element can be seen from part of a range from which display using the first display element can be seen.

4. The input/output device according to claim 1, wherein the second display element is configured to perform display in a portion surrounded by a portion where the first display element is configured to perform display.

5. The input/output device according to claim 1,
wherein the first display element comprises a reflective film,
wherein the reflective film is configured to reflect incident light,
wherein the first display element is configured to control an intensity of reflected light by the reflective film,
wherein the reflective film comprises a second opening, and
wherein the second display element is configured to emit light toward the second opening.

6. The input/output device according to claim 1,
wherein the control line comprises a first light-transmitting conductive film,
wherein the signal line comprises a second light-transmitting conductive film, and
wherein the pixel and any one of the control line and the signal line overlap each other.

7. The input/output device according to claim 1,
wherein the control line comprises a third conductive film comprising a third opening,
wherein the signal line comprises a fourth conductive film comprising a fourth opening, and
wherein the pixel and one of the third opening and the fourth opening overlap each other.

8. The input/output device according to claim 7,
wherein the first display element further comprises an electrode, and
wherein a gap greater than or equal to 0.2 µm and less than or equal to 16 µm is provided between the control line and the electrode or between the signal line and the electrode.

9. The input/output device according to claim 1, further comprising:
a first functional film comprising a circularly polarizing film; and
a second functional film comprising a light diffusion film,
wherein the sensing element is positioned between the first functional film and the first display element, and
wherein the second functional film is positioned between the first functional film and the first display element.

10. The input/output device according to claim 1, wherein each of the first semiconductor film and the second semiconductor film comprises an oxide semiconductor.

11. A data processor comprising:
the input/output device according to claim 1; and
at least one of a keyboard, a hardware button, a pointing device, a touch sensor, an illuminance sensor, an imaging device, an audio input device, a viewpoint input device, and an attitude determination device.

12. An input/output device comprising:
a first display element comprising a first conductive film;
a first insulating film over the first conductive film;
a pixel circuit comprising:
a first transistor over the first insulating film, the first transistor comprising a first semiconductor film;
a second insulating film over the first transistor; and
a second transistor over the first transistor, the second transistor comprising a second conductive film and a second semiconductor film;
a second display element over the second transistor, the second display element electrically connected to the pixel circuit; and
a sensing element configured to sense an object approaching the sensing element,
wherein the sensing element and any one of the first display element and the second display element overlap each other,
wherein the first conductive film and the second conductive film overlap each other,
wherein the first insulating film comprises a first opening,
wherein the second conductive film is electrically connected to the first conductive film through the first opening, and
wherein the first semiconductor film and the second semiconductor film overlap each other.

13. The input/output device according to claim 12, wherein a first channel of the first transistor and a second channel of the second transistor do not overlap each other.

14. The input/output device according to claim 12,
wherein the first display element comprises a reflective film,
wherein the first display element is configured to control an intensity of reflected light by the reflective film,
wherein the reflective film comprises a second opening, and
wherein the second display element and the second opening overlap each other.

15. The input/output device according to claim 12, wherein the first display element is positioned over the sensing element.

16. The input/output device according to claim 12,
wherein the sensing element comprises a control line and a signal line, and
wherein the sensing element is configured to sense electrostatic capacitance change.

17. The input/output device according to claim 16,
wherein the control line comprises a first light-transmitting conductive film, and wherein the signal line comprises a second light-transmitting conductive film.

18. The input/output device according to claim 12, wherein each of the first semiconductor film and the second semiconductor film comprises an oxide semiconductor.

19. A data processor comprising:
   the input/output device according to claim 12; and
   at least one of a keyboard, a hardware button, a pointing device, a touch sensor, an illuminance sensor, an imaging device, an audio input device, a viewpoint input device, and an attitude determination device.

20. An electronic device comprising the input/output device according to claim 12.

\* \* \* \* \*